United States Patent
Shinagawa et al.

(10) Patent No.: US 9,830,989 B2
(45) Date of Patent: Nov. 28, 2017

(54) NON-VOLATILE SEMICONDUCTOR STORAGE DEVICE

(71) Applicant: Floadia Corporation, Kodaira-shi, Tokyo (JP)

(72) Inventors: Yutaka Shinagawa, Kodaira (JP); Hideo Kasai, Kodaira (JP); Yasuhiko Kawashima, Kodaira (JP); Ryotaro Sakurai, Kodaira (JP); Yasuhiro Taniguchi, Kodaira (JP)

(73) Assignee: FLOADIA CORPORATION, Kodaira-Shi, Tokyo (JP)

( * ) Notice: Subject to any disclaimer, the term of this patent is extended or adjusted under 35 U.S.C. 154(b) by 0 days.

(21) Appl. No.: 15/304,649

(22) PCT Filed: Apr. 20, 2015

(86) PCT No.: PCT/JP2015/062025
§ 371 (c)(1),
(2) Date: Oct. 17, 2016

(87) PCT Pub. No.: WO2015/159994
PCT Pub. Date: Oct. 22, 2015

(65) Prior Publication Data
US 2017/0040058 A1    Feb. 9, 2017

(30) Foreign Application Priority Data

Apr. 18, 2014 (JP) ................ 2014-086920

(51) Int. Cl.
*G11C 11/00* (2006.01)
*G11C 14/00* (2006.01)
(Continued)

(52) U.S. Cl.
CPC ...... *G11C 14/0063* (2013.01); *G11C 16/0441* (2013.01); *G11C 16/0483* (2013.01);
(Continued)

(58) Field of Classification Search
CPC ............ G11C 14/0063; G11C 16/0441; G11C 16/0483
(Continued)

(56) References Cited

U.S. PATENT DOCUMENTS 7,130,213 B1 * 10/2006 Raszka .................... G11C 7/06
257/E21.694
2007/0064494 A1 * 3/2007 Morton .............. G11C 16/0416
365/185.28

FOREIGN PATENT DOCUMENTS

JP    2002-324858 A    11/2002
JP    2007-123830 A    5/2007
(Continued)

OTHER PUBLICATIONS

International Search Report from Corresponding Application No. PCT/JP2015/062025; dated May 29, 2015.

*Primary Examiner* — Anthan Tran
(74) *Attorney, Agent, or Firm* — Pearne & Gordon LLP

(57) ABSTRACT

In a memory unit, voltages required for operations of a capacity transistor in a first well and a writing transistor in a second well are separately applied to a first deep well and a second deep well, without the voltages on the first deep well and the second deep well being restricted by each other. Thus, in the memory unit, each of a voltage difference between the first deep well and the first well and a voltage difference between the second deep well and the second well is made smaller than a voltage difference (18 [V]), at which a tunneling effect occurs, and accordingly a junction voltage between the first deep well and the first well and a junction voltage between the second deep well and the second well are low.

16 Claims, 17 Drawing Sheets

(51) Int. Cl.
*H01L 27/11558* (2017.01)
*G11C 16/04* (2006.01)
*G11C 16/10* (2006.01)
*G11C 16/14* (2006.01)
*G11C 16/26* (2006.01)
*H01L 27/11524* (2017.01)
*H01L 29/423* (2006.01)

(52) U.S. Cl.
CPC .............. *G11C 16/10* (2013.01); *G11C 16/14* (2013.01); *G11C 16/26* (2013.01); *H01L 27/11524* (2013.01); *H01L 27/11558* (2013.01); *H01L 29/42328* (2013.01)

(58) Field of Classification Search
USPC ........................................................ 365/154
See application file for complete search history.

(56) References Cited

FOREIGN PATENT DOCUMENTS

| | | |
|---|---|---|
| JP | 2011-023567 | 2/2011 |
| WO | 2014/061425 A1 | 4/2014 |

\* cited by examiner

FIG. 16A  CASE WHERE VOLTAGE CONVERSION CIRCUIT IS PROVIDED IN MEMORY CELL

| | ACCESS TO SRAM | | WRITE MEMORY DATA IN SRAM | PROGRAM SRAM DATA INTO MEMORY CELL | ERASE MEMORY DATA | |
|---|---|---|---|---|---|---|
| | READ | WRITE | | | | |
| RGP1/RGN1 | 0V | 0V | VDD | 0V | 0V | ⎫ APPLY CORE VOLTAGE ONLY |
| WL | VDD | VDD | 0V | 0V | 0V | |
| RBLP/RBLN | VDD/0V | VDD/0V | DETERMINED BY MEMORY DATA VDD/0V | VDD/0V | VDD/0V | |
| SBLP1/SBLN1 | SRAM DATA IS READ OUT VDD/0V | DETERMINED BY WRITING DATA VDD/0V | (0V) | (0V) | (0V) | ⎭ |
| WBLP/WBLN | 0V | 0V | 0V | CONVERTED INTO WRITING VOLTAGE FOR MEMORY CELL 9V/0V | 0V | ⎫ APPLY WRITING VOLTAGE TO MEMORY CELL |
| WEG1 | (VDD) | (VDD) | (VDD) | −9V | 9V | |
| EBL1 | 0V | 0V | 0V | 0V | −9V | ⎭ |

FIG. 16B  CASE WHERE ONE VOLTAGE CONVERSION CIRCUIT IS PROVIDED FOR EACH COLUMN

| | ACCESS TO SRAM | | WRITE MEMORY DATA IN SRAM | PROGRAM SRAM DATA INTO MEMORY CELL | ERASE MEMORY DATA | |
|---|---|---|---|---|---|---|
| | READ | WRITE | | | | |
| RGP1/RGN1 | 0V | 0V | VDD | 0V | 0V | ⎫ APPLY CORE VOLTAGE ONLY |
| WL | VDD | VDD | 0V | VDD | 0V | |
| RBLP/RBLN | VDD/0V | VDD/0V | DETERMINED BY MEMORY DATA VDD/0V | VDD/0V | VDD/0V | |
| SBLP1/SBLN1 | SRAM DATA IS READ OUT VDD/0V | DETERMINED BY WRITING DATA VDD/0V | (0V) | SRAM DATA IS READ OUT VDD/0V | (0V) | ⎭ |
| WBLP/WBLN | 0V | 0V | 0V | CONVERTED INTO WRITING VOLTAGE FOR MEMORY CELL 9V/0V | 0V | ⎫ APPLY WRITING VOLTAGE TO MEMORY CELL |
| WEG1 | (VDD) | (VDD) | (VDD) | −9V | 9V | |
| EBL1 | 0V | 0V | 0V | 0V | −9V | ⎭ |

NON-VOLATILE SEMICONDUCTOR STORAGE DEVICE

TECHNICAL FIELD

The present invention relates to a non-volatile semiconductor memory device, and is suitably applied to a non-volatile semiconductor memory device including a memory cell having a floating gate capable of storing charge, for example.

BACKGROUND ART

A non-volatile semiconductor memory device provided with memory cells has been known. The memory cell is comprised of a large-area capacity transistor using a well as a control gate, a writing/erasing transistor used for writing and erasing data, and a reading transistor for reading out data. In the memory cell, the capacity transistor, the writing/erasing transistor, and the reading transistor share a floating gate (see, e.g. Patent Literature 1).

Patent Literature 1 (Japanese Patent Laid-Open No. 2011-23567) discloses a non-volatile semiconductor memory device having a triple well structure in which an N-type embedded well DMW (deep well) is disposed on a semiconductor substrate IS composed of a P-type single crystal silicon. P-type wells HPW1, HPW2, and HPW3 are disposed in the embedded well DNW. Patent Literature 1 will now be described. Here, reference signs assigned to constituent elements in the Patent Literature 1 are used in the following description.

As illustrated in FIGS. 5 and 9 in the Patent Literature 1, a capacity section CWE for writing and erasing data is formed as a writing/erasing transistor in the P-type well HPW2. A capacity section C is formed as a capacity transistor in the P-type well HPW1. An MIS/FFT (Metal Insulator Semiconductor Field Effect Transistor) QR for reading data is formed as a reading transistor in the P-type well HPW3.

In the non-volatile semiconductor memory device having the above-described configuration described in the Patent Literature 1, 9 [V] is applied to the well HPW1, in which the capacity section C is formed, while −9 [V] is applied to the well HPW2, in which the capacity section CWE is formed (see FIG. 9 in the Patent Literature 1), during a data writing operation. Due to a tunneling effect in the capacity section CWE, electrons are injected into a floating gate, so that data is written. Here, in the non-volatile semiconductor memory device, when the voltage at the well HPW1 is 9 [V], the well HPW1 and the embedded well DNW are in a forward direction of a PN junction, so that a voltage at the embedded well DNW reaches 9 [V] or less even if a voltage is not applied externally to the embedded well DNW.

Therefore, in the Patent Literature 1, 9 [V] is applied to the embedded well DNW from a conductor section 7b in a semiconductor region 8a so that a bipolar operation to the semiconductor substrate IS can be prevented (see FIG. 9 in the Patent Literature 1). Thus, in the Patent Literature 1, a reverse bias of 18 [V] is applied to a junction portion between the embedded well DNW and the P-type well HPW2, in which the capacity section CWE for writing and erasing data is formed. For this reason, it is necessary to reduce the concentrations of impurities in the well HPW2 and in the embedded well DNW so that the well HPW2 and the embedded well DNW withstand high voltages.

CITATION LIST

Patent Literature

Patent Literature 1: Japanese Patent Laid-Open No. 2011-23567

SUMMARY OF INVENTION

Technical Problem

In recent years, miniaturization of a circuit configuration of a non-volatile semiconductor memory device has been further achieved. To ensure electrical characteristics, the impurity concentration in a well needs to be increased according to a scaling law, as the circuit configuration is miniaturized. For this reason, the impurity concentration in a well increases in a region in which a transistor for writing data is formed in a case where the circuit configuration of the conventional non-volatile semiconductor memory device is actually miniaturized, so that it becomes difficult to set a junction breakdown voltage between an embedded well DNW and a well HPW2 higher than a voltage difference (18 [V]) at which a tunneling effect occurs. Therefore, it is difficult to embed the non-volatile semiconductor memory device with a circuit element having a miniaturized circuit configuration and having a low junction breakdown voltage.

The present invention has been made in view of the foregoing and is directed to proposing a non-volatile semiconductor memory device that is embedded with a circuit element having a miniaturized circuit configuration and having a low junction breakdown voltage.

Solution to Problem

To solve the above-described issue, an aspect of the present invention is directed to providing a non-volatile semiconductor memory device comprising a memory cell. The memory cell comprises a capacity transistor that adjusts a voltage at a floating gate, a charge injection transistor that injects charge into the floating gate in response to a voltage difference from the voltage at the floating gate adjusted by the capacity transistor, a charge ejection transistor that removes the charge from the floating gate in response to a voltage difference from the voltage at the floating gate adjusted by the capacity transistor, and a reading transistor that turns on or off depending on the presence or absence of the charge in the floating gate. The floating gate is shared by the capacity transistor, the charge injection transistor, the charge ejection transistor, and the reading transistor. The memory cell comprises a first well of a first conductivity type in which the capacity transistor is formed, a second well of the first conductivity type in which one of the charge injection transistor and the charge ejection transistor is formed, a third well of a second conductivity type in which the other of the charge injection transistor and the charge ejection transistor is formed, a first deep well of the second conductivity type and constituting a part of triple well structure in a region in which the first well is disposed, and a second deep well. The second deep well is of the second conductivity type and contacts the third well, and constitutes a part of triple well structure in a region in which the second well is disposed. The first deep well and the second deep well are electrically isolated from each other, and a voltage different from a voltage to be applied to the first deep well is applicable to the second deep well.

The triple well structure refers to a structure comprised of a well of a first conductivity type, a semiconductor substrate of the first conductivity type, and a well of a second conductivity type that electrically separates them, for example.

To solve such an issue, another aspect of the present invention is directed to providing a non-volatile semiconductor memory device comprising a memory cell. The memory cell comprises a capacity transistor that adjusts a voltage at a floating gate, a charge injection transistor that injects charge into the floating gate in response to a voltage difference from the voltage at the floating gate adjusted by the capacity transistor, a charge ejection transistor that removes the charge from the floating gate in response to a voltage difference from the voltage at the floating gate adjusted by the capacity transistor, and a reading transistor that turns on or off depending on the presence or absence of the charge in the floating gate. The floating gate is shared by the capacity transistor, the charge injection transistor, the charge ejection transistor, and the reading transistor. The memory cell comprises a first well of a first conductivity type in which the capacity transistor is formed, a second well of the first conductivity type in which one of the charge injection transistor and the charge ejection transistor is formed, a third well of a second conductivity type in which the other of the charge injection transistor and the charge ejection transistor is formed, a first separation well of the second conductivity type and disposed adjacent to the first well, and a second separation well of the first conductivity type electrically isolating the first separation well and the third well. Each of a voltage difference between the first well and the first separation well and a voltage difference between the second separation well and the third well is smaller than a voltage difference required for injecting the charge into or removing the charge from the floating gate by a tunneling effect.

In addition to the above described features, a non-volatile semiconductor memory device according to the present invention comprises a plurality of floating gates electrically insulated from one another, a first bit line and a second bit line, and cells are formed for the respective floating gates. Each of the cells comprises a read transistor that is turned on or off depending on the presence or absence of charge in the floating gate, a program transistor that injects charge into the floating gate, an erase transistor that removes charge from the floating gate, and a control capacitor that adjusts a potential at the floating gate. The floating gate extends on each of active regions of the read transistor, the program transistor, the erase transistor, and the control capacitor. One of a pair of the cells comprises one switch transistor. One end of the switch transistor is connected to the first bit line to which a writing inhibition voltage or a writing voltage is applied in a data writing operation. The writing inhibition voltage inhibits the one program transistor from injecting charge into the floating gate. The writing voltage allows the one program transistor to inject charge into the floating gate. The other end of the switch transistor is connected to one end of the one read transistor. The switch transistor is turned off while the data writing operation is performed, to cut off the supply of the writing inhibition voltage and the writing voltage to the one read transistor from the first bit line. The second bit line is directly connected to the one program transistor. The other cell paired with the one cell comprises the other switch transistor. One end of the other switch transistor is connected to the second bit line to which the writing voltage or the writing inhibition voltage is applied in the data writing operation. The second bit line is connected to the one cell. The other end of the other switch transistor is connected to one end of the other read transistor. The other switch transistor is turned off while the data writing operation is performed, to cut off the supply of the writing voltage and the writing inhibition voltage from the second bit line to the other read transistor. The first bit line is directly connected to the other program transistor. In order to perform the data reading operation, a reading voltage is applied to the first and second bit lines, to which the writing voltage or the writing inhibition voltage is applied during the data writing operation. Thereby the switch transistor is turned on, and the first bit line and the second bit line connected to the switch transistor are electrically connected to the one end of the read transistor during a data reading operation.

Advantageous Effects of Invention

According to an aspect of the present invention, a voltage difference between the first deep well and the first well and a voltage difference between the second deep well and the second well are smaller than those in the conventional example. Accordingly, a junction voltage between the first deep well and the first well and a junction voltage between the second deep well and the second well are low. Thus, the non-volatile semiconductor memory device can be embedded with a circuit element having a miniaturized circuit structure and having a low junction breakdown voltage.

According to another aspect of the present invention, a voltage difference between the first well and the first separation well and a voltage difference between the second separation well and the third well are smaller than a voltage difference required for injecting charge into or removing charge from the floating gate by a tunneling effect. Accordingly, a junction voltage between the first well and the first separation well and a junction voltage between the second separation well and the third well are low. Thus, the non-volatile semiconductor memory device can be embedded with a circuit element having a miniaturized circuit structure and having a low junction breakdown voltage.

BRIEF DESCRIPTION OF DRAWINGS

FIG. 16A is a table illustrating voltage values at respective sites during an operation for accessing an SRAM in the memory unit, an operation for writing memory data into the SRAM, a programming operation for programming SRAM data into a memory cell, and an operation for erasing memory data, in the memory unit illustrated in FIG. 15, and FIG. 16B is a table illustrating voltage values at respective sites during an operation for accessing an SRAM in a memory unit, an operation for writing memory data into the SRAM, a programming operation for programming SRAM data into a memory cell, and an operation for erasing memory data in the memory unit illustrated in FIG. 17.

DESCRIPTION OF EMBODIMENTS

Embodiments of the present invention will be described in detail below with reference to the drawings.

Figure 1:
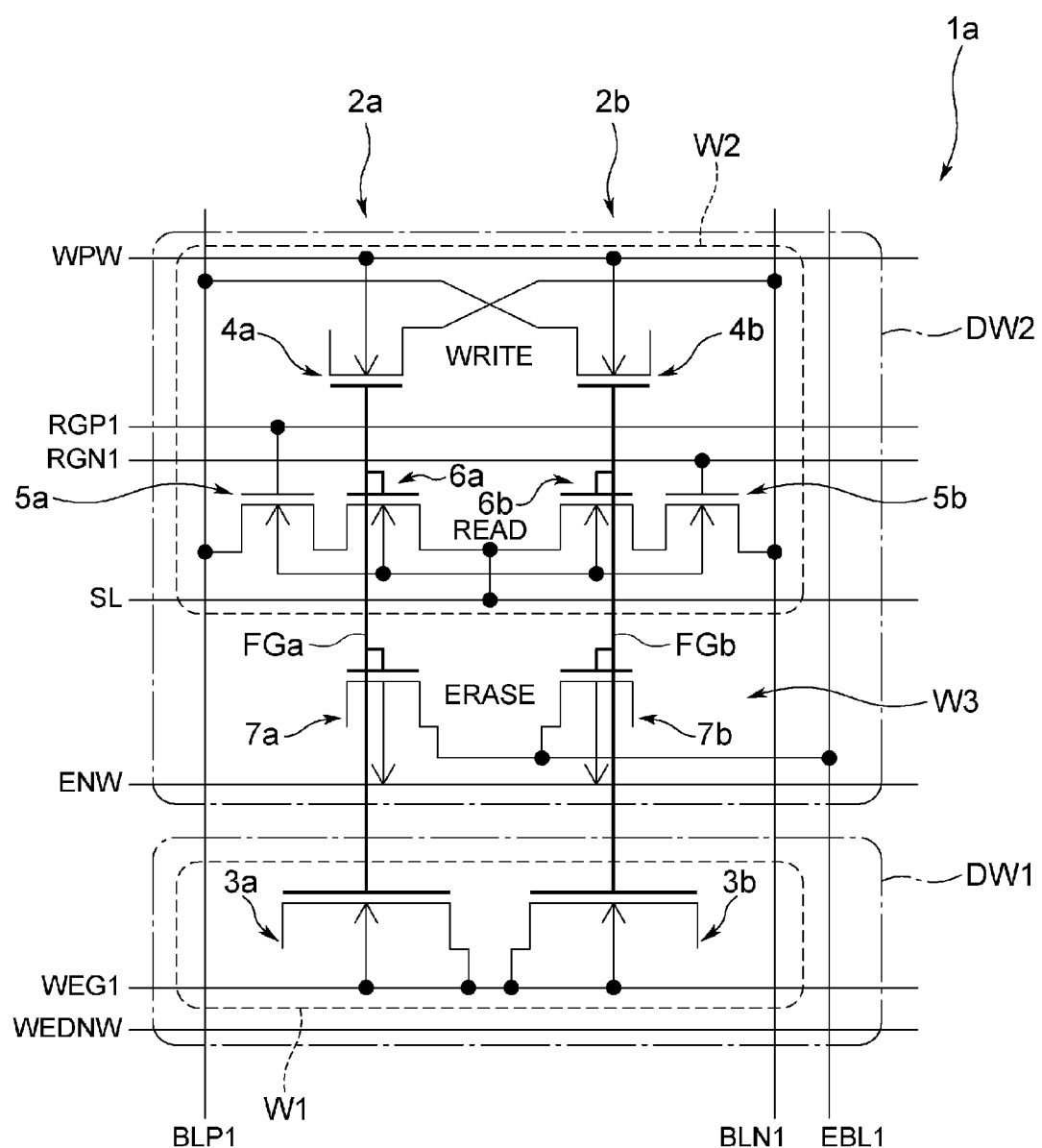
FIG. 1 is a schematic view illustrating a circuit configuration of a memory unit according to a first embodiment.

(1) Non-Volatile Semiconductor Memory Device According to First Embodiment (1-1) Circuit Configuration of Memory Unit In FIG. 1, a reference sign 1*a* denotes a memory unit provided in a non-volatile semiconductor memory device according to the present invention. In the non-volatile semiconductor memory device, a plurality of memory units are arranged in a matrix of rows and columns, as will be described below with reference to FIG. 2. First, the structure of a memory unit 1*a* will now be described. As illustrated in FIG. 1, the memory unit 1*a* comprises a memory cell 2*a* and a memory cell 2*b*. A first bit line BLP1 and a second bit line BLN1 are connected to the memory cell 2*a* while the first bit line BLP1 and the second bit line BLN1 are connected also to the memory cell 2*b*.

A first deep well wiring WEDNW, a first well wiring WEG1, a second deep well wiring ENW, a source line SL, read gate lines RGP1 and RGN1, a second well wiring WPW, and an erasing bit line EBL1 are provided in the memory cell 2*a* and the memory cell 2*b*, so that a predetermined voltage can be applied as needed from each of the first deep well wiring WEDNW, the first well wiring WEG1, the second deep well wiring ENW, the source line SL, the read gate lines RGP1 and RGN1, the second well wiring WPW, and the erasing bit line EBL1.

Two bit lines, i.e. the first bit line BLP1 and the second bit line BLN1 are connected to the memory cell 2*a* of the memory unit 1*a*, and the number of bit lines per cell is two. However, in the memory unit 1*a*, the second bit line BLN1 used for writing in the one memory cell 2*a*, for example, is also used for reading in the other memory cell 2*b*, for example. Thus, as a whole, the number of bit lines equals the number of cells, and the number of effective bit lines is one per cell.

In the present embodiment, the one memory cell 2*a* and the other memory cell 2*b* have the same configuration, and the two cells constitute a complementary cell storing one bit, for example. While a case where the two cells i.e. the one memory cell 2*a* and the other memory cell 2*b* constitute the complementary cell storing one bit will be described below, the present invention is not limited to this. A memory unit storing one bit for each of the memory cells 2*a* and 2*b* (i.e. a memory unit storing one bit in each of the one memory cell 2*a* and the other memory cell 2*b*, to store the two bits in total) may be used.

The memory cell 2*a* comprises a writing MOS (Metal-Oxide-Semiconductor) transistor (hereinafter referred to as a writing transistor, and written as "WRITE" in the drawings) 4*a*, a reading MOS transistor (hereinafter referred to as a reading transistor, and written as "READ" in the drawings) 6*a*, an erasing MOS transistor (hereinafter referred to as an erasing transistor, and written as "ERASE" in the drawings) 7*a*, a capacity MOS transistor (hereinafter referred to as a capacity transistor) 3*a*, and a switching MOS transistor (hereinafter referred to as a switch transistor) 5*a*. The writing transistor 4*a*, the reading transistor 6*a*, the erasing transistor 7*a*, and the capacity transistor 3*a* share the one floating gate FGa.

The floating gate FGa extends across an active region of each of the writing transistor 4*a*, the reading transistor 6*a*, the erasing transistor 7*a*, and the capacity transistor 3*a*. The floating gate FGa can function as a control gate of each of the writing transistor 4*a*, the reading transistor 6*a*, and the erasing transistor 7*a*, and can function as an electrode of the capacity transistor 3*a*. In this case, the floating gate FGa is connected to a gate insulating film of the erasing transistor 7*a*, a gate insulating film of the reading transistor 6*a*, a gate insulating film of the writing transistor 4*a*, and a gate insulating film of the capacity transistor 3*a*.

The capacity transistor 3*a* is an N-type MOS formed in a first well W1 of a P type (first conductivity type), for example. A diffusion layer at one end of the capacity transistor 3*a* is connected to the first well wiring WEG1, so that a voltage on the first well wiring WEG1 can be transmitted to the floating gate FGa via the gate insulating film by capacitive coupling. A diffusion layer at the other end of the capacity transistor 3*a* is short-circuited to the first well W1 described below. The erasing transistor 7*a* serving as a charge ejection transistor is a P-type MOS formed in a third well W3 of an N type (second conductivity type), for example. A diffusion layer at one end of the erasing transistor 7*a* is connected to the erasing bit line EBL1 and a diffusion layer at the other end is short-circuited to the third well W3.

The reading transistor 6*a* is an N-type MOS formed in a P-type second well W2, for example. A diffusion layer at one end of the reading transistor 6*a* is connected to a source line SL and a diffusion layer at the other end is connected to a diffusion layer at one end of the switch transistor 5*a*. The switch transistor 5*a* is an N-type MOS formed in the second well W2, in which the reading transistor 6*a* is formed, and has a configuration in which the first bit line BLP1 is connected to a diffusion layer at the other end of the switch transistor 5a. The switch transistor 5a is turned on or off as needed, so that the first bit line BLP1 and the reading transistor 6a can be electrically connected to each other or electrically disconnected from each other.

In the present embodiment, the switch transistor 5a has its gate connected to the one switch gate line RGP1 in the one memory cell 2a, and the switch transistor 5b has its gate connected to the other switch gate line RGN1 different from the one switch gate line RGP1 in the other memory cell 2b. Thus, in the memory unit 1a, predetermined voltage(s) can be applied to the switch gate lines RGP1 and RGN1, respectively, and each of the switch transistors 5a and 5b can be independently turned on or off as needed.

The reading transistors 6a and 6b having their respective one ends connected to the switch transistors 5a and 5b have their respective other ends connected to the common source line SL, so that a predetermined voltage can be applied to the reading transistors 6a and 6b via the source line SL. The writing transistors 4a and 4b serving as charge injection transistors are N-type MOSes formed in the P-type second wells W2, similar to the switch transistors 5a and 5b and the reading transistors 6a and 6b. In this case, the second bit line BLN1 is connected to the diffusion layer at the one end of the writing transistor 4a disposed in the one memory cell 2a. The first bit line BLP1 is connected to the diffusion layer at one end of the writing transistor 4b disposed in the other memory cell 2b.

Thus, in the present invention, the first bit line BLP1 is connected to the reading transistor 6a in the one memory cell 2a via the switch transistor 5a. The first bit line BLP1 is directly connected also to the writing transistor 4b in the other memory cell 2b. The second bit line BLN1 is connected to the reading transistor 6b in the other memory cell 2b via the switch transistor 5b. The second bit line BLN1 is directly connected also to the writing transistor 4a in the one memory cell 2a.

In FIG. 1, the area of each of the gate insulating films of the capacity transistors 3a and 3b is larger than the area of each of the gate insulating films of the writing transistors 4a and 4b and the erasing transistors 7a and 7b. In the memory unit 1a, a voltage from the first well wiring WEG1 is easily transmitted to the floating gates FGa and FGb by the increased areas of the insulating films of the capacity transistors 3a and 3b. For example, when data is programmed into the memory cell 2a, a large tunneling current is generated in the gate insulating film of the writing transistor 4a so that a lot of charge can be injected into the floating gate FGa from a substrate.

In the memory unit 1a according to the present invention, a first deep well DW1 and a second deep well DW2 of the N-type (second conductivity type) are formed on a semiconductor substrate of the P-type (first conductivity type) (not illustrated). The first deep well DW1 is formed to surround the first well W1 of the P-type (first conductivity type), to electrically isolate the first well W1 from the semiconductor substrate. Hence a triple well structure is formed in a region (formation region) in which the first well W1 is formed. Channel regions of the capacity transistors 3a and 3b are formed in the first well W1, so that a predetermined voltage can be applied to the capacity transistors 3a and 3b via the first well wiring WEG1.

The second deep well DW2 is formed to surround the P-type second well W2, to electrically isolate the second well W2 from the semiconductor substrate. Hence a triple well structure is formed in a region (formation region) in which the second well W2 is formed. In the second deep well DW2, the third well W3 of the N-type (second conductivity type) is adjacent to the second well W2. A channel region of each of the writing transistors 4a and 4b, the reading transistors 6a and 6b, and the switch transistors 5a and 5b is formed in the second well W2, and a predetermined voltage can be applied via the second well wiring WPW. The third well W3 has a configuration in which respective channel regions of the erasing transistors 7a and 7b are formed, and can have the same potential as that of the second deep well DW2 of the N-type (second conductivity type) having the same polarity as that of the third well W3.

In the present invention, the first deep well DW1 and the second deep well DW2 are electrically isolated from each other, so that a voltage that is different from a voltage to be applied to the first deep well DW1 is separately applied to the second deep well DW2. Thus, a voltage required to operate the capacity transistors 3a and 3b in the first well W1 can be separately applied via the first deep well wiring WEDNW to the first deep well DW1, without being restricted by a voltage to be applied to the second deep well DW2. Thus, of the voltages necessary for writing operation and erasing operation performed by the capacity transistors 3a and 3b, a voltage causing a small voltage difference between the first deep well DW1 and the first well W1, in which the capacity transistors 3a and 3b are formed, is applied to the first deep well DW1.

In the second deep well W2, a voltage required to operate the writing transistors 4a and 4b in the second well W2 and a voltage required to operate the erasing transistors 7a and 7b in the third well W3 are separately applied via the second deep well wiring ENW, without being restricted by a voltage to be applied to the first deep well DW1. Thus, in the second deep well DW2, of the voltages necessary for writing operation performed by the writing transistors 4a and 4b and erasing operation performed by the erasing transistors 7a and 7b, a voltage causing a small voltage difference between the second deep well DW2 and the second well W2 of a polarity different from the polarity of the second deep well DW2 is applied to the second deep well DW2.

Thus, in the non-volatile semiconductor memory device including this memory unit 1a, a voltage difference between the first deep well DW1 and the first well W1 and a voltage difference between the second deep well DW2 and the second well W2 are small. Accordingly a junction voltage between the first deep well DW1 and the first well W1 and a junction voltage between the second deep well DW2 and the second well W2 are low. Therefore, the non-volatile semiconductor memory device can be embedded with a circuit element having a miniaturized circuit structure and having a low junction breakdown voltage (or breakdown voltage).

(1-2) Data Writing Operation

Figure 2:
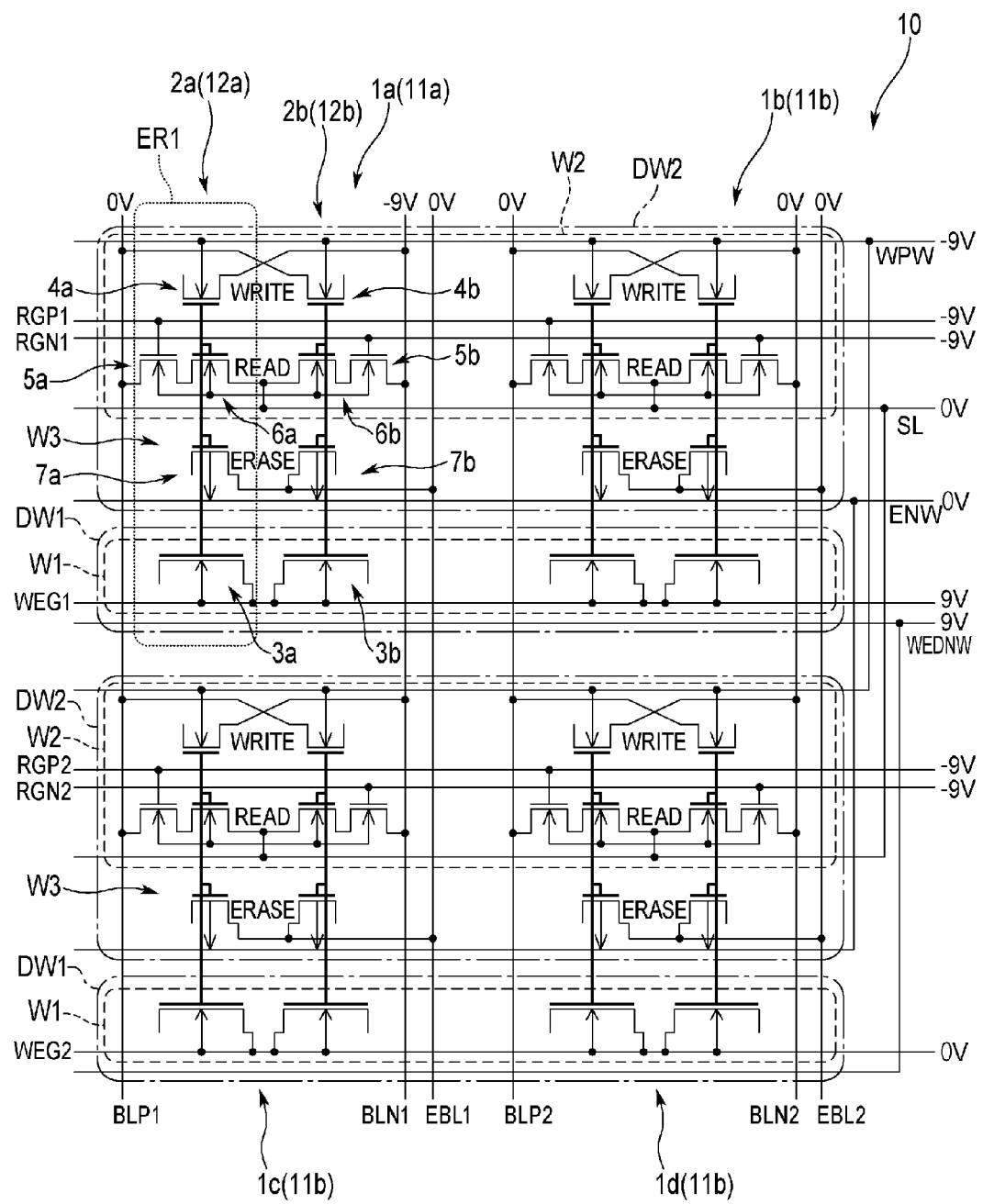
FIG. 2 is a schematic view illustrating a circuit configuration of a non-volatile semiconductor memory device in which memory units illustrated in FIG. 1 are arranged in a matrix and voltage values at sites in programming data into a predetermined unit.

FIG. 2 illustrates a non-volatile semiconductor memory device 10 in which a plurality of memory units 1b, 1c, and 1d each having the same circuit configuration as that of the memory unit 1a illustrated in FIG. 1 are arranged in a matrix (a matrix of two rows and two columns in this case). FIG. 2 illustrates voltage values at respective sites in a case where data is programmed only into the one memory cell 2a (i.e. an area ER1) in the memory unit 1a in the first row and the first column. Here, the memory unit 1a in which data is to be programmed into either one of the one memory cell 2a and the other memory cell 2b is referred to as a selected memory unit 11a. Each of the memory units 1b, 1c, and 1d in which data is to be programmed into neither one of the memory cell 2a and the memory cell 2b is referred to as a non-selected memory unit 11b.

In the non-volatile semiconductor memory device 10, the first deep well DW1 and the second deep well DW2 are formed across the memory units 1a and 1b (or 1c and 1d) arranged in one direction (e.g. in a row direction), and are shared between the memory units 1a and 1b (or 1c and 1d). In the first deep well DW1, the first well W1 is formed across the memory units 1a and 1b (or 1c and 1d) arranged in the one direction, and is shared between the memory units 1a and 1b (or 1c and 1d). In the second deep well DW2, a second well W2 and a third well W3 are formed across the memory units 1a and 1b (or 1c and 1d) arranged in the one direction, and are shared between the memory units 1a and 1b (or 1c and 1d).

In the present embodiment, the first deep well wiring WEDNW is connected to the plurality of first deep wells DW1, so that the same voltage is applied to the first deep wells DW1 through the first deep well wiring WEDNW. The second deep well wiring ENW is connected to the plurality of second deep wells DW2, so that the same voltage is applied to the second deep wells DW2 through the second deep well wiring ENW. Further, in the present embodiment, the second well wiring WPW is connected to the plurality of second wells W2, so that the same voltage is applied to the second wells W2 through the second well wiring WPW.

In the non-volatile semiconductor memory device 10 of the above-described configuration, a writing voltage of 9 [V] is applied to the first well wiring WEG1 connected to the selected memory unit 11a. Thus, in the capacity transistors 3a and 3b in the first well W1 connected to the first well wiring WEG1, voltages at the floating gates FGa and FGb can rise to 9 [V] due to capacitive coupling between their gate insulating films and the floating gates FGa and FGb, respectively.

In this case, in the memory cell 2a into which data is to be programmed (hereinafter may referred to as a selected cell 12a) in the first column, in which the selected memory unit 11a is disposed, a writing bit voltage (writing voltage) of −9 [V] is applied to one writing transistor 4a via a second bit line BLN1 while the same voltage (−9 [V]) as the writing bit voltage is applied to the second well W2 via the second well wiring WPW. Thus, in the writing transistor 4a in the selected cell 12a, the channel potential is the same voltage (−9 [V]) as the writing bit voltage.

In the selected cell 12a, a voltage difference between the floating gate FGa, at which the voltage has been raised by the capacity transistor 3a, and the channel region of the writing transistor 4a is 18 [V], so that a large voltage difference is generated between the floating gate FGa and the channel region of the writing transistor 4a. Hence in the selected cell 12a, charge can be injected into the floating gate FGa from the channel region (the second well W2) of the writing transistor 4a due to a tunneling effect caused by the voltage difference (18 [V]) between the floating gate FGa and the writing transistor 4a. Thus, the charge has been stored in the floating gate FGa in the selected memory cell 12a, so that the selected memory cell 12 is in a state where data has been programmed.

In this case, in the non-volatile semiconductor memory device 10, the same voltage (9 [V]) as the writing voltage of 9 [V], which is applied to the first well wiring WEG1, is applied to the first deep well DW1 via the first deep well wiring WEDNW. Hence, in the selected memory unit 11a, the same voltage is applied to the first well W1, in which the capacity transistor 3a is formed, and to the first deep well DW1 while the voltage at the floating gate FGa is raised due to capacitive coupling between the gate insulating film and the floating gate FGa in the capacity transistor 3a. A voltage difference between the first well W1 and the first deep well DW1 is 0 [V].

In this case, in the non-volatile semiconductor memory device 10, a voltage different from the voltage of 9 [V] to be applied to the first deep well DW1 can be applied to the second deep well DW2. A voltage of 0 [V], at which a voltage difference from the voltage of −9 [V] applied to the second well W2 is small, is applied to the second deep well DW2 via the second deep well wiring ENW.

Thus, in a region (formation region), in which the writing transistor 4a is formed, in the second well W2, a voltage difference between the floating gate FGa and the channel region is 18 [V], at which a tunneling effect occurs, while a voltage difference between the second well W2 and the second deep well DW2 is as small as 9 [V], which is smaller than the voltage difference at which a tunneling effect occurs.

In this case, a writing inhibition bit voltage (writing inhibition voltage) of 0 [V] is applied to the first bit line BLP1 that is non-selected. Thus, in the selected memory unit 11a, the writing inhibition bit voltage of 0 [V] is applied from the first bit line BLP1 to one end of a writing transistor 4b in the memory cell 2b (hereinafter may referred to as non-selected cell 12b), in which no charge is injected into the floating gate FGb. In the non-selected cell 12b in the selected memory unit 11a, a channel potential of the writing transistor 4b is 0 [V], the same as the writing inhibition bit voltage on the first bit line BLP1. Thus, a potential difference from the floating gate FGb, at which a voltage is 9 [V] due to capacitive coupling, is as small as 9 [V]. As a result, a tunneling effect does not occur, so that no charge is injected into the floating gate FGb.

In this case, a writing inhibition voltage of 0 [V] is applied to an erasing bit line EBL1 and a source line SL. Thus, in the memory cell 2a in the selected memory unit 11a, a voltage difference between the floating gate FGa and the gate insulating film of the erasing transistor 7a, which is connected to the erasing bit line EBL1, is small, and a voltage difference between the floating gate FGa and the gate insulating film of the reading transistor 6a, which is connected to the source line SL, is small. In the memory cell 2b in the selected memory unit 11a, a voltage difference between the floating gate FGb and the gate insulating film of the erasing transistor 7b, which is connected to the erasing bit line EBL1, is small, and a voltage difference between the floating gate FGb and the gate insulating film of the reading transistor 6b, which is connected to the source line SL, is small. Thus, a tunneling effect does not occur in such a region, so that charge cannot be injected into the floating gates FGa and FGb.

In this case, an OFF-state voltage of −9 [V] is applied to each of the read gate line RGP1 and the read gate line RGN1, which are disposed in the selected memory unit 11a. The switch transistor 5a in the selected cell 12a in the selected memory unit 11a is turned off when the OFF-state voltage of −9 [V] is applied to the gate of the switch transistor 5a through the read gate line RGP1. Thereby, the writing inhibition voltage on the first bit line BLP1 is cut off, so that the writing inhibition voltage on the first bit line BLP1 is not applied to the reading transistor 6a.

Similarly, the switch transistor 5b in the non-selected cell 12b in the selected memory unit 11a is turned off when an OFF-state voltage of −9 [V] is applied to the gate of the switch transistor 5b from the read gate line RGN1. Thereby the writing bit voltage (writing voltage) on the second bit line BLN1 is cut off, so that the writing bit voltage on the second bit line BLN1 is not applied to the reading transistor 6b. In this case, the source line SL is shared among the memory units 1a, 1b, 1c, and 1d so that a predetermined voltage is collectively applied to the reading transistors 6a and 6b in each of the memory units 1a, 1b, 1c, and 1d.

In the memory unit 1b, which is the non-selected memory unit 11b, the writing voltage of 9 [V] is applied to the first well wiring WEG1, which is shared with the selected memory unit 11a, while the wiring inhibition bit voltage (writing inhibition voltage) of 0 [V] is applied to each of a non-selected first bit line BLP2 and a non-selected second bit line BLN2. Hence a voltage difference between the floating gate FGa and the writing transistor 4a and a voltage difference between the floating gate FGb and the writing transistor 4b are small, so that a tunneling effect does not occur in such regions. Thus, no charge is injected into the floating gates FGa and FGb.

In this case, in the memory unit 1b, which shares the first well W1 and the first deep well DW1 with the selected memory unit 11b, 9 [V] is applied to the first well W1 and 9 [V] is applied to the first deep well DW1, similar to the case of the selected memory unit 11b described above. Hence, a voltage difference between the first well W1 and the first deep well DW1 is 0 [V].

The memory unit 1b shares the second well W2 and the second deep well DW2 with the selected memory unit 11a. Hence, −9 [V] is applied to the second well W2, similar to the case of the selected memory unit 11b as described above. However, 0 [V] is applied to the second deep well DW2. Thus, a voltage difference between the second well W2 and the second deep well DW2 is as small as 9 [V].

On the other hand, in the memory unit 1c, which is the non-selected memory unit 11b and which shares the first bit line BLP1 and the second bit line BLN1 with the selected memory unit 11a, the writing bit voltage (−9 [V]) is applied to the second bit line BLN1 while the writing inhibition voltage of 0 [V] is applied to a first well wiring WEG2. Thus, the voltage at the floating gate FGa does not rise in the capacity transistor 3a, and a tunneling effect does not occur between the floating gate FGa and the writing transistor 4a, so that no charge is injected into the floating gate FGa.

In the memory unit 1c connected to the non-selected first bit line BLP1 to which the writing inhibition bit voltage (writing inhibition voltage) of 0 [V] is applied and in the memory unit 1d connected to the non-selected first and second bit lines BLP2 and BLN2 to which the writing inhibition bit voltage of 0 [V] is applied, a voltage difference between the floating gate FGb and the channel region is small, so that a tunneling effect does not occur. Thus, no charge is injected into the floating gate FGb. In this case, 9 [V] is applied to the first deep well DW1 while the writing inhibition voltage of 0 [V] is applied to the first well wiring WEG2. Thus, a voltage difference between the first well W1 and the first deep well DW1 is as small as 9 [V].

In the non-volatile semiconductor memory device 10, data can be programmed only into the memory cell 2a in the memory unit 1a, among the memory units 1a, 1b, 1c, and 1d. As described above, in the non-volatile semiconductor memory device 10, when data is programmed into the memory unit 1a, the voltage difference between the first deep well DW1 and the first well W1 and the voltage difference between the second deep well DW2 and the second well W2 are smaller than the voltage difference (18 [V]), at which a tunneling effect occurs. Accordingly, a junction voltage between the first deep well DW1 and the first well W1 and a junction voltage between the second deep well DW2 and the second well W2 are low.

(1-3) Data Erasing Operation

Figure 3:
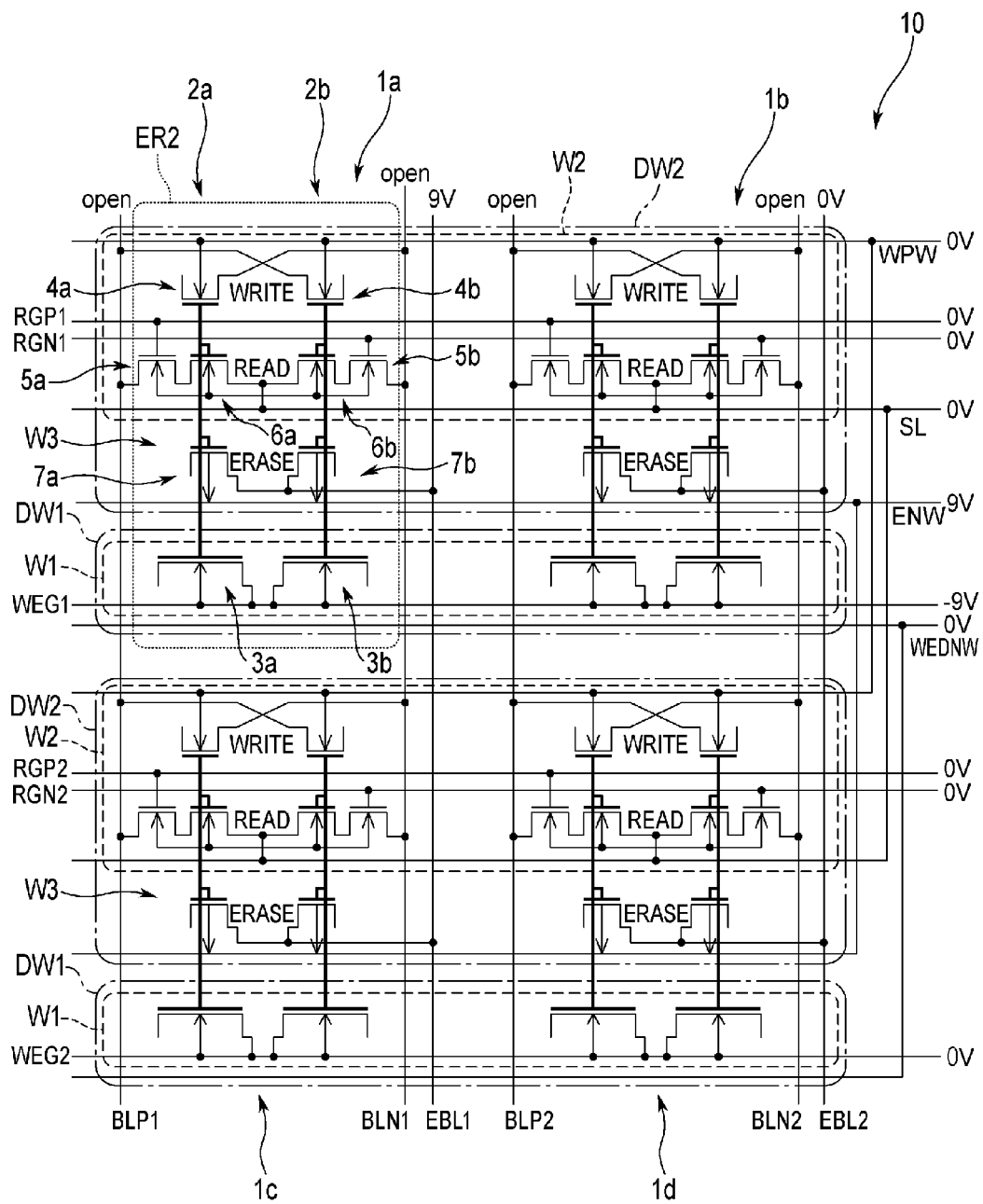
FIG. 3 is a schematic view illustrating voltage values at the respective sites during data erasure.

FIG. 3, in which portions corresponding to those illustrated in FIG. 2 are assigned the same reference numerals, illustrates voltage values at respective sites in a case where data in the memory unit 1a in an area ER2, which is located at the intersection of the first column and the first row, is erased and data in the remaining memory units 1b, 1c, and 1d are not erased. The memory units 1a, 1b, 1c, and 1d are arranged in a matrix.

In this case, in the non-volatile semiconductor memory device 10, an erasing voltage of −9 [V] is applied to the capacity transistors 3a and 3b in the memory unit 1a via the first well wiring WEG1. Thus, in the capacity transistors 3a and 3b in the first well W1 connected to the first well wiring WEG1, voltages at the respective floating gates FGa and FGb drop to −9 [V] due to capacitive coupling between the gate insulating films and the floating gates FGa and FGb.

In the memory unit 1a from which data is to be erased, an erasing bit voltage (erasing voltage) of 9 [V] is applied to the erasing transistors 7a and 7b via the erasing bit line EBL1. The same voltage (9 [V]) as the erasing bit voltage is applied to the second deep well DW2 via the second deep well wiring ENW. Thus, in the erasing transistors 7a and 7b in the memory unit 1a, a channel potential is the same voltage (9 [V]) as the erasing bit voltage.

As a result, in the memory unit 1a, a voltage difference between the floating gate FGa and the channel region of the erasing transistors 7a is 18 [V] and a voltage difference between the floating gate FGb and the channel region of the erasing transistor 7b is 18 [V]. The voltages at the floating gates FGa and FGb are −9 [V] due to the capacity transistors 3a and 3b, respectively. Hence, there are large voltage differences between the floating gates FGa and FGb and the channel regions of the erasing transistors 7a and 7b, respectively. Thus, in the memory unit 1a, charge is removed from the floating gates FGa and FGb due to a tunneling effect caused by the voltage difference (18 [V]) between the floating gate and FGa and the erasing transistor 7a and that between the FGb and the erasing transistor 7b. Thus, in the memory unit 1a, no charge is stored in the floating gates FGa and FGb and data has been erased.

In this case, 0 [V] is applied to the source line SL, and 0 [V] is applied to each of the read gate lines RGP1, RGN1, RGP2, and RGN2. All the switch transistors 5a and 5b in the memory units 1a, 1b, 1c, and 1d are turned off. In the memory units 1a, 1b, 1c, and 1d, the first bit lines BLP1 and BLP2 and the reading transistor 6a are electrically disconnected from each other, and the second bit lines BLN1 and BLN2 and the reading transistor 6b are electrically disconnected from each other.

In the present invention, the first deep well DW1 and the second deep well DW2 are electrically isolated from each other, so that a voltage different from a voltage to be applied to the second deep well DW2 can be applied to the first deep well DW1. Thus, a voltage of 0 [V], which is different from the voltage of 9 [V] to be applied to the second deep well DW2, can be applied to the first deep well DW1.

Thus, in the regions in which the capacity transistors 3a and 3b are formed in the first well W1, −9 [V] serving as the erasing voltage is applied via the first well wiring WEG1, so that the voltage at each of the floating gates FGa and FGb drops to −9 [V] due to capacitive coupling while the voltage difference between the first well W1 and the first deep well DW1 is as small as 9 [V], which is smaller than the voltage difference at which a tunneling effect occurs. Thus, in the memory unit 1a, the voltage difference between the first deep well DW1 and the first well W1 is made smaller than the voltage difference at which a tunneling effect occurs, and accordingly the junction voltage required between the first deep well DW1 and the first well W1 is low.

In the memory unit 1c connected to the erasing bit line EBL1 to which the erasing bit voltage (erasing voltage) of 9 [V] is applied, an erasure inhibition voltage of 0 [V] is applied to the first well wiring WEG2. Hence, the voltage differences between the floating gates FGa and FGb and the channel regions of the erasing transistors 7a and 7b, respectively, are small. Thus, the charge in the floating gates FGa and FGb are not removed by the erasing transistors 7a and 7b in the memory unit 1c, so that data has been retained in the floating gates FGa and FGb.

In the memory unit 1b connected to the first well wiring WEG1 to which the erasing voltage of −9 [V] is applied, an erasure inhibition bit voltage (erasure inhibition voltage) of 0 [V] is applied to the erasing bit line EBL2. Hence, the voltage differences between the floating gates FGa and FGb and the channel regions of the erasing transistors 7a and 7b, respectively, are small. Thus, the charge in the floating gates FGa and FGb are not removed by the erasing transistors 7a and 7b in the memory unit 1b, so that data has been retained in the floating gates FGa and FGb. In a like manner, in the memory unit 1d, voltage differences between the floating gates FGa and FGb and the channel regions, respectively, are small. Thus, in the memory unit 1d, charge is not removed from the floating gates FGa and FGb, so that data has been retained in the floating gates FGa and FGb.

In the non-volatile semiconductor memory device 10, the data is erased only in the memory unit 1a, among the memory units 1a, 1b, 1c, and 1d. As described above, in the non-volatile semiconductor memory device 10, when the data in the memory unit 1a is erased, each of the voltage difference between the first deep well DW1 and the first well W1 and the voltage difference between the second deep well DW2 and the second well W2 is made smaller than the voltage difference (18 [V]), at which a tunneling effect occurs. Accordingly, the junction voltage between the first deep well DW1 and the first well W1 and the junction voltage between the second deep well DW2 and the second well W2 are low.

In the above described embodiment, the erasing bit line EBL1 is shared between a plurality of memory cells arranged in the other direction (e.g. a column direction) different from one direction (e.g. a row direction) and a plurality of memory cells arranged in the other direction. Hence, a common voltage is applied to the memory cells 2a and 2b, which share the erasing bit line EBL1, via the erasing bit line EBL1.

In the present invention, an example in which the erasing bit line EBL1 and the erasing bit line EBL2 are separately controlled to erase the data through each of the erasing bit lines has been described. However, the present invention is not limited to this. For example, a method for integrating the erasing bit line EBL1 and the erasing bit line EBL2 into one erasing bit line, applying a common voltage to the memory units 1a and 1b in different columns by the erasing bit line, and simultaneously erasing data in the memory units 1a and 1b in the different columns may be used.

More specifically, in this case, an erasing bit line is shared between the memory unit 1a disposed in the other direction (e.g. the column direction), which is different from the one direction (e.g. the row direction), and the memory unit 1b disposed in the other direction (e.g. in another column), so that a common voltage can be applied via the erasing bit line to the memory units 1a and 1b which share the erasing bit line, and an erasure operation can be simultaneously and collectively performed on the memory units 1a and 1b in the different columns.

(1-4) Data Reading Operation

A following case is described where data is read out only from the memory units 1a and 1b, among the memory units 1a, 1b, 1c, and 1d in the non-volatile semiconductor memory device 10. Description is made only with respect to the memory unit 1a, and description of the memory unit 1b is omitted to avoid redundancy. In this case, in the memory unit 1a, an ON-state voltage is applied to the read gate lines RGP1 and RGN1, and both the switch transistors 5a and 5b are turned on. In this case, for example, 0 [V] is applied to the source line SL, and a power supply voltage VDD is applied as a reading voltage to the first bit line BLP1 and the second bit line BLN1. Here, given that data is programmed only into the one memory cell 2a in the memory unit 1a, and data is not programmed into the other memory cell 2b.

In the memory cell 2a in which charge has been stored in the floating gate FGa, in a case where 0 [V] is applied to the source of the reading transistor 6a via the source line SL, the reading transistor 6a is turned off, so that the reading transistor 6a and the first bit line BLP1 are electrically disconnected from each other and the voltage on the first bit line BLP1 is maintained at the power supply voltage VDD.

On the other hand, in the memory cell 2b in which no charge has been stored in the floating gate FGb, in a case where 0 [V] is applied to the source of the reading transistor 6b via the source line SL, the reading transistor 6b is turned on, so that the reading transistor 6b and the second bit line BLN1 are electrically connected to each other and the voltage on the second bit line BLN1 is lower than the power supply voltage VDD.

Thus, in the non-volatile semiconductor memory device 10, a potential on the second bit line BLN1 is lower than a potential on the first bit line BLP1. A potential difference between the first bit line BLP1 and the second bit line BLN1 is latched by a latch circuit (not illustrated). Thereby, the voltage, which is higher, on the first bit line BLP1 is maintained at the power supply voltage VDD while the voltage, which is lower, on the second bit line BLN1 is maintained at 0 V, so that reading information is determined.

In the present embodiment, in the memory unit 1a, the second bit line BLN1 used for writing in the memory cell 2a is also used for reading in the memory cell 2b. Similarly, the first bit line BLP1 used for writing in the memory cell 2b is also used for reading in the memory cell 2a. Thus, in the memory units 1a, 1b, 1c, and 1d, the number of bits is smaller than that in the case where the bit line for writing and the bit line for reading are separately provided for each of the memory cells 2a and 2b. Therefore, a circuit configuration is simplified.

In a case where, for example, a voltage of 0 [V] (a high level) is applied to the first bit line BLP1 during data writing, charge is removed from the floating gate FGb in the memory cell 2b. In this case, a voltage of −9 [V] (a low level) is applied to the complementary second bit line BLN1. Thereby, charge is injected into the floating gate FGa in the memory cell 2a due to a tunneling effect and is stored in the floating gate FGa.

When data in the memory unit 1a is read out, the voltage on the first bit line BLP1 is maintained at the power supply voltage VDD as described above, i.e. the voltage is at a high level, similar to that during data writing. On the other hand, the voltage on the second bit line BLN1 is at or less than the power supply voltage VDD, i.e. the voltage is at a low level, similar to that during data writing. Thus, in the memory unit 1a, high/low relationship between the voltage levels on the first and second bit lines BLP1 and BLN1 is the same between data writing and data reading. Therefore, an inversion circuit, which inverts the high/low relationship between the voltage level for writing and the voltage level for reading, is not necessary.

In the present embodiment, in the memory units 1c and 1d from which data is not read out, each of the switch transistors 5a and 5b is turned off to prevent reading data from the floating gates FGa and FGb. Thus, the data is read out only from the selected memory units 1a and 1b.

(1-5) Operation and Effect

In the above described configuration, the non-volatile semiconductor memory device 10 comprises; the memory cells 2a and 2b which include the capacity transistors 3a and 3b that adjusts voltages at the floating gates FGa and FGb, respectively; the writing transistors (charge injection transistors) 4a and 4b that inject charge into the floating gates FGa and FGb in response to a voltage difference from the capacity transistors 3a and 3, respectively; the erasing transistors (charge ejection transistors) 7a and 7b for removing charge from the floating gates FGa and FGb in response to a voltage difference from the capacity transistors 3a and 3b, respectively; and the reading transistors 6a and 6b that read out a voltage depending on the presence or absence of charge in the floating gates FGa and FGb, respectively, and the floating gates FGa and FGb are shared among the capacity transistors 3a and 3b, the writing transistors 4a and 4b, the erasing transistors 7a and 7b, and the reading transistors 6a and 6b.

The memory cells 2a and 2b are provided with the first well W1 of the first conductivity type (P type) in which the capacity transistors 3a and 3b are formed, the second well W2 of the first conductivity type in which the writing transistors 4a and 4b are formed, and the third well W3 of the second conductivity type (N type) in which the erasing transistors 7a and 7b are formed. Further, in the memory cells 2a and 2b, the first deep well DW1 being of the second conductivity type and surrounding the first well W1 to form a triple well structure in a region (formation region) of the first well W1 and the second deep well DW2 similarly being of the second conductivity type and contacting the third well W3 while surrounding the second well W2 to form a triple well structure in a region (formation region) of the second well W2 are electrically isolated from each other so that the different voltage from the voltage to be applied to the first deep well DW1 can be applied to the second deep well DW2.

Thus, in the non-volatile semiconductor memory device 10, the voltages required to operate the respective capacity transistors 3a and 3b in the first well W1 and the respective writing transistors 4a and 4b in the second well W2 are separately applied to the first deep well DW1 and the second deep well DW2, without being restricted by the voltages applied to the first deep well DW1 and the second deep well DW2.

Therefore, in the non-volatile semiconductor memory device 10, when the data writing operation is performed in, for example, the memory cell 2a, a value of the voltage to be applied to the second deep well DW2 is separately selected without being restricted by a value of the voltage to be applied to the first deep well DW1, which is necessary for raising the voltage at the floating gate FGa in the capacity transistor 3a. Therefore, by adjusting the value of the voltage to be applied to the second deep well DW2, the voltage difference between the second deep well DW2 and the second well W2 is made smaller than the voltage difference at which a tunneling effect occurs, and accordingly a junction breakdown voltage required between the second deep well DW2 and the second well W2 is low.

In the non-volatile semiconductor memory device 10, when the data erasing operation is performed in, for example, the memory cells 2a and 2b, a value of the voltage to be applied to the first deep well DW1 is separately selected without being restricted by the value of the voltage applied to the second deep well DW2 to remove charge from the floating gates FGa and FGb in the erasing transistors 7a and 7b. Therefore, by adjusting the value of the voltage to be applied to the first deep well DW1, the voltage difference between the first deep well DW1 and the first well W1 is made smaller than the voltage difference at which a tunneling effect occurs, and accordingly a junction breakdown voltage required between the first deep well DW1 and the first well W1 is low.

Thus, in the memory unit 1a in the non-volatile semiconductor memory device 10, the junction voltage between the first deep well DW1 and the first well W1 and the junction voltage between the second deep well DW2 and the second well W2 are low. Therefore the non-volatile semiconductor memory device 10 can be embedded with a circuit element having a miniaturized circuit structure and having a low junction breakdown voltage.

In the present embodiment, in the memory cell 2a, the first bit line BLP1 is connected to the reading transistor 6a via the switch transistor 5a. The second bit line BLN1 is directly connected to the writing transistor 4a. On the other hand, in the memory cell 2b paired with the memory cell 2a, the second bit line BLN1 is connected to the reading transistor 6b via the switch transistor 5b. The first bit line BLP1 is directly connected to the writing transistor 4b.

Thus, in the memory unit 1a, the second bit line BLN1 used for writing in the memory cell 2a is also used for reading in the memory cell 2b although the number of bit lines is two, i.e. the first bit line BLP1 and the second bit line BLN1. Thus, as a whole, the number of the bit lines is the same as the number of the cells. Therefore the effective number of the bit lines is one per cell, so that the entire non-volatile semiconductor memory device 10 is miniaturized.

In the non-volatile semiconductor memory device 10, the reading transistors 6a and 6b and the first and second bit lines BLP1 and BLN1 are electrically disconnected by the switch transistors 5a and 5b, respectively. Thus, the reading transistors 6a and 6b do not serve as charge transfer paths during data writing and data erasing, so that damage caused by an electric field applied to the gate insulating films of the reading transistors 6a and 6b and damage due to a stress of hot carrier are prevented. Thus degradation of the reading current caused by the data writing and erasing is prevented and a malfunction caused by the degradation of the current is prevented.

(1-6) Another Embodiment

In the above described first embodiment, as illustrated in FIG. 1, a case has been described where the second bit line BLN1 used for writing in the one memory cell 2a is also used for reading in the other memory cell 2b and the first bit line BLP1 used for writing in the memory cell 2b is also used for reading in the memory cell 2a.

Figure 4:
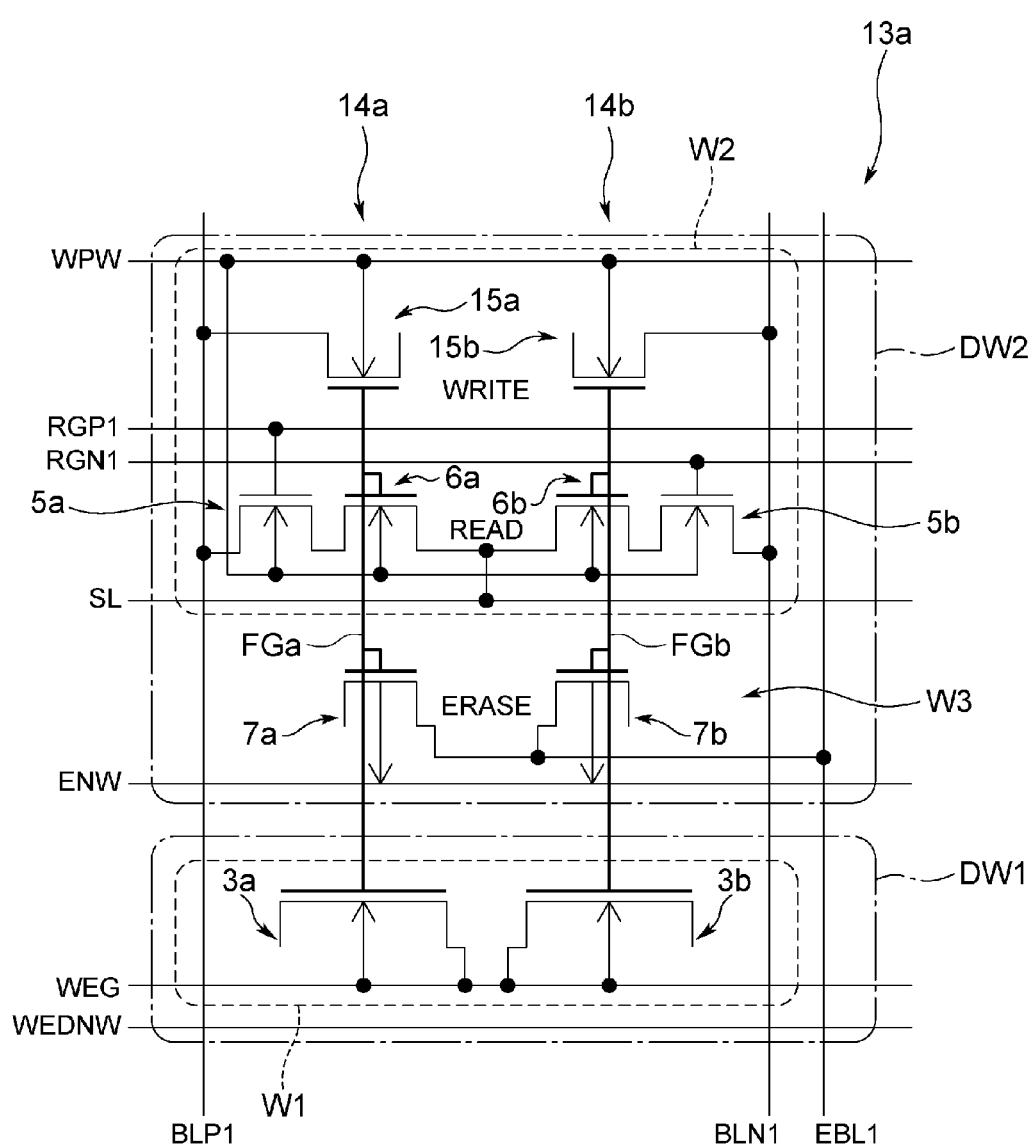
FIG. 4 is a schematic view illustrating a circuit configuration of another memory units according to the first embodiment.

However, the present invention is not limited to this. For example, as illustrated in FIG. 4, in which portions corresponding to those illustrated in FIG. 1 are assigned the same reference numerals, a memory unit 13a may be used. In the memory unit 13, the first bit line BLP1 is used for writing and reading in a memory cell 14a and the second bit line BLN1 is used for writing and reading in a memory cell 14b.

In this case, as illustrated in FIG. 4, in a memory unit 13a provided in a non-volatile semiconductor memory device, the memory cell 14a is paired with the memory cell 14b so that the memory cells 14a and 14b constitute one bit, for example. In the memory unit 13a, capacity transistors 3a and 3b are formed in a first well W1 surrounded by a first deep well DW1, and a second well W2 and a third well W3 are formed in a second deep well DW2 electrically isolated from the first deep well DW1, in a manner similar to the memory unit 1a described above. In the second well W2, writing transistors 15a and 15b, reading transistors 6a and 6b, and switch transistors 5a and 5b are formed.

One end of the one writing transistor 15a in the one memory cell 14a and one end of the one switch transistor 5a in the one memory cell 14a are connected to the first bit line BLP1. Thus, a predetermined voltage can be applied from the first bit line BLP1 to the writing transistor 15a and the switch transistor 5a. One end of the other writing transistor 15b in the other memory cell 14b and one end of the other switch transistor 5b in the other memory cell 14b are connected to the second bit line BLN1. Thus, a predetermined voltage can be applied from the second bit line BLN1 to the writing transistor 15b and the other switch transistor 5b.

In the memory unit 13a having the above-described configuration, in a case where a data writing operation is performed in, for example, the memory cell 14, a value of a voltage to be applied to the second deep well DW2 is separately selected without being restricted by a value of a voltage applied to the first deep well DW1, which is necessary for raising a voltage at the floating gate FGa in the capacity transistor 3a. By adjusting the value of the voltage to be applied to the second deep well DW2, a voltage difference between the second deep well DW2 and the second well W2 is made smaller than a voltage difference at which a tunneling effect occurs.

In the memory unit 13a, when a data erasing operation is performed in, for example, the memory cells 14a and 14b, a value of a voltage to be applied to the first deep well DW1 is separately selected without being restricted by a value of a voltage of the second deep well DW2, which is necessary for removing charge from the floating gates FGa and FGb in the erasing transistors 7a and 7b. By adjusting the value of the voltage applied to the first deep well DW1, a voltage difference between the first deep well DW1 and the first well W1 is made smaller than the voltage difference at which a tunneling effect occurs.

Thus, in the non-volatile semiconductor memory device comprising the memory unit 13a, the voltage difference between the first deep well DW1 and the first well W1 and the voltage difference between the second deep well DW2 and the second well W2 are made small, and accordingly a junction voltage between the first deep well DW1 and the first well W and a junction voltage between the second deep well DW2 and the second well W2 are low. Thus, the non-volatile semiconductor memory device can be embedded with a circuit element having a miniaturized circuit structure and having a low junction breakdown voltage.

While a case where the present invention is applied to the non-volatile semiconductor memory device comprising the memory units 1a, 1b, 1c, and 1d (13a), in which the memory cells 2a and 2b (14a and 14b) are paired with each other, has been described in the above described embodiment, the present invention is not limited to this. A memory unit storing one bit in each of the memory cells 2a and 2b (14a and 14b) (i.e. a memory unit having the one memory cell 2a (14a) and the other memory cell 2b (14b) each storing one bit, to store the two bits in total) may be used.

Figure 5:
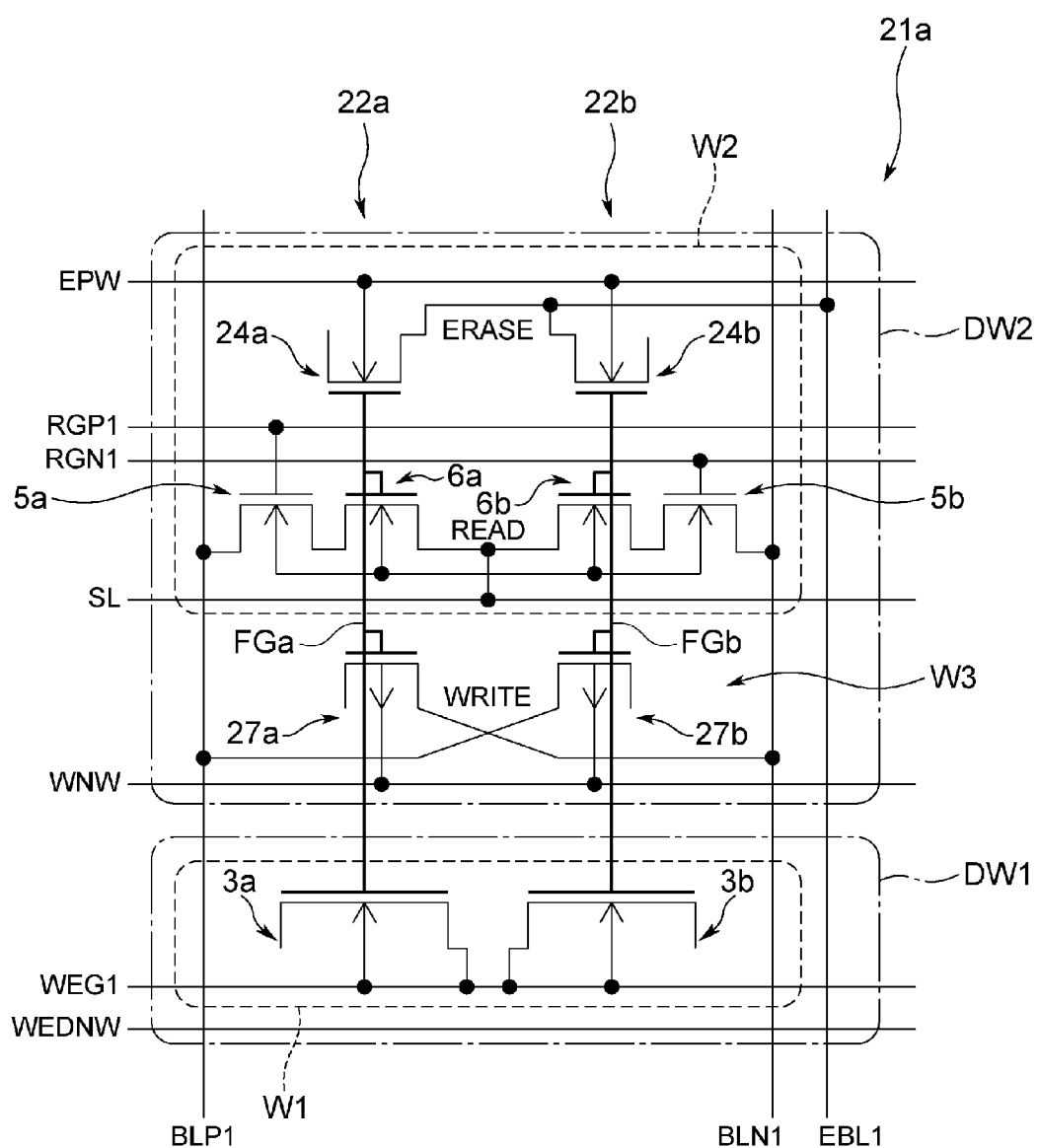
FIG. 5 is a schematic view illustrating a circuit configuration of a memory unit according to a second embodiment.

(2) Non-volatile Semiconductor Memory Device According to Second Embodiment (2-1) Circuit Configuration of Memory Unit FIG. 5, in which portions corresponding to those illustrated in FIG. 1 are assigned the same reference numerals, illustrates a memory unit provided in a non-volatile semiconductor memory device, according to a second embodiment of the present invention. The second embodiment differs from the above described first embodiment in that erasing transistors 24a and 24b are formed in a second well W2 and writing transistors 27a and 27b are formed in a third well W3, and has a feature in that a region (formation region) in which the erasing transistors 24a and 24b are formed and a region (formation region) in which the writing transistors 27a and 27b are formed are disposed opposite to those in the first embodiment.

A plurality of memory units are arranged in a matrix of rows and columns in the non-volatile semiconductor memory device (which will be described below with reference to FIG. 6) and configuration with respect to one memory unit 21a will be described below. As illustrated in FIG. 5, the memory unit 21a comprises a memory cell 22a and a memory cell 22b. A first bit line BLP1 and a second bit line BLN1 are connected to the one memory cell 22a while the first bit line BLP1 and the second bit line BLN1 are connected also to the other memory cell 22b.

The one memory cell 22a and the other memory cell 22b are provided with a first deep well wiring WEDNW, a first well wiring WEG1, a second deep well wiring WNW, a source line SL, read gate lines RGP1 and RGN1, a second well wiring EPW, and an erasing bit line EBL1 so that predetermined voltage(s) is applied, as needed, from the first deep well wiring WEDNW, the first well wiring WEG1, the second deep well wiring WNW, the source line SL, the read gate lines RGP1 and RGN1, the second well wiring EPW, and the erasing bit line EBL1.

In the present embodiment, the one memory cell 22a and the other memory cell 22b have the same configuration and these two cells constitute a complementary cell in which the two cells are used to store one bit, for example. While a case where the two cells, i.e. the one memory cell 22a and the other memory cell 22b, constitute the complementary cell for storing one bit will be described in the present invention, the present invention is not limited to this. A memory unit storing one bit in each of the memory cells 22a and 22b (i.e. a memory unit storing one bit in each of the one memory cell 22a and the other memory cell 22b, to store the two bits in total) may be used.

Two bit lines, i.e. a first bit line BLP1 and a second bit line BLN1 are connected to the one memory cell 22a of the memory unit 21a, and the number of bit lines per cell is two. However, in the memory unit 21a, the second bit line BLN1 used for writing in the one memory cell 22a is also used for reading in the other memory cell 22b, for example, similar to the above described first embodiment. Thus, as a whole, the number of bit lines is the same as the number of cells, and the effective number of bit lines is one per cell.

With respect to a configuration of the memory cell 22a, the memory cell 22a comprises the writing transistor 27a, a reading transistor 6a, the erasing transistor 24a, a capacity transistor 3a, and a switch transistor 5a, and one floating gate FGa is shared among the writing transistor 27a, the reading transistor 6a, the erasing transistor 24a, and the capacity transistor 3a. Similar to the above-described first embodiment, the floating gate FGa is connected to a gate insulating film of the erasing transistor 24a, a gate insulating film of the reading transistor 6a, a gate insulating film of the writing transistor 27a, and a gate insulating film of the capacity transistor 3a.

In this case, the erasing transistor 24a serving as a charge injection transistor is an N-type MOS formed in a second well W2 of a P type (first conductivity type), for example, and a diffusion layer at one end is connected to the erasing bit line EBL1 and a diffusion layer at the other end is short-circuited to the second well W2. The writing transistor 27a serving as a charge ejection (removal) transistor is a P-type MOS formed in a third well W3 of an N type (second conductivity type), for example. In this case, the second bit line BLN1 is connected to a diffusion layer at one end of the writing transistor 27a disposed in the one memory cell 22a, and the first bit line BLP1 is connected to a diffusion layer at one end of the writing transistor 27b disposed in the other memory cell 22b.

In the memory unit 21a, the first bit line BLP1 directly connected to the writing transistor 27b in the memory cell 22b is connected to the reading transistor 6a in the memory cell 22a via the switch transistor 5a, and the second bit line BLN1 directly connected to the writing transistor 27a in the memory cell 22a is connected to the reading transistor 6b in the memory cell 22b via the switch transistor 5b.

In addition to such a configuration, in the memory unit 21a according to the second embodiment, a first deep well DW1 and a second deep well DW2 of the N type (second conductivity type) are formed on a semiconductor substrate of the P type (first conductivity type) (not illustrated), similar to the above-described first embodiment. In this case, the first deep well DW1 is formed to surround the first well W1 of the P type (first conductivity type), to electrically isolate the first well W1 from the semiconductor substrate so that a triple well structure is formed in a region (formation region) in which the first well W1 is formed. In the first well W1, channel regions of the respective capacity transistors 3a and 3b are formed, so that a predetermined voltage is applied to the capacity transistors 3a and 3b via the first well wiring WEG1.

The second deep well DW2 is formed to surround the P-type second well W2, to electrically insulate the second well W2 from the semiconductor substrate so that a triple well structure is formed in a region (formation region) in which the second well W2 is formed, similar to the above described first embodiment. In the second deep well DW2, the third well W3 of the N-type (second conductivity type) is formed adjacent to the second well W2. In this case, in the second well W2, channel regions of the respective erasing transistors 24a and 24b, the reading transistors 6a and 6b, and the switch transistors 5a and 5b are formed, so that a predetermined voltage is applied via the second well wiring EPW. The third well W3 has a configuration in which channel regions of the writing transistors 27a and 27b are formed, and is at the same potential as that in the second deep well DW2 of the N type (second conductivity type) having the same polarity as that of the third well W3.

In addition to the above, in the memory unit 21a according to the second embodiment, the first deep well DW1 and the second deep well DW2 are electrically isolated from each other so that a voltage different from a voltage applied to the second deep well DW2 is separately applied to the first deep well DW1. Thereby, in the second deep well DW2, a voltage required for an operation of the writing transistors 27a and 27b in the third well W3 is separately applied via the second deep well wiring WNW, without being restricted by a voltage applied to the first deep well DW1. Thus, of the voltages required for writing operation performed by the writing transistors 27a and 27b and erasing operation performed by the erasing transistors 24a and 24b, a voltage causing a small voltage difference between the second deep well DW2 and the second well W2 having the polarity different from the second deep well DW2 is applied to the second deep well DW2.

In the first deep well DW1, a voltage required for an operation of the capacity transistors 3a and 3b in the first well W1 is separately applied via the first deep well wiring WEDNW, without being restricted by the voltage applied to the second deep well DW2. Thus, of the voltages required for the writing operation and the erasing operation performed by the capacity transistors 3a and 3b, a voltage causing a small voltage difference between the first deep well DW1 and the first well W1, in which the capacity transistors 3a and 3b are formed, is applied to the first deep well DW1.

Thus, in the non-volatile semiconductor memory device comprising the memory unit 21a, the voltage difference between the first deep well DW1 and the first well W1 and the voltage difference between the second deep well DW2 and the second well W2 are made small, and accordingly a junction voltage between the first deep well DW1 and the first well W and a junction voltage between the second deep well DW2 and the second well W2 are low. Thus, the non-volatile semiconductor memory device can be embedded with a circuit element having a miniaturized circuit structure and having a low junction breakdown voltage.

(2-2) Data Writing Operation

Figure 6:
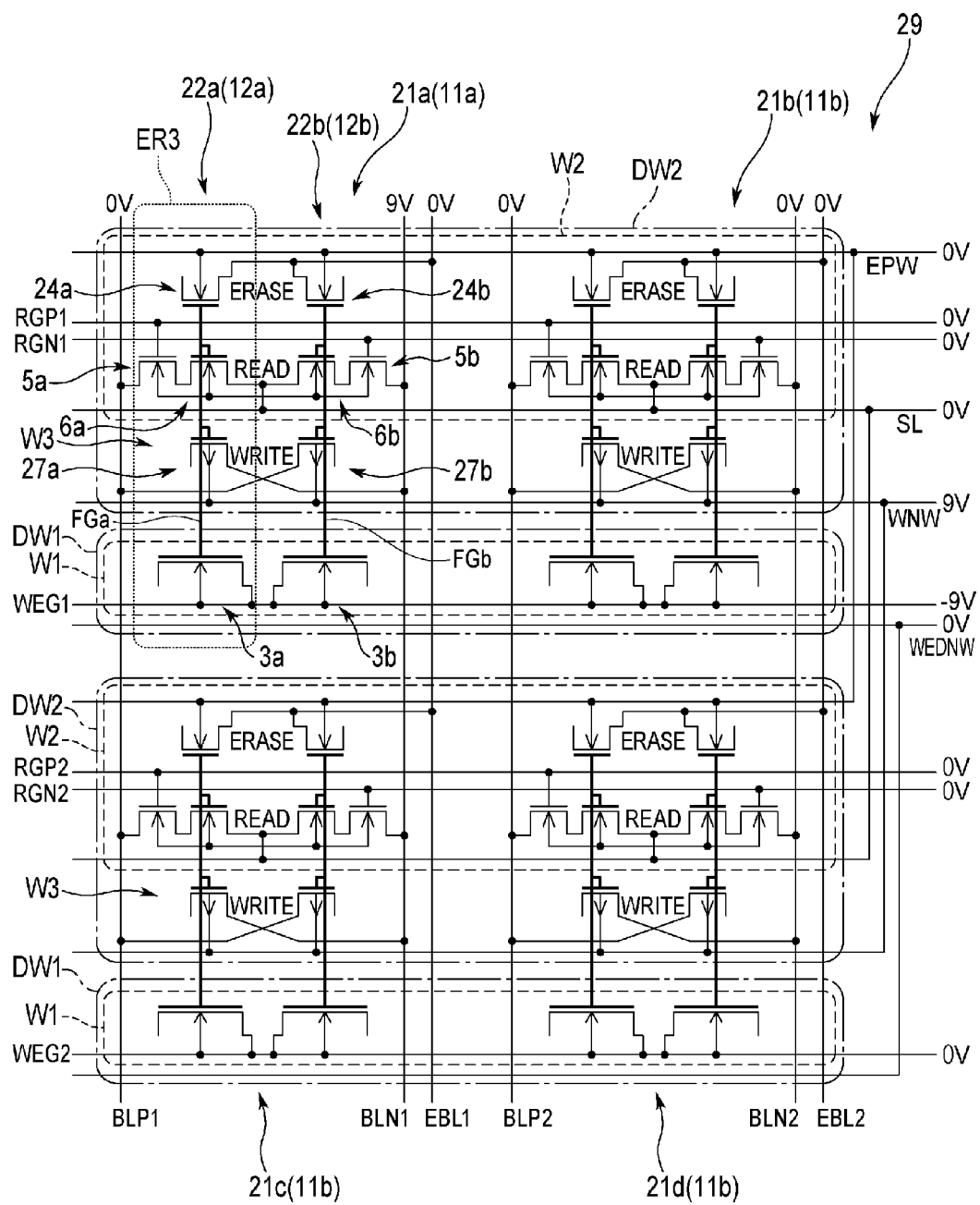
FIG. 6 is a schematic view illustrating a circuit configuration of a non-volatile semiconductor memory device in which memory units illustrated in FIG. 5 are arranged in a matrix and voltage values at sites in programming data into a predetermined memory unit.

FIG. 6 illustrates a non-volatile semiconductor memory device 29 in which a plurality of memory units 21b, 21c, and 21d each having the same circuit configuration as that of the memory unit 21a illustrated in FIG. 5 are arranged in a matrix (a matrix of two rows and two columns in this case). FIG. 6 illustrates voltage values at respective sites in a case where data is programmed only into the memory cell 22a (i.e. an area ER3) in the memory unit 21a, which is located at the intersection of the first row and the first column, among the memory units 21a, 21b, 21c, and 21d. Here, the memory unit 21a comprising the memory cell 22a into which data is programmed is referred to as a selected memory unit 11a. The memory units 21b, 21c, and 21d in which data is programmed into neither one of the memory cell 22a and the memory cell 22b are referred to as non-selected memory units 11b.

In the non-volatile semiconductor memory device 29, a first deep well DW1 and a second deep well DW2 are formed across the memory units 21a and 21b (21c and 21d) arranged in one direction (e.g. in a row direction), and the first deep well DW1 and the second deep well DW2 are shared between the memory units 21a and 21b (21c and 21d). In the first deep well DW1, the first well W1 is formed across the memory units 21a and 21b (21c and 21d) arranged in one direction, and the first well W1 is shared between the memory units 21a and 21b (21c and 21d). In the second deep well DW2, a second well W2 and a third well W3 are formed along the memory units 21a and 21b (21c and 21d) arranged in one direction, and the second well W2 and the third well W3 are shared between the memory units 21a and 21b (21c and 21d).

In the second embodiment, the first deep well wiring WEDNW is connected to the plurality of first deep wells DW1 so that the same voltage can be applied thereto by the first deep well wiring WEDNW. The second deep well wiring WNW is also connected to the plurality of second deep wells DW2 so that the same voltage can be applied thereto by the second deep well wiring WNW. Further, the second well wiring EPW is also connected to the plurality of second wells W2 so that the same voltage can be applied thereto by the second well wiring EPW.

In such a configuration, in the non-volatile semiconductor memory device 29, a writing voltage of −9 [V] is applied to a first well wiring WEG1 connected to the selected memory unit 11a. Thus, in the capacity transistors 3a and 3b connected to the first well wiring WEG1, a voltage at each of the floating gates FGa and FGb drops to −9 [V] due to capacitive coupling between the gate insulating films and the floating gates FGa and FGb.

In this case, in the memory cell 22a (a selected cell 12a), into which data is to be programmed, in the selected memory unit 11a disposed in the first column, a writing bit voltage (writing voltage) of 9 [V] is applied to the writing transistor 27a via a second bit line BLN1 while the same voltage (9 [V]) as the writing bit voltage is applied from the second deep well DW2 to the third well W3 having the same polarity as the second deep well DW2 via the second deep well wiring WNW. Thus, in the writing transistor 27a in the selected cell 12a, a channel potential is 9 [V], which is the same as the writing bit voltage.

As a result, in the selected cell 12a, a voltage difference between the floating gate FGa, at which the voltage is set to −9 [V] by the capacity transistor 3a, and a channel region of a writing transistor 27a is 18 [V], so that a large voltage difference is generated between the floating gate FGa and the channel region of the writing transistor 27a. Therefore, in the selected cell 12a, charge is transferred to the channel region (the third well W3) from the floating gate FGa in the writing transistor 27a due to a tunneling effect caused by the voltage difference (18 [V]) between the floating gate FGa and the writing transistor 27a. Thus, the charge is not stored in the floating gate FG in the selected cell 12a, so that data is programmed in the selected cell 12a.

In this case, in the non-volatile semiconductor memory device 29, the same voltage (9 [V]) as the writing bit voltage (writing voltage) of 9 [V] to be applied to the writing transistor 27a in the selected cell 12a from the second bit line BLN1 is also applied to the third well W3 via the second deep well wiring WNW. Thereby, a voltage difference of 18 [V], at which the tunneling effect occurs, is generated between the floating gate FGa and the channel region in a region (formation region) in which the writing transistor 27a is formed. A voltage difference between the second well W2 and the second deep well DW2 is 9 [V], which is smaller than the voltage difference at which the tunneling effect occurs.

In this case, in the non-volatile semiconductor memory device 29, a voltage different from a voltage of 9 [V] applied to the second deep well DW2 is applied to the first deep well DW1. Thus, a voltage of 0 [V], at which a voltage difference from a voltage of −9 [V] applied to the first well W1 is small, is applied to the first deep well DW1 via the first deep well wiring WEDNW.

Thus, in the selected memory unit 11a, a voltage difference between the first well W1, in which the capacity transistor 3a is formed, and the first deep well DW1 can be suppressed to 9 [V], which is smaller than the voltage difference at which the tunneling effect occurs while the voltage at the floating gate FGa is set to −9 [V] due to capacitive coupling between the gate insulating film and the floating gate FGa in the capacity transistor 3a.

An OFF-state voltage of 0 [V] is applied to each of one read gate line RGP1 and the other read gate line RGN1 disposed in the selected cell 12a. Thus, the switch transistors 5a and 5b in the selected cell 12a are turned off, so that the voltages on the first bit line BLP1 and the second bit line BLN1 are cut off.

In the above described first embodiment, a writing bit voltage (writing voltage) of −9 [V] is applied to the second bit line BLN1, as illustrated in FIG. 2, unlike the second embodiment. Thus, in the first embodiment illustrated in FIG. 2, a negative voltage of −9 [V] is applied as an OFF-state voltage to the gate of the switch transistor 5b via the switch gate line RGN1, to turn off the switch transistor 5b. Thereby the writing bit voltage on the second bit line BLN1 is cut off. Thus, in the first embodiment, the switch transistors 5a and 5b are operated at a high voltage (a negative voltage of −9 [V]), so that a control circuit that controls the switch transistors 5a and 5b increases in size.

On the other hand, in the second embodiment, a positive voltage of 9 [V] is applied to the second bit line BLN1 connected to the selected cell 12a during a data writing operation. Therefore the switch transistor 5b connected to the switch gate line RGN1 is turned off by applying 0 [V] to the switch gate line RGN1. Thus, in the second embodiment, the switch transistors 5a and 5b are operated at a lower voltage (0 [V]) than that in the first embodiment, and accordingly a control circuit that controls the switch transistors 5a and 5b decreases in size.

A positive voltage of 0 [V] or more is applied to the first bit line BLP1 and the second bit line BLN1. Thus, a negative voltage is not applied to a reading circuit. Therefore a circuit for cutting off the negative voltage need not be provided, and accordingly the control circuit is made smaller than that in the first embodiment.

The first embodiment and the second embodiment are common in that they can be applied to a product in which a potential of the semiconductor substrate is not a ground potential because the reading transistors 6a and 6b and the switch transistors 5a and 5b are disposed in the second well W2 isolated from the semiconductor substrate.

The memory cell 22b (a non-selected cell 12b) in which charge in the floating gate FGb is not transferred to a channel region of a writing transistor 27b will be described below. In this case, a writing inhibition bit voltage of 0 [V] is applied to the first bit line BLP1 that is "non-selected". Thus, in the selected memory unit 11a, the writing inhibition bit voltage of 0 [V] is applied from the first bit line BLP1 to one end of the writing transistor 27b in the non-selected cell 12b.

As a result, in the non-selected cell 12b in the selected memory unit 11a, a channel potential of the writing transistor 27b is the same voltage (0 [V]) as the writing inhibition bit voltage on the first bit line BLP1. Thus, a potential difference from the floating gate FGb, which is set to −9 [V] by the capacity transistor 3b, becomes as small as 9 [V]. As a result, a tunneling effect does not occur, so that the charge in the floating gate FGb is not transferred to the channel region. Thus, the non-selected cell 12b is maintained in a state where the charge has been stored in the floating gate FGb and no data has been programmed.

In this case, a voltage of 0 [V] is applied also to the erasing bit line EBL1 and the source line SL. In the one memory cell 22a and the other memory cell 22b in the selected memory unit 11a, a voltage difference between the floating gate FGa and each of the gate insulating film of the erasing transistor 24a and the gate insulating film of the reading transistor 6a and a voltage difference between the floating gate FGb and each of the gate insulating film of the erasing transistor 24b and the gate insulating film of the reading transistor 6b are small. The erasing transistors 24a and 24b are connected to the erasing bit line EBL1, and the reading transistors 6a and 6b are connected to the source line SL. A tunneling effect does not occur in such regions, so that the charge in the floating gates FGa and FGb are not removed.

In the memory unit 21b, which is the non-selected memory unit 11b, the writing voltage of −9 [V] is applied to the first well wiring WEG1, which is shared between the non-selected memory unit 11b and the selected memory unit 11a, while the writing inhibition bit voltage of 0 [V] is applied to each of a non-selected first bit line BLP2 and a non-selected second bit line BLN2. Thus, voltage differences between the floating gates FGa and FGb and the writing transistors 27a and 27b, respectively, are small. The tunneling effect does not occur in such regions, so that charge in the floating gates FGa and FGb are not removed.

In this case, in the memory unit 21b, which shares the first well W1 and the first deep well DW1 with the selected memory unit 11a, −9 [V] is applied to the first well W1 and 0 [V] is applied to the first deep well DW1, similar to the selected memory unit 11a described above. Thus, the voltage difference between the first well W1 and the first deep well DW1 is smaller than the voltage difference at which a tunneling effect occurs.

The memory unit 21b also shares the second well W2 and the second deep well DW2 with the selected memory unit 11a. In a case where 0 [V] is applied to the second well W2 while 9 [V] is applied to the second deep well DW2, similar to the selected memory unit 11a described above, the voltage difference between the second well W2 and the second deep well DW2 is as small as 9 [V].

On the other hand, in the memory unit 21c which is the non-selected memory unit 11b that shares the first bit line BLP1 and the second bit line BLN1 with the selected memory unit 11a, the writing bit voltage (writing voltage) (9 [V]) is applied to the second bit line BLN1 while a writing inhibition voltage of 0 [V] is applied to a first well wiring WEG2. Thus, the voltage at the floating gate FGa does not drop in the capacity transistor 3a, and a tunneling effect does not occur between the floating gate FGa and the writing transistor 27a, so that charge in the floating gate FGa is not removed.

In the memory unit 21c connected to the non-selected first bit line BLP1 to which the writing inhibition bit voltage of 0 [V] is applied and in the memory unit 21d connected to the non-selected first bit line BLP2 and the second bit line BLN2 to which the writing inhibition bit voltage of 0 [V] is applied, voltage differences between the floating gates FGa and FGb and the channel regions, respectively, are small. Hence, a tunneling effect does not occur, so that the charge in the floating gates FGa and FGb is not removed.

Thus, in the non-volatile semiconductor memory device 29, data is programmed only into the memory cell 22a in the memory unit 21a, among the memory units 21a, 21b, 21c, and 21d. As described above, in the non-volatile semiconductor memory device 29, when data is programmed into the memory unit 21a, each of the voltage difference between the first deep well DW1 and the first well W1 and the voltage difference between the second deep well DW2 and the second well W2 is made smaller than the voltage difference (18 [V]) at which the tunneling effect occurs, and accordingly a junction voltage between the first deep well DW1 and the first well W1 and a junction voltage between the second deep well DW2 and the second well W2 are low.

(2-3) Data Erasing Operation

Figure 7:
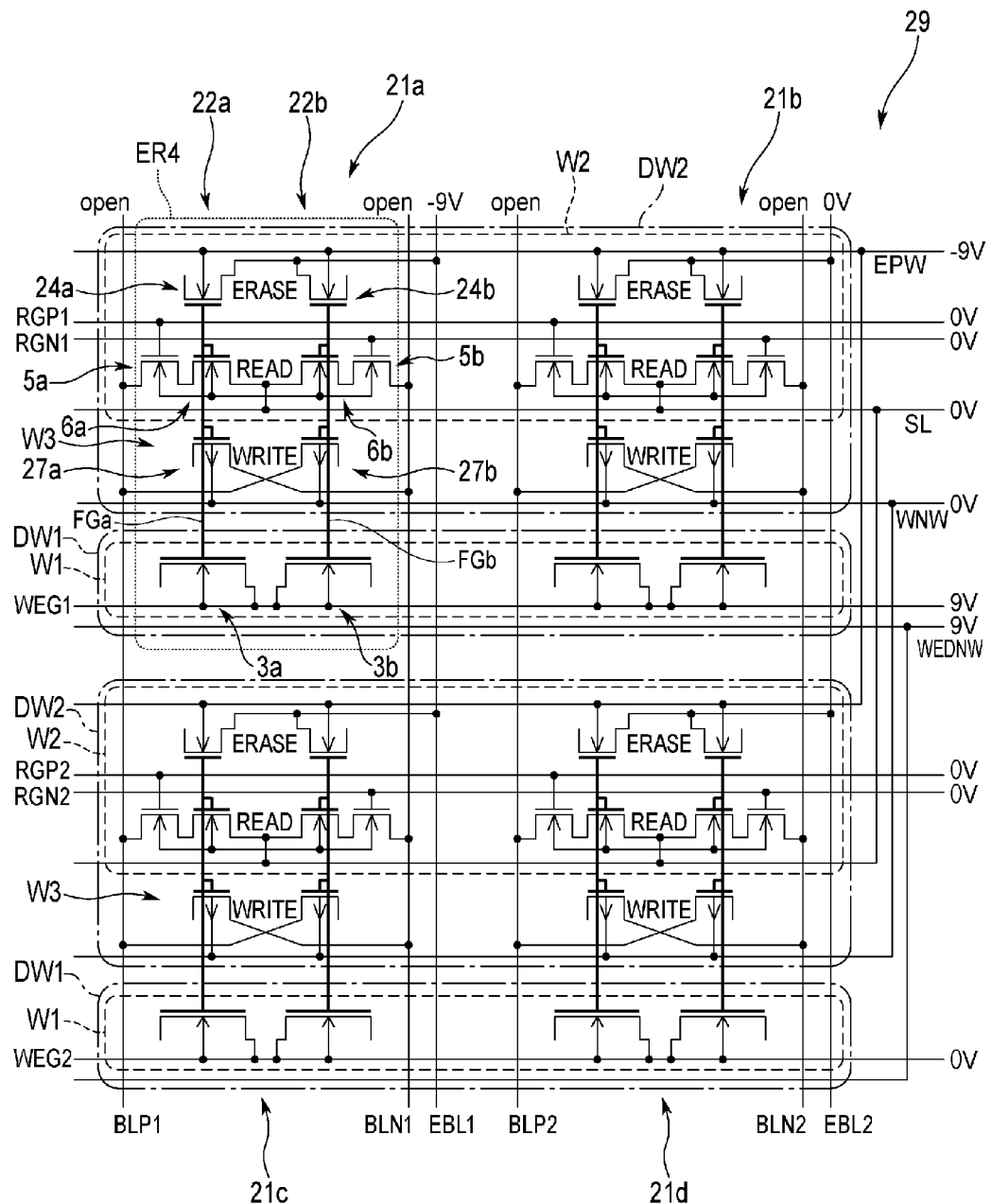
FIG. 7 is a schematic view illustrating voltage values at sites during data erasing.

FIG. 7, in which portions corresponding to those illustrated in FIG. 6 are assigned the same reference numerals, illustrates voltage values at respective sites when data in the memory cells 22a and 22b (i.e. the area ER4) in the memory unit 21a, which is located at the intersection of the first column and the first row, is erased and data in the remaining memory units 21b, 21c, and 21d are not erased. The memory units 1a, 1b, 1c, and 1d are arranged in a matrix.

In this case, in the non-volatile semiconductor memory device 29, an erasing voltage of 9 [V] is applied to the capacity transistors 3a and 3b in the memory unit 21a via the first well wiring WEG1. Thus, in the capacity transistors 3a and 3b, which are in the first well W1 connected to the first well wiring WEG1, voltages at the floating gates FGa and FGb rise to 9 [V] due to capacitive coupling between the gate insulating films and the floating gates FGa and FGb, respectively.

In this case, in the memory unit 21a from which the data is to be erased, an erasing bit voltage (erasing voltage) of −9 [V] is applied to the erasing transistors 24a and 24b via the erasing bit line (charge injection bit line) EBL1 while the same voltage (−9 [V]) as the erasing bit voltage is applied also to the second well W2 via the second well wiring EPW. Thus, in each of the erasing transistors 24a and 24b in the memory unit 21a, the channel potential is −9 [V], which is the same as the erasing bit voltage.

As a result, in the memory unit 21a, voltage differences between the floating gates FGa and FGb, at which the voltages are 9 [V] set by the capacity transistors 3a and 3b, and the channel regions of the erasing transistors 24a and 24b are 18 [V], respectively. There are large voltage differences between the floating gates FGa and FGb and the channel regions of the erasing transistors 24a and 24b, respectively. Therefore, in the memory unit 21a, charge is injected into the floating gates FGa and FGb due to a tunneling effect, which is caused by the voltage differences (18 [V]) between the floating gates FGa and FGb and the erasing transistors 24a and 24b, respectively. Thus, the memory unit 21a enters a state where charge is stored in the floating gates FGa and FGb, so that data is erased.

In this case, 0 [V] is applied to the source line SL, and 0 [V] is applied to each of the read gate lines RGP1, RGN1, RGP2, and RGN2. All the switch transistors 5a and 5b in the memory units 21a, 21b, 21c, and 21d are turned off. In the memory units 21a, 21b, 21c, and 21d, the first bit lines BLP1 and BLP2 and the reading transistor 6a are electrically disconnected from each other, and the second bit lines BLN1 and BLN2 and the reading transistor 6b are electrically disconnected from each other.

In the present invention, the first deep well DW1 and the second deep well DW2 are electrically isolated from each other so that a voltage different from a voltage to be applied to the first deep well DW1 can be applied to the second deep well DW2. Thus, a voltage of 0 [V], which is different from the voltage of 9 [V] to be applied to the first deep well DW1, can be applied to the second deep well DW2.

Thus, in the regions in which the erasing transistors 24a and 24b are formed in the second well W2, −9 [V] serving as an erasing voltage is applied via the second well wiring EPW, so that a voltage difference from each of the floating gates FGa and FGb is set to a voltage difference (18 [V]), at which a tunneling effect occurs. A voltage difference between the second well W2 and the second deep well DW2 is reduced to 9 [V], which is smaller than the voltage difference at which a tunneling effect occurs. Thus, in the memory unit 21a, the voltage difference between the second deep well DW2 and the second well W2 is made smaller than the voltage difference at which a tunneling effect occurs, and accordingly a junction breakdown voltage required between the second deep well DW2 and the second well W2 is low.

In the memory unit 21c connected to the erasing bit line EBL1 to which an erasing voltage of −9 [V] is applied, an erasing inhibition voltage of 0 [V] is applied to the first well wiring WEG2. Thereby the voltage differences between the floating gates FGa and FGb and the channel regions in the erasing transistors 24a and 24b, respectively, are selected to be less than the voltage difference at which a tunneling effect occurs. Thus, the erasing transistors 24a and 24b in the memory unit 21c are maintained in a state where no charge is injected into the floating gates FGa and FGb from the channel regions, so that data is retained.

In the memory unit 21b connected to the first well wiring WEG1 to which an erasing voltage of 9 [V] is applied, an erasing inhibition bit voltage (erasing inhibition voltage) of 0 [V] is applied to the erasing bit line EBL2. Thereby, the voltage differences between the floating gates FGa and FGb and the channel regions in the erasing transistors 24a and 24b, respectively, are selected to be less than the voltage difference at which a tunneling effect occurs. Thus, the erasing transistors 24a and 24b in the memory unit 21b are maintained in a state where no charge is injected into the floating gates FGa and FGb from the channel regions, so that data is retained. Similarly, in the memory unit 21d, voltage differences between the floating gates FGa and FGb and the channel regions, respectively, are small. Thus, the memory unit 21d is maintained in a state where no charge is injected into the floating gates FG and FGb, so that data is retained.

Thus, in the non-volatile semiconductor memory device 29, the data is erased only in the memory unit 21a, among the memory units 21a, 21b, 21c, and 21d. As described above, in the non-volatile semiconductor memory device 29, when the data in the memory unit 21a is erased, each of the voltage difference between the first deep well DW1 and the first well W1 and the voltage difference between the second deep well DW2 and the second well W2 is made smaller than the voltage difference (18 [V]), at which a tunneling effect occurs, and accordingly the junction voltage between the first deep well DW1 and the first well W1 and the junction voltage between the second deep well DW2 and the second well W2 are low.

In the above described embodiment, the erasing bit line EBL1 is shared between the plurality of memory cells arranged in the other direction (e.g. the column direction), which is different from the one direction (e.g. the row direction), and another plurality of memory cells arranged in the other direction (e.g. the memory cells arranged in another column), so that a common voltage is applied via the erasing bit line EBL1 to the memory cells 22a and 22b that share the erasing bit line EBL1.

In the present invention, an example is described in which the erasing bit line EBL1 and the erasing bit line EBL2 are controlled separately from each other and the data is erased on an erasing bit line by erasing bit line basis. However, the present invention is not limited to this. For example, a method may be used in which the erasing bit line EBL1 and the erasing bit line EBL2 are integrated into one erasing bit line, and a common voltage is applied through the integrated erasing bit line to the memory units 21a and 21b in different columns, and data in the memory units 21a and 21b in different columns are erased simultaneously. More specifically, in this case, the erasing bit line is shared between the memory unit 21a disposed in the other direction (e.g. the column direction), which is different from the one direction (e.g. the row direction), and the memory unit 21b disposed in the other direction (e.g. disposed in another column), so that the common voltage is applied through the shared erasing bit line to the memory units 21a and 21b that share the erasing bit line. Thus, an erasing operation is performed simultaneously and collectively for the memory units 21a and 21b in different columns.

(2-4) Data Reading Operation

Figure 8:
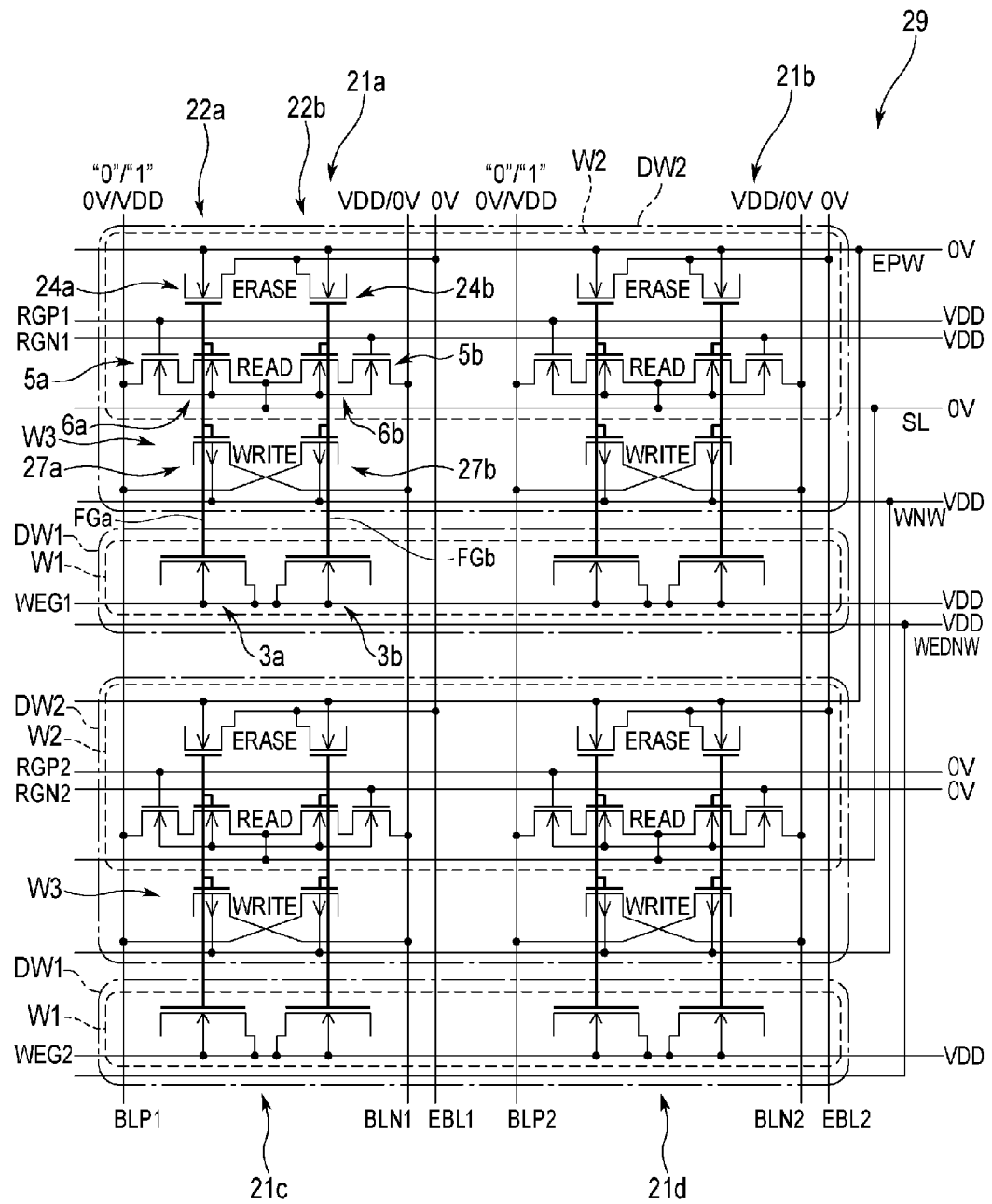
FIG. 8 is a schematic view illustrating voltage values at the respective sites during data reading.

FIG. 8, in which portions corresponding to those illustrated in FIG. 6 are assigned the same reference numerals, illustrates voltage values at respective sites in a case where data is read out from the memory units 21a and 21b, among the memory units 21a, 21b, 21c, and 21d. Description is made only with respect to the memory unit 21a, and description of the memory unit 21b is omitted to avoid redundancy.

In this case, in the memory unit 21a, the memory cell 22a is in a state where no charge has been stored in the floating gate FGa, that is, data has been programmed in the memory cell 22a. The memory cell 22b is in a state where charge has been stored in the floating gate FGb, that is, no data has been programmed in the memory cell 22b.

In this case, in the non-volatile semiconductor memory device 29, a power supply voltage VDD is applied as an ON-state voltage to the read gate lines RGP1 and RGN1, to turn on both the switch transistors 5a and 5b in the memory units 21a and 21b from which data is read out. In this case, 0 [V] is applied to the source line SL, and the power supply voltage VDD is applied as a reading voltage to the first bit lines BLP1 and BLP2 and the second bit lines BLN1 and BLN2.

In the memory cell 22a in which no charge is stored in the floating gate FGa, the reading transistor 6a is turned on when 0 [V] is applied to the source of the reading transistor 6a via the source line SL. Thereby, the reading transistor 6a and the first bit line BLP1 are electrically connected to each other. Thus, in the memory cell 22a, a voltage on the first bit line BLP1 becomes lower than the power supply voltage VDD.

On the other hand, in the memory cell 22b in which charge has been stored in the floating gate FGb, the reading transistor 6b is turned off when 0 [V] is applied to the source of the reading transistor 6b via the source line SL, and thereby the reading transistor 6b and the second bit line BLN1 are electrically disconnected from each other. Thus, a voltage on the second bit line BLN1 is maintained at the power supply voltage VDD.

Thus, in the non-volatile semiconductor memory device 29, the first bit line BLP1 is lower in potential than the second bit line BLN1. The potential difference between the first bit line BLP1 and the second bit line BLN1 is latched by a latch circuit (not illustrated). Thereby, the voltage of the first bit line BLP1 is maintained at 0 [V] while the voltage of the second bit line BLN1 is maintained at the power supply voltage VDD, so that the reading information is determined.

In the non-volatile semiconductor memory device 29 in the present embodiment, 0 [V] is applied to the erasing bit line EBL1, so that the charge in the floating gates FGa and FGb is prevented from being transferred by the erasing transistors 24a and 24b during data reading.

In the present embodiment, for example, the power supply voltage VDD is applied to the first well wiring WEG1, so that a potential at the floating gate FGa is raised due to capacitive coupling between the capacity transistor 3a, which is connected to the first well wiring WEG1, and the floating gate FGa. As a result, an ON-state current to be output from the reading transistor 6a is increased, so that a period of time for latching data is shortened.

In the present embodiment, the case where the power supply voltage VDD is applied to the first well wiring WEG1 has been described, for example. The present invention is not limited to this. If the ON-state current to be output from the reading transistor 6a can be ensured, 0 [V] may be applied to the first well wiring WEG1. In the memory units 21c and 21d from which data is not read out, an OFF-state voltage of 0 [V] is applied to the read gate lines RGP2 and RGN2, and the switch transistors 5a and 5b are turned off so that the data in the floating gates FGa and FGb are not read out. Thus, data is read out only from the memory units 21a and 21b.

(2-5) Operation and Effect

In the above described configuration, the non-volatile semiconductor memory device 29 is provided with the memory cells 22a and 22b, which comprise the capacity transistors 3a and 3b that adjust voltages at the floating gates FGa and FGb, the writing transistors (charge ejection transistors) 27a and 27b that remove charge from the floating gates FGa and FGb in response to voltage differences from the capacity transistors 3a and 3b, the erasing transistors (charge injection transistors) 24a and 24b that inject charge into the floating gates FGa and FGb in response to voltage differences from the capacity transistors 3a and 3b, and the reading transistors 6a and 6b for reading out voltages depending on the presence or absence of charge in the floating gates FGa and FGb, respectively. In the memory cells 22a and 22b, the floating gates FGa and FGb are shared among the capacity transistors 3a and 3b, the writing transistors 27a and 27b, the erasing transistors 24a and 24b, and the reading transistors 6a and 6b.

The memory cells 22a and 22b are provided with the first well W1 of the first conductivity type (P type) in which the capacity transistors 3a and 3b are formed, the second well W2 of the first conductivity type in which the erasing transistors 24a and 24b are formed, and the third well W3 of the second conductivity type (N type) in which the writing transistors 27a and 27b are formed. In the memory cells 22a and 22b, the first deep well DW1 and the second deep well DW2 are electrically isolated from each other, so that a voltage different from a voltage to be applied to the first deep well DW1 can be applied to the second deep well DW2. The first deep well DW1 is of the second conductivity type and surrounds the first well W1 to form a triple well structure in a region (formation region) in which the first well W1 is formed. The second deep well DW2 is of the same second conductivity type, and contacts the third well W3, and surrounds the second well W2 to form a triple well structure in a region (formation region) in which the second well W2 is formed.

Thus, in the non-volatile semiconductor memory device 29, voltages are applied to the first deep well DW1 and the second deep well DW2, respectively and separately from each other, to allow the capacity transistors 3a and 3b in the first well W1 and the writing transistors 27a and 27b in the third well W3 to operate. The voltages applied to the first deep well DW1 and the second deep well DW2 are not restricted by each other.

Therefore, in the non-volatile semiconductor memory device 29, in a case where the data writing operation is performed by the writing transistor 27a in the memory cell 22a, for example, a value of the voltage to be applied to the first deep well DW1 is separately selected, without being restricted by a value of the voltage to be applied to the second deep well DW2, which is required to remove charge from the floating gate FGa by a tunneling effect. Thus, by adjusting the value of the voltage to be applied to the first deep well DW1, the voltage difference between the first deep well DW1 and the first well W1 is made smaller than the voltage difference at which a tunneling effect occurs.

In the non-volatile semiconductor memory device 29, in a case where a data erasing operation is performed by the erasing transistors 24a and 24b in the memory cells 22a and 22b, for example, a value of the voltage to be applied to the first deep well DW1 is separately selected, without being restricted by a value of the voltage on the second deep well DW2, which is required to inject charge into the floating gates FGa and FGb by a tunneling effect. Thus, by adjusting the value of the voltage applied to the first deep well DW1, the voltage difference between the first deep well DW1 and the first well W1 is made smaller than the voltage difference at which a tunneling effect occurs.

Thus, in the non-volatile semiconductor memory device 29, the voltage difference between the first deep well DW1 and the first well W1 and the voltage difference between the second deep well DW2 and the second well W2 is made small in the memory unit 21a, and accordingly the junction voltage between the first deep well DW1 and the first well W1 and the junction voltage between the second deep well DW2 and the second well W2 are low. Thus, the non-volatile semiconductor memory device 29 can be embedded with a circuit element having a miniaturized circuit structure and having a low junction breakdown voltage.

In the non-volatile semiconductor memory device 29, the second bit line BLN1 used for writing in the memory cell 22a is also used for reading in the memory cell 22b, similar to the above described first embodiment. Thus, as a whole, the number of bit lines is the same as the number of cells, and the effective number of bit lines is one per cell. Therefore, the entire non-volatile semiconductor memory device 29 is miniaturized.

(2-6) Another Embodiment

In the above described second embodiment, the memory unit 21a has been described with reference to FIG. 5. In the memory unit 21, the second bit line BLN1, which is used for writing in the memory cell 22a, is also used as a reading bit line (a bit line used for reading) in the memory cell 22b. The first bit line BLP1 used for writing in the memory cell 22b is also used as a reading bit line in the memory cell 22a.

Figure 9:
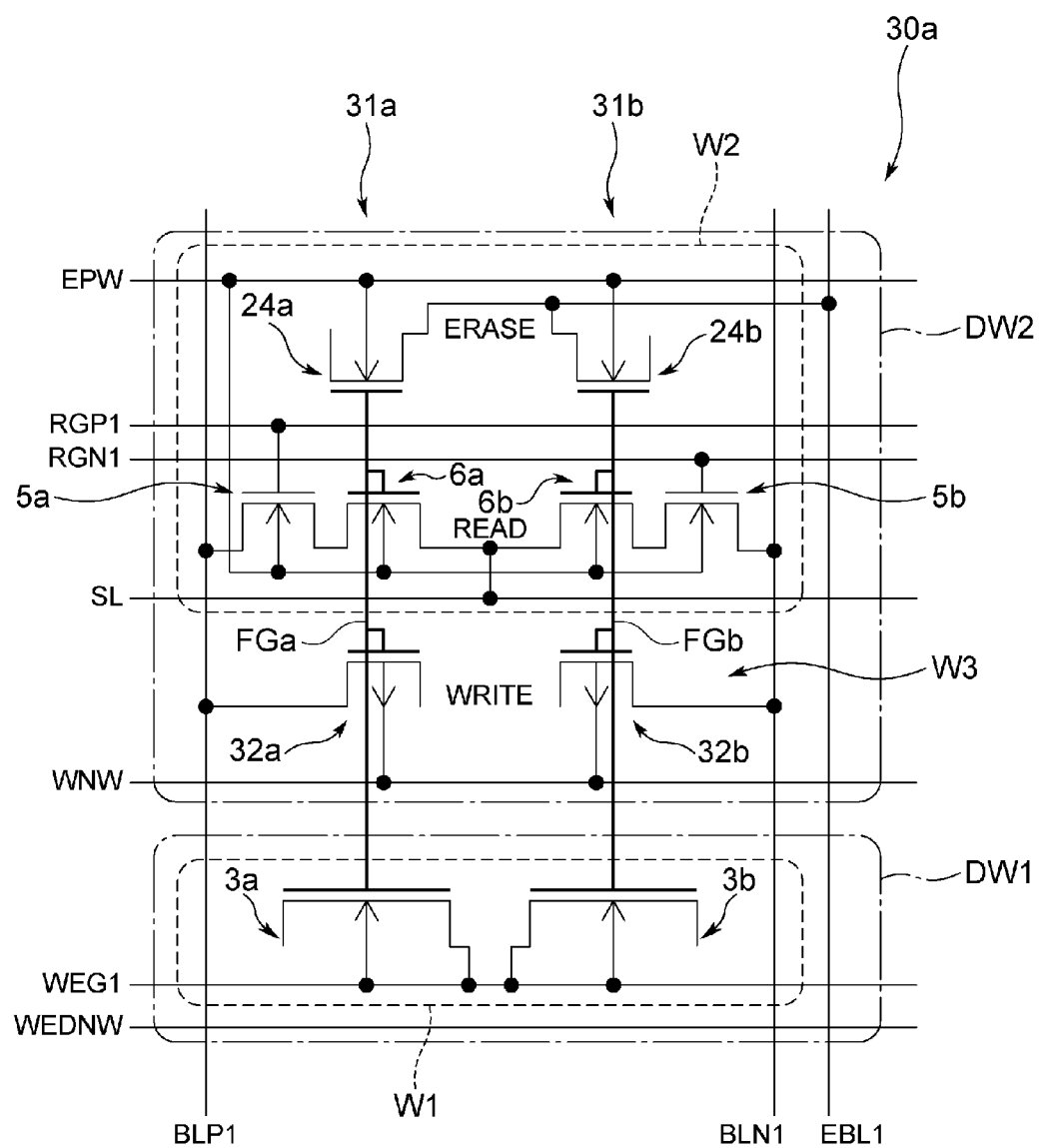
FIG. 9 is a schematic view illustrating a circuit configuration (1) of another memory unit according to a second embodiment.

However, the present invention is not limited to this. For example, a memory unit 30a may be used as illustrated in FIG. 9, in which portions corresponding to those illustrated in FIG. 5 are assigned the same reference numerals. In the memory unit 30a, a first bit line BLP1 is used for writing and reading in a memory cell 31a and a second bit line BLN1 is used for writing and reading in a memory cell 31b.

In this case, as illustrated in FIG. 9, a pair of the memory cell 31a and the memory cell 31b in the memory unit 30a in a non-volatile semiconductor memory device constitute one bit. Similar to the above-described memory unit 21a, the memory unit 30a has capacity transistors 3a and 3b formed in the first well W1 surrounded by the first deep well DW1, and has the second well W2 and the third well W3 formed in the second deep well DW2 electrically isolated from the first deep well DW1. Erasing transistors 24a and 24b, reading transistors 6a and 6b, and switch transistors 5a and 5b are formed in the second well W2. Writing transistors 32a and 32b are formed in the third well W3.

A diffusion layer at one end of the writing transistor 32a and a diffusion layer at one end of the switch transistor 5a are connected to the first bit line BLP1. Thus, a predetermined voltage is applied from the first bit line BLP1 to the writing transistor 32a and the switch transistor 5a. A diffusion layer at one end of the writing transistor 32b and a diffusion layer at one end of the switch transistor 5b are connected to the second bit line BLN1. Thus, a predetermined voltage is applied from the second bit line BLN1 to the writing transistor 32b and the switch transistor 5b.

In the memory unit 30a having the above-described configuration, in a case where a data writing operation is performed by the writing transistor 32a in the memory cell 31a, for example, a value of the voltage to be applied to the first deep well DW1 can be separately selected, without being restricted by a value of the voltage on the second deep well DW2, which is required to remove charge from a floating gate FGa by a tunneling effect. Thus, by adjusting the value of the voltage applied to the first deep well DW1, a voltage difference between the first deep well DW1 and the first well W1 is made smaller than a voltage difference at which a tunneling effect occurs.

In the memory unit 30a, in a case where a data erasing operation is performed in the memory cells 31a and 31b, for example, a value of the voltage to be applied to the first deep well DW1 is separately selected, without being restricted by a value of the voltage on the second deep well DW2, which is required to inject charge into the floating gates FGa and FGb by a tunneling effect in the erasing transistors 24a and 24b. Thus, by adjusting the value of the voltage applied to the first deep well DW1, the voltage difference between the first deep well DW1 and the first well W1 is made smaller than the voltage difference at which a tunneling occurs.

Thus, in the non-volatile semiconductor memory device, the voltage difference between the first deep well DW1 and the first well W1 and a voltage difference between the second deep well DW2 and the second well W2 are made small in the memory unit 30a, and accordingly a junction voltage between the first deep well DW1 and the first well W1 and a junction voltage between the second deep well DW2 and the second well W2 are low. Thus, the non-volatile semiconductor memory device can be embedded with a circuit element having a miniaturized circuit structure and having a low junction breakdown voltage.

In the above described second embodiment, a case is described where the present invention is applied to the non-volatile semiconductor memory device comprising the memory units 21a, 21b, 21c, and 21d (or 30a) each including the pair of the memory cells 22a and 22b (or 31a and 31b). The present invention is not limited to this. The present invention may be applied to a non-volatile semiconductor memory device comprising a single memory cell and a non-volatile semiconductor memory device comprising single memory cells arranged in a matrix.

Figure 10:
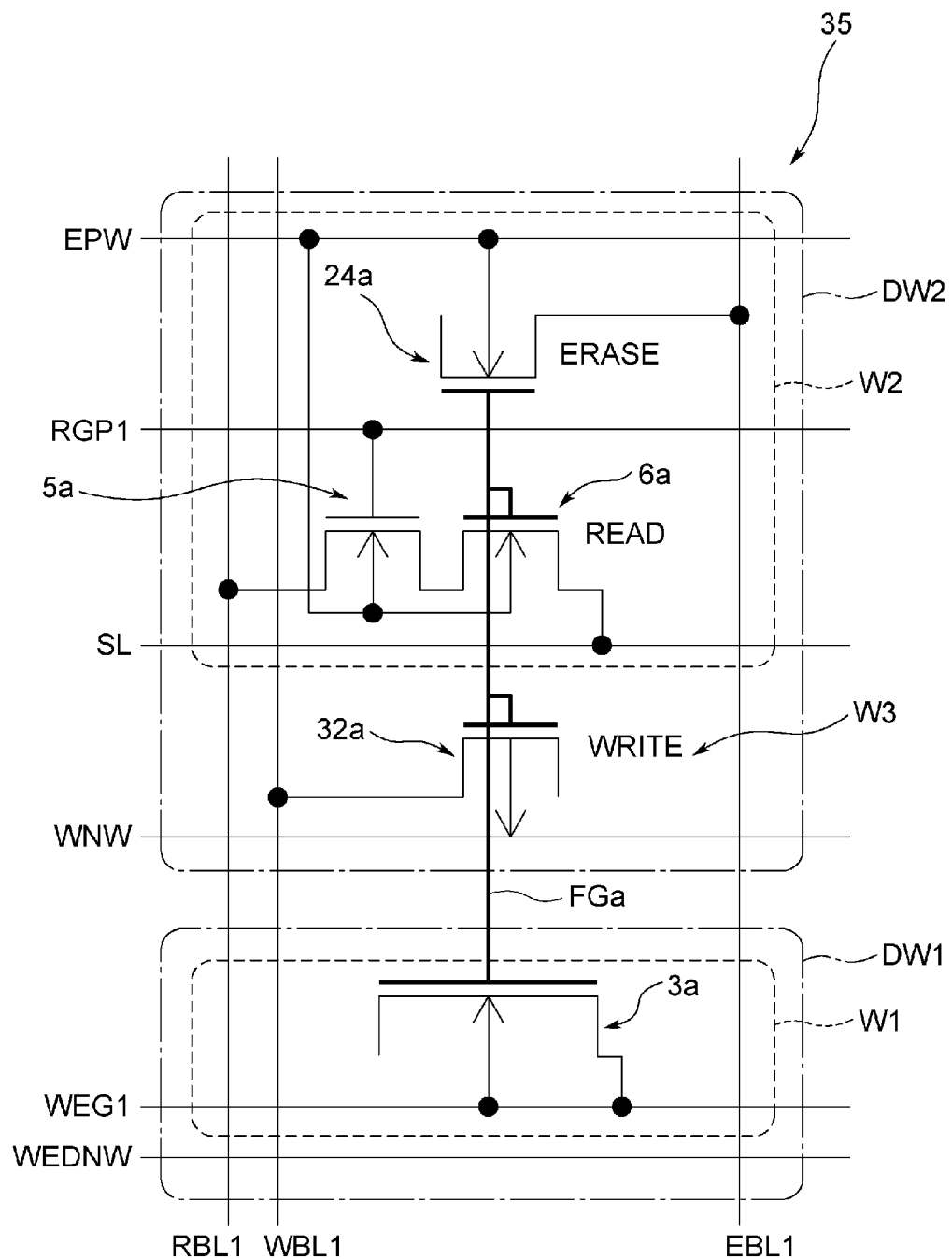
FIG. 10 is a schematic view illustrating a circuit configuration of another memory cell according to the second embodiment.

Furthermore, FIG. 10, in which portions corresponding to those illustrated in FIG. 9 are assigned the same reference numerals, illustrates a single memory cell 35 constituting one bit, for example. In this case, the memory cell 35 differs from the memory cells illustrated in FIG. 9 in that a diffusion layer at one end of a switch transistor 5a is connected to a reading bit line RBL1 while a diffusion layer at one end of a writing transistor 32a is connected to a writing bit line (charge ejection bit line) WBL1 provided separately from the reading bit line RBL1.

In a case where the one first bit line BLP1 (the second bit line BLN1) serves both as a writing bit line (charge ejection bit line) and as a reading bit line, similar to the case of the memory cells 31a and 31b illustrated in FIG. 9, a voltage required for writing, e.g. a voltage of 9 [V] is also applied to a reading control circuit (control circuit for reading), which leads to the first switch transistor 5a and the first bit line BLP1, for example, and the reading control circuit needs to be composed of a high-voltage transistor.

However, in the memory cell 35 illustrated in FIG. 10, the writing bit line WBL1 and the reading bit line RBL1 are separately provided, so that a voltage required for writing, e.g. a voltage of 9 [V] is not applied to the reading control circuit, which leads to the reading bit line RBL1. Thus, the reading control circuit may operate at a power supply voltage VDD, for example, and a gate insulating film may be composed of a transistor having a much smaller thickness, e.g. 4 [nm] or less. Thus, in the memory cell 35, the reading control circuit is small in size, and high-speed reading is performed.

Figure 11:
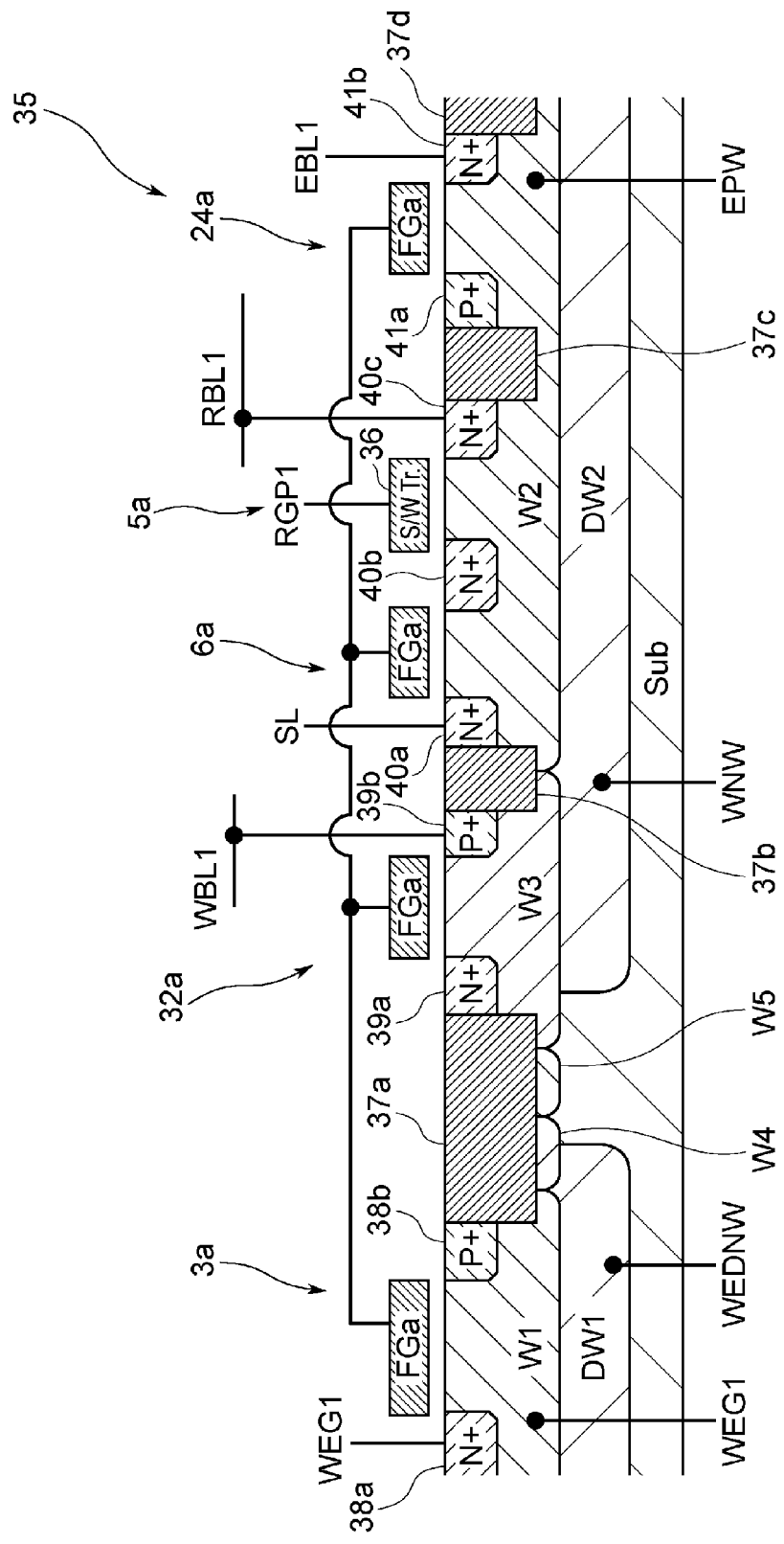
FIG. 11 is a schematic view illustrating a side sectional configuration of the memory cell illustrated in FIG. 10.

(2-7) Cross-Sectional Configuration of Memory Cell According to Another Embodiment FIG. 11 is a schematic view illustrating a cross-sectional configuration of the memory cell 35 illustrated in FIG. 10. A triple well structure formed in the memory cell 35 will be described below with reference to FIG. 11. The memory cell 35 is formed on a P-type semiconductor substrate Sub with a first deep well DW1 of an N type and a second deep well DW2 of the N type electrically isolated from each other, for example. In this case, in the memory cell 35, the semiconductor substrate Sub is also formed between the first deep well DW1 and the second deep well DW2. The first deep well DW1 and the second deep well DW2 are electrically isolated from each other via the semiconductor substrate Sub.

In the memory cell 35, a P-type first well W1 is formed on a surface of the first deep well DW1, and a triple well structure, in which the P-type semiconductor substrate Sub, the N-type first deep well DW1, and the P-type first well W1 are stacked in this order, is formed in a region (formation region) in which the first well W1 is formed. An N-type diffusion layer and a P-type diffusion layer are formed with predetermined spacing in the surface of the first well W1, and a first well wiring WEG1 is connected to a diffusion layer 38a at an end of the first well W1. In the first well W1, a floating gate FGa is disposed through a gate insulating film over the surface of the first well W1, between the diffusion layer 38a at the one end and a diffusion layer 38b at the other end. Between the diffusion layers 38a and 38b, a capacity transistor 3a having a channel region is formed.

In the first well, an element isolation layer 37a is formed adjacent to the diffusion layer 38b. An end of the first well W1, an N-type first separation well W4, a P-type second separation well W5, and an end of the N-type third well W3 are disposed on an undersurface of the element isolation layer 37a. An end of the first deep well DW1 is disposed on an undersurface of the first separation well W4. Thus, the P-type first well W1 is surrounded by the N-type first separation well W4 and the N-type first deep well DW1, which have the polarity different from the P-type first well W1.

Furthermore, in the memory cell 35, the second well W2 and the third well W3 are formed on a surface of the second deep well DW2. The P-type semiconductor substrate Sub, the N-type second deep well DW2, and the P-type second well W2 stacked in this order constitute a triple well structure in a region (formation region) in which the second well W2 is formed. In the second well D2, element isolation layers 37b, 37c, and 37d are formed with predetermined spacing. A reading transistor 6a and a switch transistor 5a are formed between the element isolation layers 37b and 37c. An erasing transistor 24a is formed between the element isolation layers 37c and 37d.

A P-type diffusion layer 41a and an N-type diffusion layer 41b, to which an erasing bit line EBL1 is connected, are formed between the element isolation layers 37c and 37d. A floating gate FGa is disposed between the diffusion layers 41a and 41b via a gate insulating film. Thus, an erasing transistor 24a having a channel region between the diffusion layers 41a and 41b is formed in the second well W2. On the other hand, a diffusion layer 40a of an N type, to which a source line SL is connected, a diffusion layer 40b of the N-type, and a diffusion layer 40c of the N-type, to which the reading bit line RBL1 is connected, are formed between the element isolation layers 37b and 37c.

Between the diffusion layers 40a and 40b in the second well W2, a floating gate FGa is disposed through a gate insulating film. Thus, a reading transistor 6a having a channel region between the diffusion layers 40a and 40b is formed. Between the diffusion layers 40b and 40c in the second well W2, a switch gate electrode 36 is disposed through a gate insulating film. Thus, a switch transistor 5a having a channel region between the diffusion layers 40b and 40c is formed. A switch gate line RGP1 is connected to the switch gate electrode 36.

The N-type third well W3 is adjacent to the second well W2. The element isolation layer 37b is disposed between the second well W2 and the third well W3. An end of a surface of the N-type second deep well DW2 having the same polarity as the third well W3 is in contact with the third well W3, so that a voltage applied to the second deep well DW2 is transmitted to the third well W3. Between the element isolation layers 37a and 37b, an N-type diffusion layer 39a and a P-type diffusion layer 39b, to which a writing bit line WBL1 is connected, are formed with predetermined spacing in the third well W3. A floating gate FGa is disposed over the surface of the third well W3 through a gate insulating film, between the diffusion layers 39a and 39b. Thus a writing transistor 32a having a channel region between the diffusion layers 39a and 39b is formed.

In the present embodiment, the third well W3 is adjacent to the P-type second separation well W5, which is formed on the undersurface of the element isolation layer 37a adjacent to the third well W3, so that the third well W3 is electrically isolated from the N-type first separation well W4 having the same polarity as the third well W3.

As described above, in the memory cell 35, the first deep well DW1 and the second deep well DW2 are electrically isolated from each other via the semiconductor substrate Sub and the second separation well W5, so that a predetermined voltage is applied to the first deep well DW1 without being restricted by a voltage applied to the second deep well DW2. Hence, in the memory cell 35, a voltage difference between the first deep well DW1 and the first well W1 and a voltage difference between the second deep well DW2 and the second well W2 are made small, and accordingly a junction voltage between the first deep well DW1 and the first well W1 and a junction voltage between the second deep well DW2 and the second well W2 are low. Thus, the non-volatile semiconductor memory device can be embedded with a circuit element having a miniaturized circuit structure and having a low junction breakdown voltage.

Figure 12:
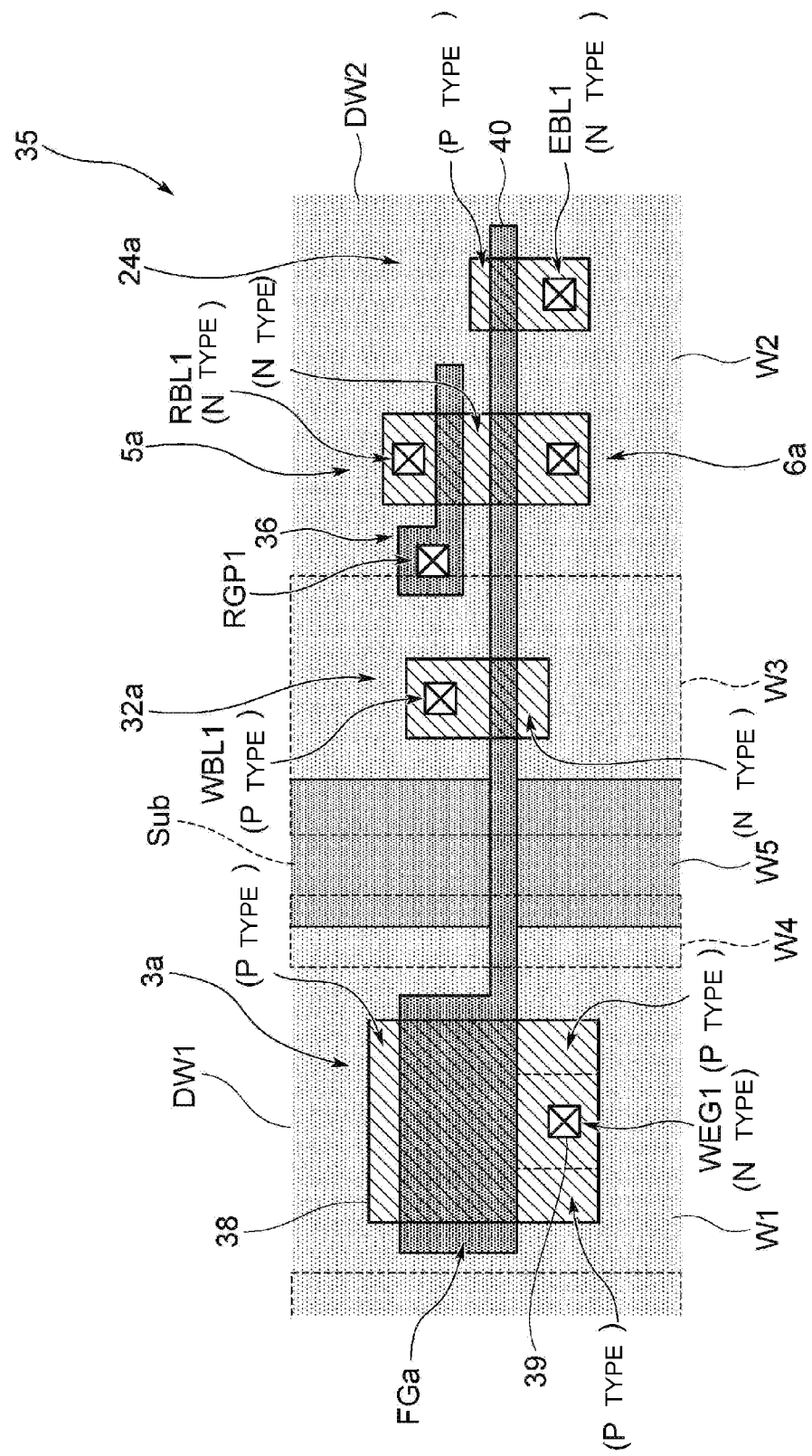
FIG. 12 is a schematic view illustrating a layout pattern of the memory cell illustrated in FIG. 10.

FIG. 12 is a schematic view illustrating a layout pattern of the memory cell 35 illustrated in FIGS. 10 and 11. In FIG. 12, power feeding sites which feed power to the first deep well DW1, the second deep well DW2, the first well W1, and the second well W2 are not illustrated. In FIG. 12, a region surrounded by a dotted line indicates an N-type well region, i.e. the N-type first separation well W4 and the N-type third well W3 in this case. In the memory cell 35, the semiconductor substrate Sub is disposed between the first deep well DW1 and the second deep well DW2. The floating gate FGa extends over regions of the first deep well DW1, the semiconductor substrate Sub, and the second deep well DW2.

A shaded region indicated by a reference numeral 38 denotes a diffusion layer. A region indicated by a reference numeral 39 denotes a contact. A reference numeral 40 denotes polycrystalline silicon (polysilicon). The switch gate electrode 36 extends along spacing from the floating gate FGa in the second well W2. The switch transistor 5a and the reading transistor 6a are connected in series. In the memory cell 35, both sides (ends) of an N-type diffusion layer to which the first well wiring WEG1 is connected are of a P type so that punch-through resistance to the opposite N-type well is improved and a distance from the N-type well is reduced.

In the above-described embodiment, as illustrated in FIG. 11, the first separation well W4 and the second separation well W5 having the different polarities are provided on the undersurface of the element isolation layer 37a, and the first deep well DW1 and the second deep well DW2 having the same polarity are electrically isolated from each other. The present invention is not limited to this. The first separation well W4 and the second separation well W5 may not be provided, and the first deep well DW1 and the second deep well DW2 may be electrically isolated from each other only via the semiconductor substrate Sub. In the above-described first embodiment, the first separation well W4 and the second separation well W5 having the different polarities may be provided on the undersurface of the element isolation layer 37a, and the first deep well DW1 and the second deep well DW2 having the same polarity may be electrically isolated from each other.

(3) Non-Volatile Semiconductor Memory Device According to Third Embodiment

Figure 13:
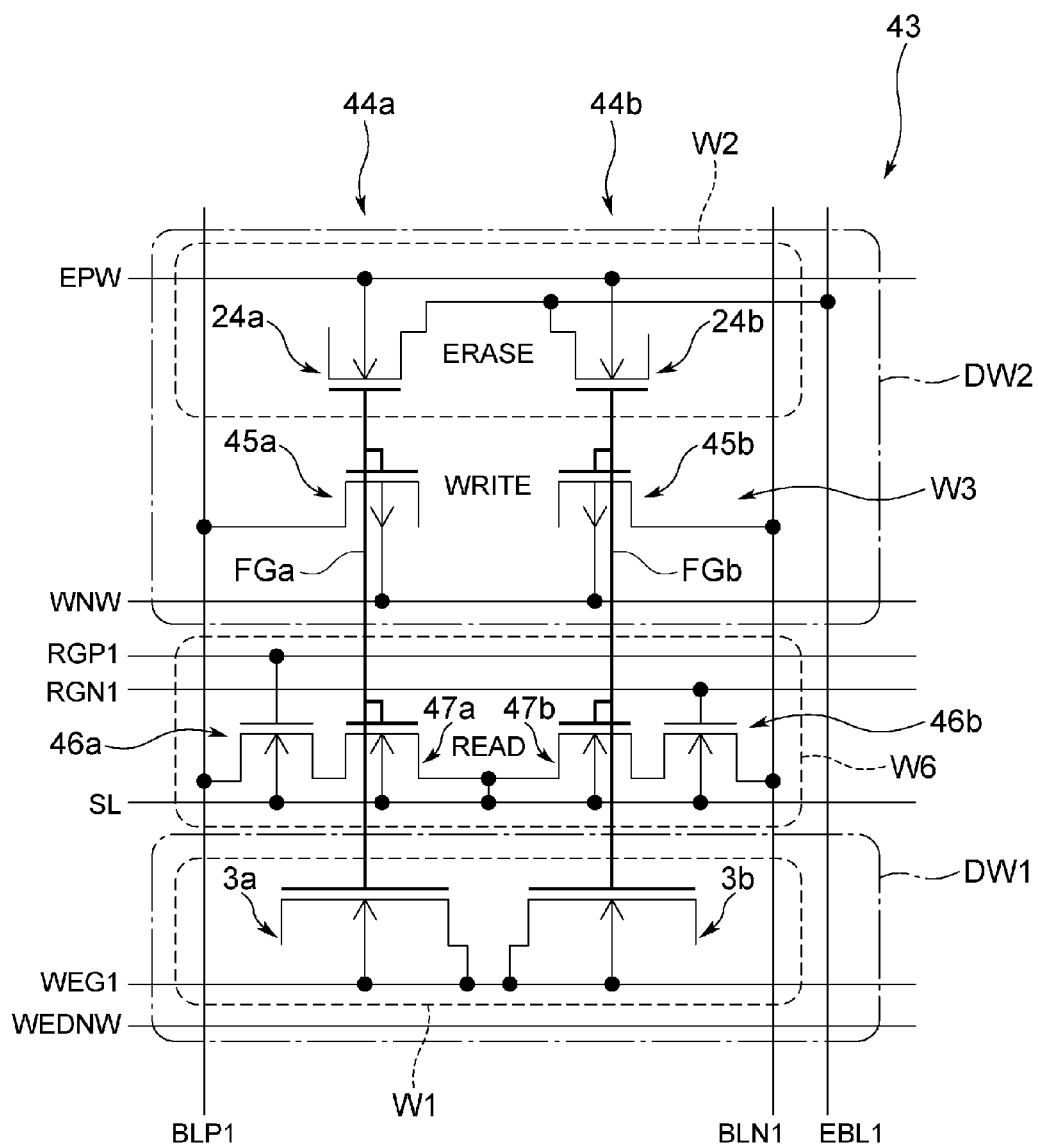
FIG. 13 is a schematic view illustrating a circuit configuration (2) of the other memory unit according to the second embodiment.

In FIG. 13, in which portions corresponding to those illustrated in FIG. 5 are assigned the same reference numerals, a reference numeral 43 denotes a memory unit according to a third embodiment provided in a non-volatile semiconductor memory device according to the present invention. The third embodiment differs from the above described second embodiment in that switch transistors 46a and 46b and reading transistors 47a and 47b are not formed in a region of a second deep well DW2. The switch transistors 46a and 46b and the reading transistors 47a and 47b are formed in a reading transistor formation well W6 formed between a first deep well DW1 and the second deep well DW2.

In this memory unit 43 comprising a memory cell 44a and a memory cell 44b, the first deep well DW1 and the second deep well DW2 are electrically isolated from each other, and voltages required for operations of capacity transistors 3a and 3b in a first well W1, writing transistors 45a and 45b in a third well W3, and erasing transistors 24a and 24b in a second well W2 are applied separately to the first deep well DW1 and the second deep well DW2, without being restricted by the voltages applied to the first deep well DW1 and the second deep well DW2.

Therefore, also in this case, a voltage difference between the first deep well DW1 and the first well W1 and a voltage difference between the second deep well DW2 and the second well W2 are made small, and accordingly a junction voltage between the first deep well DW1 and the first well W1 and a junction voltage between the second deep well DW2 and the second well W2 are low, similar to the above described second embodiment. Thus, a non-volatile semiconductor memory device is achieved which can be embedded with a circuit element having a miniaturized circuit structure and having a low junction breakdown voltage. Although a voltage application condition during writing in the present embodiment is the same as that in the second embodiment, a high voltage for rewriting is not applied to the reading transistor formation well W6, which comprises the reading transistors 47a and 47b and the switch transistors 46a and 46b. Thus, a transistor is prevented from deterioration due to a high-voltage stress.

(4) Non-Volatile Semiconductor Memory Device According to Fourth Embodiment

Figure 14:
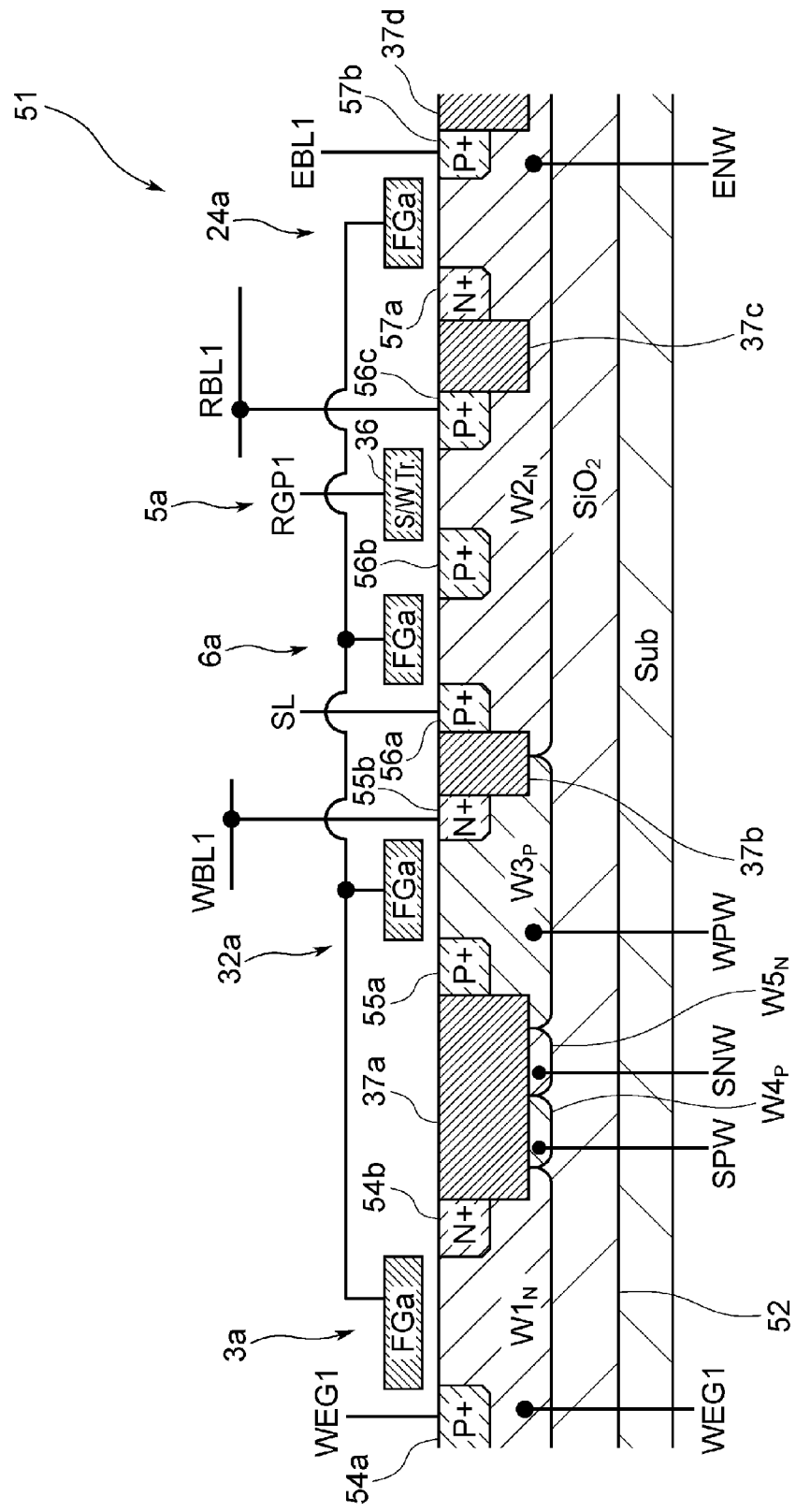
FIG. 14 is a schematic view illustrating a side sectional configuration of a memory cell according to another embodiment.

In the above-described first to third embodiments, the memory cells 2a, 2b, 14a, 14b, 22a, 22b, 31a, 31b, 35, 44a, and 44b have been described in which the first deep well DW1 and the second deep well DW2 are electrically isolated from each other. The first deep well DW1 has a triple well structure in a region (formation region) in which the first well W1 is formed, and the second deep well DW2 has a triple well structure in a region (formation region) in which the second well W2 is formed. The present invention is not limited to this. As illustrated in FIG. 14, in which portions corresponding to those illustrated in FIG. 11 are assigned the same reference numerals, a non-volatile semiconductor memory device which can be embedded with a circuit element having a miniaturized circuit configuration and having a low junction breakdown voltage is achieved by using a memory cell 51 not having a triple well structure and by providing a first separation well $W4_P$ and a second separation well $W5_N$ between a first well $W1_N$ and a third well $W3_P$. A voltage difference between the first well $W1_N$ and the first separation well $W4_P$ and a voltage difference between the second separation well $W5_N$ and the third well $W3_P$ are made small, and accordingly a junction voltage between the first well $W1_N$ and the first separation well $W4_P$ and a junction voltage between the second separation well $W5_N$ and the third well $W3_P$ are low.

Unlike FIGS. 1 to 13 described above, in the memory cell 51 illustrated in FIG. 14, the polarities of a first conductivity type and a second conductivity type are reversed, so that the first conductivity type is an N type and the second conductivity type is a P type. In this case, the memory cell 51 has a P-type semiconductor substrate Sub, for example, and has an insulating layer 52 composed of $SiO_2$ provided on the semiconductor substrate Sub. The N-type first well $W1_N$ and a second well $W2_N$ are formed on the insulating layer 52. The P-type third well $W3_P$, which has an opposite polarity to that of the first well $W1_N$ and the second well $W2_N$, is formed between the first well $W1_N$ and the second well $W2_N$. The first well $W1_N$ and the third well $W3_P$ are separated from each other by an element isolation layer 37a disposed between the first well $W1_N$ and the third well $W3_P$. A capacity transistor 3a is formed in the first well $W1_N$ and a writing transistor 32a is formed in the third well $W3_P$.

In addition to such a configuration, an end of the first well $W1_N$, the P-type first separation well $W4_P$, the N-type second separation well $W5_N$, and an end of the third well $W3_P$ are arranged in this order on an undersurface of the element isolation layer 37a between the first well $W1_N$ and the third well $W3_P$. In the fourth embodiment, the first separation well $W4_P$ and the second separation well $W5_N$ are formed between the first well $W1_N$ and the third well $W3_P$, so that the wells having different polarities, i.e. the N-type first well $W1_N$, the P-type first separation well $W4_P$, the N-type second separation well $W5_N$, and the P-type third well $W3_P$ are arranged in this order. Owing to the above-described feature of the memory cell 51, predetermined voltages are separately applied to the first well $W1_N$, the first separation well $W4_P$, the second separation well $W5_N$, and the third well $W3_P$, respectively.

In the surface of the N-type first well $W1_N$, a P-type diffusion layer 54a and an N-type diffusion layer 54b are formed. Between the diffusion layers 54a and 54b, a floating gate FGa is disposed through a gate insulating film. The P-type MOS capacity transistor 3a has a channel region formed between the diffusion layers 54a and 54b. In the capacity transistor 3a, a first well wiring WEG1 is connected to the diffusion layer 54a. The first well wiring WEG1 is connected also to the first well $W1_N$, in which the channel region is formed. Thereby the same voltage is applied to the diffusion layer 54a and to the first well $W1_N$.

On the other hand, in the surface of the P-type third well $W3_P$, a P-type diffusion layer 55a and an N-type diffusion layer 55b are formed. Between the diffusion layers 55a and 55b, a floating gate FGa is disposed through a gate insulating film. The N-type MOS writing transistor 32a has a channel region formed between the diffusion layers 55a and 55b. In the writing transistor 32a, a writing bit line WBL1 is connected to the diffusion layer 55b, and a third well wiring WPW is connected to the third well $W3_P$, in which a channel region is formed. Thereby, a predetermined voltage is applied to the diffusion layer 55b via the writing bit line WBL1, and a predetermined voltage is applied to the third well $W3_P$ via the third well wiring WPW.

In the N-type MOS writing transistor 32a, for example, in a case where data is written by injecting charge into the floating gate FGa from the channel region due to a tunneling effect, a positive voltage of 9 [V] is applied to the diffusion layer 54a and to the first well $W1_N$ via the first well wiring WEG1 in the P-type MOS capacity transistor 3a. Thus, in the capacity transistor 3a, a voltage at the floating gate FGa is raised due to capacitive coupling between the gate insulating film and the floating gate FGa, which occurred over the channel region.

On the other hand, in the writing transistor 32a, a writing bit voltage of −9 [V] is applied to the diffusion layer 55b via the writing bit line WBL1 while a voltage of −9 [V] is applied to the third well $W3_P$ via the third well wiring WPW, so that a channel potential is −9 [V]. As a result, in the memory cell 51, a voltage difference between the floating gate FGa, at which the voltage is raised by the capacity transistor 3a, and the channel region of the writing transistor 32a is 18 [V], so that a large voltage difference occurs between the floating gate FGa and the channel region of the writing transistor 32a.

Thus, in the memory cell 51, charge is injected into the floating gate FGa from the channel region (the third well $W3_P$) of the writing transistor 32a due to a tunneling effect caused by the voltage difference (18 [V]) between the floating gate FGa and the writing transistor 32a. As a result, charge is stored in the floating gate FGa and thus the data is programmed in the memory cell 51.

In the fourth embodiment, the first separation well $W4_P$ and the second separation well $W5_N$ are electrically isolated from the first well $W1_N$ and the third well $W3_P$, so that voltage(s) different from the voltages to be applied to the first well $W1_N$ and the third well $W3_P$ can be applied to the first separation well $W4_P$ and the second separation well $W5_N$. In the present embodiment, in a case where data is programmed into the memory cell 51, for example, a voltage of 0 [V], which is in the middle between the voltage of 9 [V] applied to the first well $W1_N$ and the voltage of −9 [V] applied to the third well $W3_P$, is applied to the first separation well $W4_P$ via a first separation well wiring SPW and to the second separation well $W5_N$ via a second separation well wiring SNW.

As described above, in the memory cell 51, 0 [V] is applied to the first separation well $W4_P$ adjacent to the first well $W1_N$, to which 9 [V] is applied. Thereby, the voltage difference between the first well $W1_N$ and the first separation well $W4_P$ is set lower than the voltage difference (18 [V] in this case) at which a tunneling effect occurs, and accordingly the junction voltage between the first well $W1_N$ and the first separation well $W4_P$ is low. In the memory cell 51, 0 [V] is applied also to the second separation well $W5_N$ adjacent to the third well $W3_P$ to which −9 [V] is applied. The voltage difference between the third well $W3_P$ and the second separation well $W5_N$ is also set lower than the voltage difference (18 [V] in this case) at which a tunneling effect occurs, and accordingly the junction voltage between the third well $W3_P$ and the second separation well $W5_N$ is low.

Between the diffusion layers 57a and 57b disposed between the element isolation layers 37c and 37d formed in the second well $W2_N$, a floating gate FGa is disposed through a gate insulating film. Thus a P-type MOS erasing transistor 24a having a channel region between the diffusion layers 57a and 57b is formed. Between the element isolation layers 37b and 37c formed in the second well $W2_N$, diffusion layers 56a, 56b, and 56c are formed. Between the diffusion layers 56a and 56b, a floating gate FGa is disposed through a gate insulating film. Thus a P-type MOS reading transistor 6a having a channel region between the diffusion layers 56a and 56b is formed. Further, between the diffusion layers 56b and 56c, a switch gate electrode 36 is disposed through a gate insulating film over the second well $W2_N$. Thus a P-type MOS switch transistor 5a having a channel region between the diffusion layers 56b and 56c is formed.

In the case where charge is injected into the floating gate FGa in the writing transistor 32a, a voltage of 0 [V], for example, is applied to the second well $W2_N$ via the second well wiring ENW. In the erasing transistor 24a, a voltage of 0 [V] is applied to the diffusion layer 57b via an erasing bit line EBL1. As a result, a voltage difference between the channel region and the floating gate FGa is small. A tunneling effect does not occur in such a region, so that no charge is injected into the floating gate FGa.

In the reading transistor 6a, a voltage of 0 [V] is applied to the diffusion layer 56a via a source line SL, so that a voltage difference between the channel region and the floating gate FGa is small. A tunneling effect does not occur in such a region, so that no charge is injected into the floating gate FGa. The fourth embodiment is similar to the above-described second embodiment in that the switch transistor 5a is turned off by applying 0 [V] to a reading bit line RBL1 and to a switch gate line RGP1.

In the above-described configuration, the non-volatile semiconductor memory device comprises the memory cell 51. The memory cell 51 comprises the capacity transistor 3a configured to adjust a voltage at the floating gate FGa, the writing transistor (charge injection transistor) 32a configured to inject charge into the floating gate FGa in response to a voltage difference from the capacity transistor 3a, the erasing transistor (charge ejection transistor) 24a configured to remove charge from the floating gate FGa in response to a voltage difference from the capacity transistor 3a, and the reading transistor 6a configured to read out a voltage depending on the presence or absence of charge in the floating gate FGa. The floating gate FGa is shared among the capacity transistor 3a, the writing transistor 32a, the erasing transistor 24a, and the reading transistor 6a.

The memory cell 51 comprises the first well $W1_N$ of the first conductivity type (N type), in which the capacity transistor 3a is formed, the second well $W2_N$ of the first conductivity type, in which the erasing transistor 24a is formed, and the third well $W3_P$ of the second conductivity type (P type), in which the writing transistor 32a is formed. Further, in the memory cell 51, the P-type first separation well $W4_P$ is formed adjacent to the first well $W1_N$. The P-type first separation well $W4_P$ has the polarity different from that of the first well $W1_N$, in which the capacity transistor 3a is formed. The third well $W3_P$, in which the writing transistor 32a is formed, and the first separation well $W4_P$ are electrically isolated from each other by an N-type second separation well $W5_N$ having the polarity different from that of the third well $W3_P$ and that of the first separation well $W4_P$.

More specifically, the second separation well $W5_N$ is formed adjacent to the third well $W3_P$ and the first separation well $W4_P$. The first well $W1_N$, the first separation well $W4_P$, the second separation well $W5_N$, and the third well $W3_P$ are arranged in this order, so that the third well $W3_P$ and the first separation well $W4_P$ are electrically isolated from each other by the second separation well $W5_N$.

Thus, in the non-volatile semiconductor memory device, the first well $W1_N$, the first separation well $W4_P$, the second separation well $W5_N$, and the third well $W3_P$ are electrically isolated from one another, so that voltage(s) different from the voltage(s) to be applied to the first well $W1_N$ and the third well $W3_P$ is applied to the first separation well $W4_P$ and the second separation well $W5_N$. Thus, in the non-volatile semiconductor memory device, a voltage difference between the first well $W1_N$ and the third well $W3_P$ causes a tunneling effect. However, by selecting the voltages to be applied to the first separation well $W4_P$ and the second separation well $W5_N$, each of the voltage difference between the first well $W1_N$ and the first separation well $W4_P$ and the voltage difference between the second separation well $W5_N$ and the third well $W3_P$ is made smaller than the voltage difference at which a tunneling effect occurs. Thus, the non-volatile semiconductor memory device can be embedded with a circuit element having a miniaturized circuit structure and having a low junction breakdown voltage because the voltage difference between the first well $W1_N$ and the first separation well $W4_P$ and the voltage difference between the second separation well $W5_N$ and the third well $W3_P$ are made small, and accordingly a junction breakdown voltage between the first well $W1_N$ and the first separation well $W4_P$ and a junction breakdown voltage between the second separation well $W5_N$ and the third well $W3_P$ are low.

Although the memory cell 51, in which the writing transistor 32a is formed in the third well $W3_P$ and the erasing transistor 24a is formed in the second well $W2_N$, has been described in the above described fourth embodiment, the present invention is not limited to this. A memory cell in which an erasing transistor is formed in a third well $W3_P$ and a writing transistor is formed in a second well $W2_N$ may be used, as in the above described first embodiment. In this memory cell, a voltage difference, such as that between a first well $W1_N$ and a first separation well $W4_P$ and that between a second separation well $W5_N$ and a third well $W3_P$, is made smaller than a voltage difference at which a tunneling effect occurs, and accordingly a junction breakdown voltage required between the first well $W1_N$ and the first separation well $W4_P$ and a junction breakdown voltage required between the second separation well $W5_N$ and the third well $W3_P$ are low during a data writing operation and during a data erasing operation, as in the foregoing. Therefore, a non-volatile semiconductor memory device comprising the memory cell can be embedded with a circuit element having a miniaturized circuit structure and having a low junction breakdown voltage.

(5) Non-Volatile Semiconductor Memory Device Comprising SRAM

Figure 15:
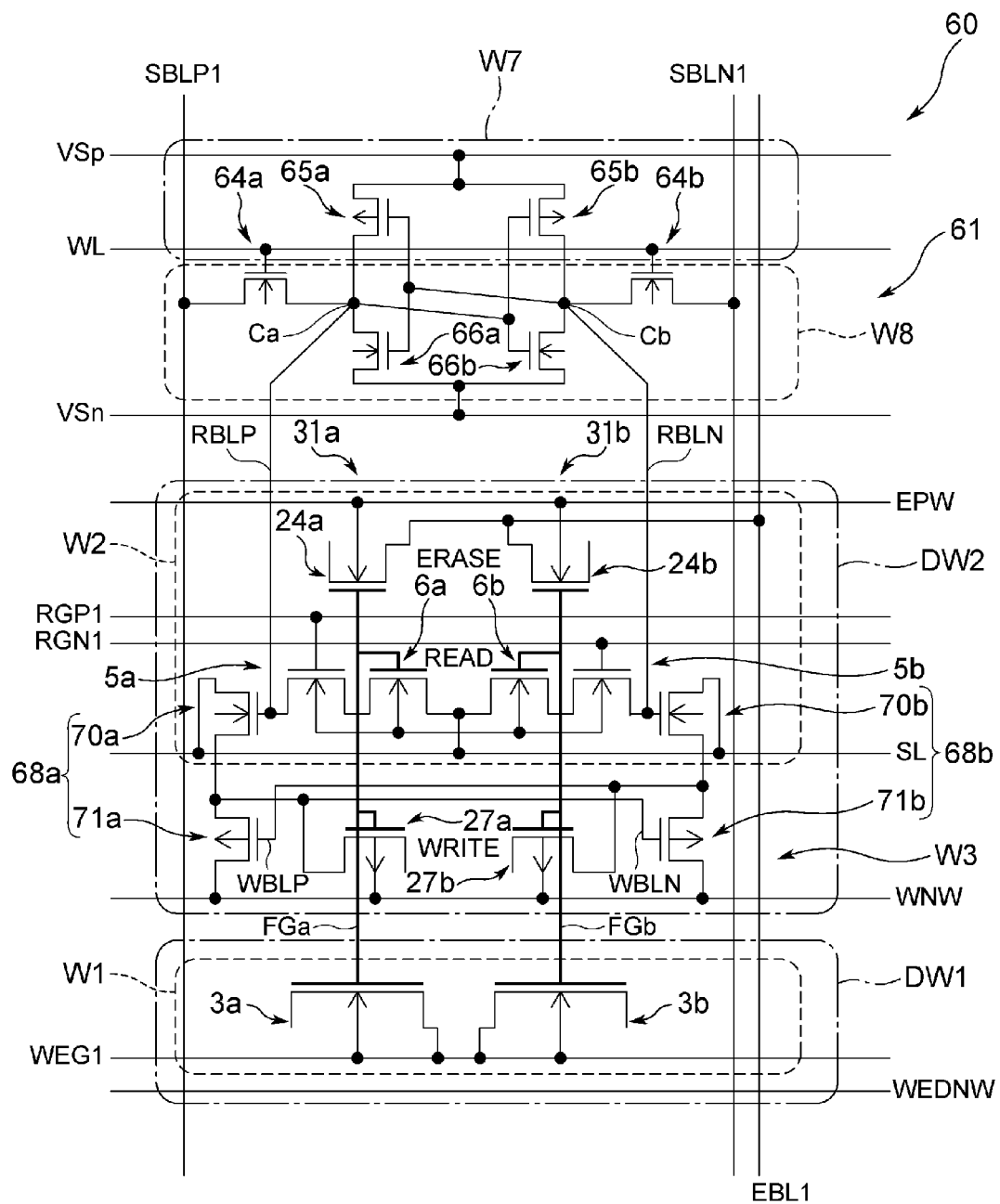
FIG. 15 is a schematic view illustrating a circuit configuration of a memory unit including an SRAM.

A memory unit obtained by combining a memory cell and an SRAM (Static Random Access Memory) will be described below. FIG. 15, in which portions corresponding to those illustrated in FIG. 5 are assigned the same reference numerals, illustrates a configuration of a memory unit 60 in which an SRAM 61 is provided for a pair of memory cells 31a and 31b. A non-volatile semiconductor memory device has a configuration in which memory units 60 are arranged in a matrix of rows and columns. Here, one of the memory units 60 is described. As illustrated in FIG. 15, the SRAM 61 is connected to the one memory cell 31a and the other memory cell 31b in the memory unit 60.

The SRAM 61 comprises a total of six MOS transistors, namely, access transistors 64a and 64b that are N-type MOS transistors, load transistors 65a and 65b that are P-type MOS transistors, and drive transistors 66a and 66b that are N-type MOS transistors. In the present embodiment, in the SRAM 61, the load transistors 65a and 65b are formed in one N-type SRAM formation well W7 of a first conductivity type. The access transistors 64a and 64b and the drive transistors 66a and 66b are formed in one P-type SRAM formation well W8 of a second conductivity type.

One ends of the load transistors 65a and 65b are connected to one ends of the drive transistors 66a and 66b, respectively. The other ends of the load transistors 65a and 65b are connected to a power supply line VSp. Gates of the load transistors 65a and 65b are connected to the gates of the drive transistors 66a and 66b, respectively. The other ends of the drive transistors 66a and 66b are connected to a reference voltage line VSn.

The access transistor 64a has its one end connected to a complementary first bit line SBLP1. The other end of the access transistor 64a is connected to a storage node Ca, which is located between the load transistor 65a and the drive transistor 66a, and to the gates of the load transistor 65b and the drive transistor 66b. In a like manner, the access transistor 64b has its one end connected to a complementary second bit line SBLN1. The other end of the access transistor 64b is connected to a storage node Cb, which is located between the load transistor 65b and the drive transistor 66b, and to the gates of the load transistor 65a and the drive transistor 66a. Further, the access transistors 64a and 64b have their respective gates connected to a common word line WL. A latch circuit (not illustrated) is connected between the complementary first bit line SBLP1 and the complementary second bit line SBLN1.

In addition, in the SRAM 61, the memory cell 31a is connected to the storage node Ca via a first connection line RBLP while the memory cell 31b is connected to the storage node Cb via a second connection line RBLN. The memory cells 31a and 31b provided in the memory unit 60 have similar configurations to those of the memory cells 22a and 22b illustrated in FIG. 5 described in the above described second embodiment. Here, a voltage conversion circuit 68a is provided between the memory cell 31a and the SRAM 61 while a voltage conversion circuit 68b is provided between the memory cell 31b and the SRAM 61.

In the present embodiment, the voltage conversion circuit 68a includes a first transistor 70a that is an N-type MOS transistor and a second transistor 71a that is a P-type MOS transistor. One end of the first transistor 70a is connected to one end of second transistor 70b. Thus the first transistor 70a is directly connected to the second transistor 71a. The first transistor 70a has its gate connected to the storage node Ca and to one end of the switch transistor 5a. The other end of the first transistor 70a is connected to the source line SL.

The second transistor 71a has its gate connected between the first transistor 70b and a second transistor 71b, which are provided in the voltage conversion circuit 68b, and to one end of the writing transistor 27b in the memory cell 31b, via a writing bit line WBLP. Further, the other end of the second transistor 71a is connected to a second deep well wiring WNW, via which a predetermined voltage is applied to a second deep well DW2 and a third well W3. Hence the voltage applied to the third well W3, in which the writing transistor 27a is formed, can be the same as that applied to the other end of the second transistor 71a.

Similar to the voltage conversion circuit 68a, the voltage conversion circuit 68b has a configuration in which the first transistor 70b that is an N-type MOS transistor is directly connected to the second transistor 71b that is a P-type MOS transistor. The first transistor 70b has its gate connected to the storage node Cb and to one end of the switch transistor 5b. The other end of the first transistor 70b is connected to the source line SL.

The second transistor 71b has its gate connected between the first transistor 70a and the second transistor 71a, which are provided in the voltage conversion circuit 68a, and to one end of the writing transistor 27a in the memory cell 31a, via a writing bit line WBLN. Further, the other end of the second transistor 71b is connected to the second deep well wiring WNW. Hence the voltage applied to the third well W3 can be the same as that applied to the other end of the second transistor 71b.

The first transistors 70a and 70b of the voltage conversion circuits 68a and 68b are formed in the P-type second well W2, in which the erasing transistors 24a and 24b are formed. The second transistors 71a and 71b of the voltage conversion circuits 68a and 68b are formed in the N-type third well W3, in which the writing transistors 27a and 27b are formed. Thus, the voltage conversion circuits 68a and 68b are formed by utilizing the second well W2 and the third well W3, in which the memory cells 31*a* and 31*b* are formed and hence an efficient layout pattern is achieved.

In the memory unit 60 having the above-described configuration, external data can be written into the SRAM 61 and data can be read out from the SRAM 61. SRAM data, which is retained in the SRAM 61, can be programmed into the memory cells 31*a* and 31*b*. Memory data, which is retained in the memory cells 31*a* and 31*b*, can be written into the SRAM 61. In this case, similar to the second embodiment, when the SRAM data is written or erased by the capacity transistors 3*a* and 3*b* in the memory cells 31*a* and 31*b* in the memory unit 60, a voltage difference between the first well W1 and the first deep well DW1 is made smaller than a voltage difference (e.g. 18 [V]) at which a tunneling effect occurs, regardless of the voltage to be applied to the second deep well DW2. Accordingly, a junction voltage between the first well W1 and the first deep well DW1 is low.

FIG. 16A is a table showing voltage states in each of sites in the memory unit 60 illustrated in FIG. 15. The voltage states include the following: the voltage state during an operation for reading out the SRAM data from the SRAM 61 (written as "Read" in "Access to SRAM" in FIG. 16A); the voltage state during an external data writing operation for writing external data into the SRAM (written as "Write" in "Access to SRAM" in FIG. 16A); the voltage state during a memory data writing operation for writing the memory data, which is stored in the memory cells 31*a* and 31*b*, into the SRAM 61; the voltage state during an SRAM data programming operation for programming the SRAM data, which is stored in the SRAM 61, into the memory cells 31*a* and 31*b*; and the voltage state during a data erasing operation in the memory cells 31*a* and 31*b*. Each operation will be simply described below with reference to FIG. 16A.

(5-1) External Data Writing Operation for Writing External Data into SRAM

In order to write external data into the SRAM 61, 0 [V] is applied to the switch gate lines RGP1 and RGN1, so that the switch transistors 5*a* and 5*b* are turned off. Thereby the SRAM 61 is electrically disconnected from the reading transistors 6*a* and 6*b*. In the SRAM 61, a predetermined voltage VDD is applied to the word line WL, to turn on both the access transistors 64*a* and 64*b* connected to the word line WL. In this case, the predetermined voltage VDD is applied also to the power supply line VSp. In the SRAM 61, when VDD is applied as a writing voltage to the complementary first bit line SBLP1, 0 [V] is applied as a writing inhibition voltage to the complementary second bit line SBLN1.

The load transistor 65*a* and the drive transistor 66*a* have their respective gates electrically connected to the complementary second bit line SBLN1 via the access transistor 64*b*, so that the gates are at the same low-voltage level as that on the complementary second bit line SBLN1. Hence the load transistor 65*a* is turned on, and the drive transistor 66*a* is turned off. Thus, the storage node Ca between the load transistor 65*a* and the drive transistor 66*a* is electrically connected to the power supply line VSp via the load transistor 65*a* that has been turned on, so that the voltage at the storage node Ca is at a high level.

In this case, the load transistor 65*b* and the other drive transistor 66*b* have their respective gates electrically connected to the complementary first bit line SBLP1 via the access transistor 64*a*, so that the gates are at the same high voltage level as that on the complementary first bit line SBLP1. Hence, the load transistor 65*b* is turned off, and the drive transistor 66*b* is turned on. Thus, the storage node Cb between the load transistor 65*b* and the drive transistor 66*b* is electrically connected to the reference voltage line VSn via the drive transistor 66*a* that has been turned on, so that the voltage at the storage node Cb is at a low level. Consequently, external data is written into the SRAM 61, and can be retained as SRAM data.

(5-2) Data Reading Operation for Reading Data from SRAM

In order to read data from the SRAM 61, 0 [V] is applied to the switch gate lines RGP1 and RGN1 so that the switch transistors 5*a* and 5*b* are turned off, to electrically disconnect the reading transistors 6*a* and 6*b* and the SRAM 61 from each other. In the SRAM 61, a voltage VDD is applied to the word line WL, to turn on both the access transistors 64*a* and 64*b* connected to the word line WL. Thereby, in the memory unit 60, a potential at the one storage node Ca is read out via the complementary first bit line SBLP1 while a potential at the other storage node Cb is read out via the complementary second bit line SBLN1. Thus, the data which has been recorded on the storage nodes Ca and Cb is determined by a latch circuit.

(5-3) SRAM Data Programming Operation for Programming SRAM Data into Memory Cell In the memory unit 60 according to the present invention, SRAM data, which has been retained in the above-described SRAM 61, can be programmed collectively on a mat-by-mat basis into the memory cells 31*a* and 31*b* based on the principle of "(2-2) Data Writing Operation". In the following example, given that the one storage node Ca is in a high voltage state and the other storage node Cb is in a low voltage state in the SRAM 61.

In this case, in the memory unit 60, 0 [V] is applied to the word line WL, to turn off both the access transistors 64*a* and 64*b* connected to the word line WL. Thus, in the memory unit 60, the complementary first bit line SBLP1 and the one storage node Ca are electrically disconnected from each other while the complementary second bit line SBLN1 and the other storage node Cb are electrically disconnected from each other.

In this case, in the memory cells 31*a* and 31*b*, 0 [V] is applied to the switch gate lines RGP1 and RGN1 so that the switch transistors 5*a* and 5*b* are turned off, to electrically disconnect the reading transistors 6*a* and 6*b* and the SRAM 61 from each other. In the memory unit 60 according to the present invention, the voltage conversion circuits 68*a* and 68*b* can convert the high voltage state and the low voltage state of the storage nodes Ca and Cb in the SRAM 61 into a writing inhibition voltage and a writing voltage to be applied to the memory cells 31*a* and 31*b*, respectively.

In this case, in the memory cells 31*a* and 31*b*, 0 [V] is applied to the erasing bit line EBL1, so that voltage differences between the erasing transistors 24*a* and 24*b*, which are connected to the erasing bit line EBL1, and the floating gates FGa and FGb, respectively, do not cause tunneling effect. In this case, for example, 0 [V] is applied to the second well wiring EPW.

A writing voltage of −9 [V] is applied to a first well wiring WEG1. Thus, in the capacity transistors 3*a* and 3*b* connected to the first well wiring WEG1, voltages at the floating gates FGa and FGb drop to −9 [V] due to capacitive coupling between the gate insulating films and the floating gates FGa and FGb. In addition, 0 [V] is applied to the source line SL connected to the ends of the first transistors 70*a* and 70*b* in the voltage conversion circuits 68a and 68b. A writing voltage of 9 [V] is applied to the second deep well wiring WNW connected to the ends of the second transistors 71 and 71b in the voltage conversion circuits 68a and 68b.

In this case, the first transistor 70a has its gate connected to the one storage node Ca into which data has been written (i.e. in a high level voltage state), and is turned on when 0 [V] is applied to the other end of the first transistor 70a from the source line SL. Thus, the first transistor 70a applies a voltage of 0 [V], which is on the source line SL, to one end of the writing transistor 27a and the gate of the second transistor 71b in the voltage conversion circuit 68b. Thus, in the memory cell 31a, a voltage difference from the floating gate FGa is small at the writing transistor 27a. As a result, a tunneling effect does not occur, so that no charge is injected into the floating gate FGa.

On the other hand, the first transistor 70b has its gate connected to the other storage node Cb into which no data has been written (i.e. in a low level voltage state), and is turned off when 0 [V] is applied from the source line SL at the other end. In this case, in the second transistor 71b, a voltage of 0 [V], which is on the source line SL, is applied to the gate from the first transistor 70a in the voltage conversion circuit 68a. Therefore, the second transistor 71b is turned on when 9 [V] is applied to the other end from the second deep well wiring WNW. Thus, the second transistor 71b can apply a voltage of 9 [V], which is on the second deep well wiring WNW, to one end of the writing transistor 27b and the gate of the second transistor 71a in the voltage conversion circuit 68a.

Thus, in the memory cell 31b, a voltage difference (18 [V]) from the floating gate FGb is large at the writing transistor 27b. As a result, a tunneling effect occurs, so that charge is injected into the floating gate FGb. In this case, the second transistor 71a is turned off because a voltage of 9 [V] on the second deep well wiring WNW is applied to the gate via the second transistor 71b.

In addition, in this case, in the memory unit 60, the writing bit voltage (writing voltage) of 9 [V] applied to the second deep well wiring WNW is also transmitted from the second deep well DW2 to the third well W3 having the same polarity as the second deep well DW2, so that the voltage of 9 [V] is applied to the third well W3. Thus, in a region of the writing transistor 27b formed in the third well W3, a voltage difference of 18 [V], at which a tunneling effect occurs, is generated between the floating gate FGb and the channel region while a voltage difference between the third well W3 and the second deep well DW2 is 0 [V].

In this case, a voltage (0 [V]), at which a voltage difference from the writing voltage of −9 [V] to be applied to the first well wiring WEG1 is small, is applied to the first deep well DW1 via the first deep well wiring WEDNW, without being restricted by a voltage (9 [V] in this case) to be applied to the second deep well DW2. Thus, in a region of the capacity transistor 3b formed in the first well W1 in the memory unit 60, a voltage at the floating gate FGb drops due to capacitive coupling between the insulating film and the floating gate FGb while a voltage difference between the first well W1 and the first deep well DW1 is 9 [V], which is smaller than a voltage difference (18 [V] in this case) at which a tunneling effect occurs, and accordingly a junction voltage is low, as in the foregoing.

Thus, in the memory unit 60, the SRAM data (in a voltage state at a high level or a low level) retained in the one storage node Ca and the other storage node Cb in the SRAM 61 is programmed into the memory cells 31a and 31b while each of the voltage difference between the first deep well DW1 and the first well W1 and the voltage difference between the second deep well DW2 and the third well W3 is made smaller than the voltage difference at which a tunneling effect occurs. Thus, the SRAM data is retained as the memory data in the memory cells 31a and 31b.

(5-4) Memory Data Writing Operation for Writing Memory Data in Memory Cell into SRAM In the present invention, memory data in the memory cells 31a and 31b is written into the SRAM 61 by mat collective processing based on a principle described in "(2-4) Data Reading Operation". Here, the one memory cell 31a is in a state where charge has been stored in the floating gate FGa so that no data has been written, and the other memory cell 31b is in a state where charge in the floating gate FGb has been removed so that data has been written.

In this case, in the SRAM 61, 0 [V] is applied to the word line WL, so that both the access transistors 64a and 64b connected to the word line WL are turned off. Thereby the access transistor 64a and the complementary first bit line SBLP1 are electrically disconnected from each other and the access transistor 64b and the complementary second bit line SBLN1 are electrically disconnected from each other. In the memory unit 60, a voltage on a power supply line VSp is set to a voltage of Hi-Z or 0 [V], to cut off power supply to the SRAM 61. Then, in the memory unit 60, a power supply voltage VDD is applied to the switch gate lines RGP1 and RGN1 while 0 [V] is applied to the source line SL.

Thus, in the memory unit 60, charge in the floating gate FGb is removed, so that the memory cell 31b for writing (a threshold voltage Vth<0 [V]) is turned on. Therefore, the storage node Cb in the SRAM 61 is connected to the source line SL via the switch transistor 5b and the reading transistor 6b. Thus, the storage node Cb in the SRAM 61 is at a low level (0 [V]) due to the source line SL, to which 0 [V] is applied.

In this case, the non-writing memory cell 31a (a threshold voltage Vth>0 [V]), in which charge has been stored in the floating gate FGa, is turned off. Therefore, the storage node Ca in the SRAM 61 and the source line SL are electrically disconnected from each other. Then, in the memory unit 60, a voltage on the power supply line VSp is set to the power supply voltage VDD, and a voltage at the storage node Ca is set to a high level and a voltage at the other storage node Cb is set to a low level by latching the SRAM 61.

Thus, the initial high-level voltage (the power supply voltage VDD [V]) the same as that of the SRAM data before being programmed into the memory cell 31a is applied to the storage node Ca in the SRAM 61. On the other hand, the initial low-level voltage (0 [V]) the same as that of the SRAM data before being programmed into the memory cell 31b is applied to the storage node Cb in the SRAM 61. Thereby, the SRAM data is restored.

Thus, in the memory unit 60, the memory data retained in the memory cells 31a and 31b are written into the SRAM 61. Thereby, the high-level and low-level voltages the same as those of the SRAM data, which has been retained in the SRAM 61 before being programmed into the memory cells 31a and 31b, are applied to the storage node Ca and the storage node Cb, respectively. In the memory unit 60, data is loaded into the SRAM 61 within the memory unit 60. Thus, data transfer via a bus line, for example, is unnecessary, so that control is simplified.

(5-5) Data Erasing Operation for Erasing Data in Memory Cell

In the present invention, data in the memory cells 31a and 31b can be erased based on a principle described in "(2-3)

Data Erasing Operation". In this case, in the memory unit 60, a voltage of −9 [V] is applied to the erasing bit line EBL1, and 9 [V] is applied to the first well wiring WEG1. Thereby a strong electric field is applied only to the gate insulating films of the erasing transistors 24*a* and 24*b* connected to the erasing bit line EBL1, so that charge is injected into the floating gates FGa and FGb from channel regions of the erasing transistors 24*a* and 24*b*. Thus, data in the memory cells 31*a* and 31*b* is erased collectively on a mat-by-mat basis.

In this case in the present invention, a voltage different from a voltage applied to the first deep well DW1 is applied to the second deep well DW2, in a manner similar to the above described second embodiment. Thus, a voltage of 0 [V], which is different from a voltage of 9 [V] applied to the first deep well DW1, is applied to the second deep well DW2, which surrounds the second well W2, via the second deep well wiring WNW. Thus, a voltage difference between the second deep well DW2 and the second well W2 is set to 9 [V], which is smaller than the voltage difference at which a tunneling effect occurs (18 [V] in the case where the voltage of 9 [V], which is the same voltage applied to the first deep well DW1, is applied to the second deep well DW2).

Figure 17:
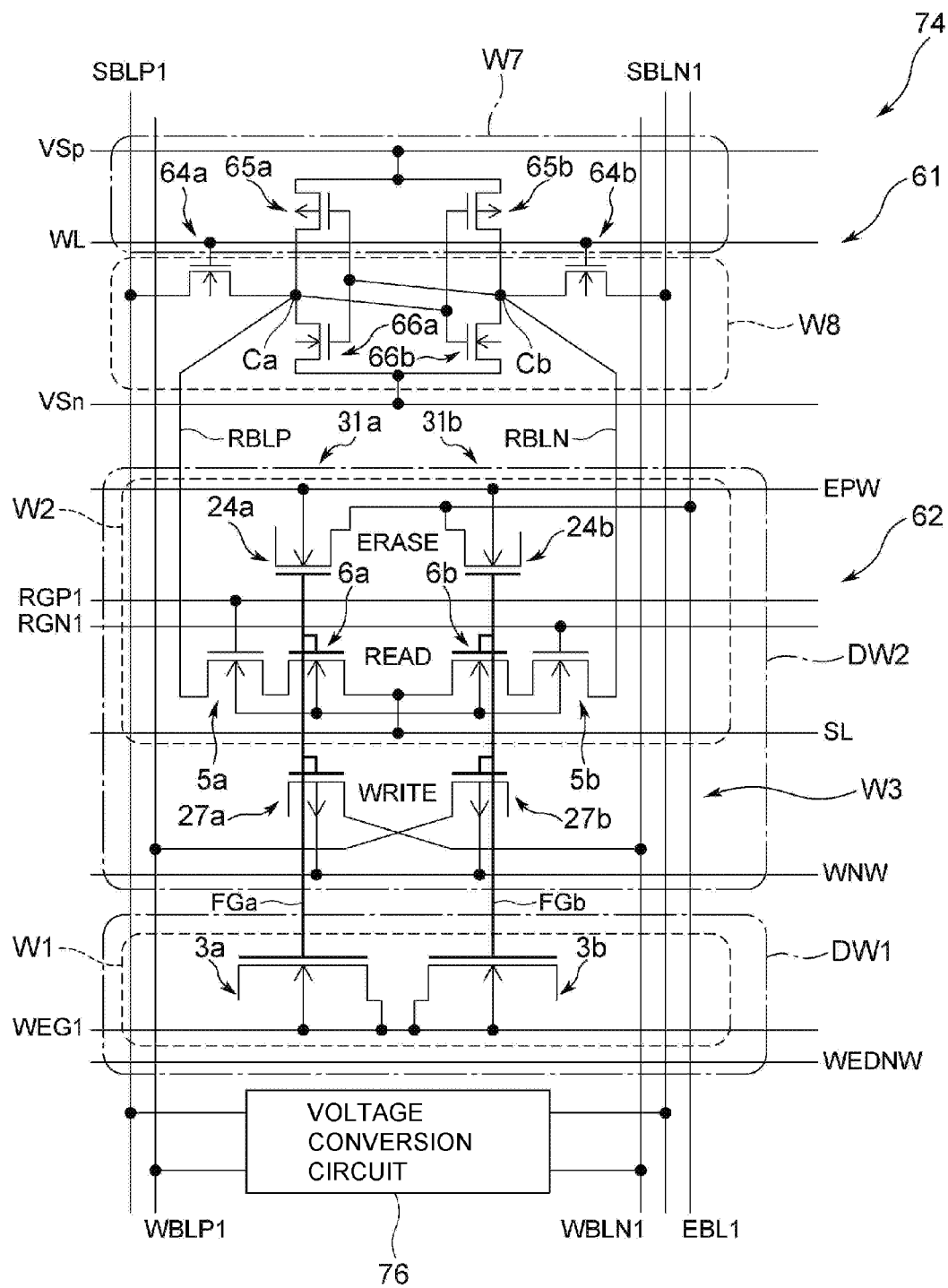
FIG. 17 is a schematic view illustrating a circuit configuration of a memory unit according to still another embodiment including a voltage conversion circuit.

(5-6) Non-Volatile Semiconductor Memory Device According to Another Embodiment in which Voltage Conversion Circuit is Provided In the memory unit 60 illustrated in in FIG. 15, an example was described in which the voltage conversion circuits 68*a* and 68*b* are provided in each memory unit 60. The present invention is not limited to this. As illustrated in FIG. 17, in which portions corresponding to those illustrated in FIG. 15 are assigned the same reference numerals, a memory unit 74 may be used in which a voltage conversion circuit 76 is provided for each pair of a complementary first bit line SBLP1 and a complementary second bit line SBLN1.

In this case, the memory unit 74 has a configuration in which the complementary first bit line SBLP1 is connected to one end of one access transistor 64*a* in an SRAM 61 and the complementary second bit line SBLN1 is connected to one end of the other access transistor 64*b* in the SRAM 61. In the memory unit 74, the other end of one switch transistor 5*a* provided in one memory cell 31*a* is connected to one storage node Ca in the SRAM 61, and the other end of the other switch transistor 5*b* provided in the other memory cell 31*b* is connected to the other storage node Cb in the SRAM 61.

One end of a writing transistor 27*a* is connected to the writing bit line WBLN1 in the memory cell 31*a*, and one end of a writing transistor 27*b* is connected to the writing bit line WBLP1 in the memory cell 31*b*. In the present embodiment, the writing bit line WBLP1 is disposed along the complementary first bit line SBLP1, and is connected to the writing transistor 27*b* in a column next to that of the writing transistor 27*a*. The writing bit line WBLN1 is disposed along the complementary second bit line SBLN1, and is connected to the writing transistor 27*a* in a column next to that of the writing transistor 27*b*.

In addition, the complementary first bit line SBLP1 and the complementary second bit line SBLN1 are provided with the one voltage conversion circuit 76, and the writing bit line WBLP1 and the writing bit line are connected to each other via the voltage conversion circuit 76. The voltage conversion circuit 76 comprises first transistors 70*a* and 70*b* and second transistors 71*a* and 71*b*, similar to the voltage conversion circuits 68*a* and 68*b* illustrated in FIG. 15 described above, and converts amplitude voltages VDD and 0 [V] at the storage nodes Ca and Cb into amplitude voltages 9 [V] and 0 [V], respectively, for example, in a manner similar to the voltage conversion circuits 68*a* and 68*b*.

In the memory unit 74 illustrated in FIG. 17, in a case where data is programmed into the memory cell 31*a*, for example, a value of a voltage to be applied to the first deep well DW1 is selected separately, without being restricted by a value of a voltage to be applied to a second deep well DW2, which is selected based on a value of a voltage on the writing transistor 27*a*. Therefore, a voltage difference between a first deep well DW1 and a first well W1 is made small. Thus, the non-volatile semiconductor memory device comprising the memory unit 74 can be embedded with a circuit element having a miniaturized circuit structure and having a low junction breakdown voltage because the voltage difference between the first deep well DW1 and the first well W1 is made small and accordingly a junction voltage between the first deep well DW1 and the first well W is low.

FIG. 16B is a table showing voltage states at each of sites in the memory unit 74 provided with the voltage conversion circuit 76 illustrated in FIG. 17: the voltage state during an operation for reading out SRAM data in the SRAM 61 (written as "access to SRAM Read in FIG. 16B); the voltage state during an external data writing operation, in which external data is written into the SRAM 61 (written as "access to SRAM Write in FIG. 16B); the voltage state during a memory data writing operation, in which memory data in the memory cells 31*a* and 31*b* is written into the SRAM 61; the voltage state during an SRAM data programming operation in which the SRAM data in the SRAM 61 is written into the memory cells 31*a* and 31*b*; and the voltage state during a data erasing operation in the memory cells 31*a* and 31*b*.

(5-6-1) SRAM Data Programming Operation for Programming SRAM Data into Memory Cell The operations illustrated in FIG. 16B differ from the operations illustrated in FIG. 16A only in a column "Program SRAM data into Memory Cell". The difference will be simply described below, and description of other columns is omitted to avoid redundancy. In this case, in the memory unit 74 according to the present invention, the SRAM data retained in the SRAM 61 is first read out to the voltage conversion circuit 76 based on the principle described above in "(5-2) Data Reading Operation for Reading Data from SRAM". For example, it is assumed that in the SRAM 61, the one storage node Ca is in a high voltage state, and the other storage node Cb is in a low voltage state.

More specifically, in order to read out the data from the SRAM 61, 0 [V] is applied to switch gate lines RGP1 and RGN1, so that the switch transistors 5*a* and 5*b* are turned off, to electrically disconnect the reading transistors 6*a* and 6*b* and the SRAM 61 from each other. In the SRAM 61, a power supply voltage VDD is applied to a word line WL, to turn on both the access transistors 64*a* and 64*b* connected to the word line WL. Thereby, in the memory unit 60, a potential at the storage node Ca is detected in the voltage conversion circuit 76 via the complementary first bit line SBLP1 while a potential at the storage node Cb is detected in the voltage conversion circuit 76 via the complementary second bit line SBLN1. Thus, the data recorded on the storage nodes Ca and Cb are determined.

Then, when the storage node Ca in the SRAM 61 is in a high voltage state, the voltage conversion circuit 76 applies a writing bit voltage of 9 [V] to the writing bit line WBLP1 connected to one end of the writing transistor 27*b*. Thereby the writing transistor in the memory cell 31*b* removes charge from the floating gate, so that data is written. In this case, the storage node Cb in the SRAM 61 is in a low voltage state. The voltage conversion circuit 76 applies a writing inhibition bit voltage of 0 [V] to the writing bit line WBLN1 connected to one end of the writing transistor 27*a*. Thereby charge is maintained in the floating gate FGa, so that no data is written by the writing transistor 27*a* in the memory cell 31*a*.

In the memory unit 74, a writing voltage of −9 [V] is applied to a first well wiring WEG1. In capacity transistors 3*a* and 3*b* connected to the first well wiring WEG1, the voltages at the respective floating gates FGa and FGb are raised due to capacitive coupling between their insulating films and the floating gates FGa and FGb. In this case, 9 [V] is applied to a third well, in which the writing transistors 27*a* and 27*b* are formed, via a second deep well wiring WNW.

Thus, in the writing transistor 27*b* having its one end to which a writing bit voltage of 9 [V] is applied via the writing bit line WBLP1 from the voltage conversion circuit 76, a tunneling effect occurs due to a voltage difference (18 [V]) from the floating gate FGb. Thereby the charge in the floating gate FGb is released to the channel region, so that data is written.

On the other hand, in the writing transistor 27*a* having its one end to which a writing inhibition bit voltage of 0 [V] is applied via the writing bit line WBLN1 from the voltage conversion circuit 76, a voltage difference (9 [V]) from the floating gate FGb is small, so that a tunneling effect does not occur. The charge in the floating gate FGb remains therein, so that no data is written. Thus, in the memory unit 74 illustrated in FIG. 17, the same voltage as that in the memory unit 60 illustrated in FIG. 15 is applied to the memory cells 31*a* and 31*b*, to allow the memory cells 31*a* and 31*b* to retain the same memory data as that in the memory unit 60. The memory data retained in the memory cells 31*a* and 31*b* can be written into the SRAM 61, in a manner similar to "(5-4) Memory Data Writing Operation for Writing Memory Data in Memory Cell into SRAM" described above, and hence description thereof is not repeated.

The SRAM 61 illustrated in FIGS. 15 and 17 includes a total of six MOS transistors, i.e. the access transistors 64*a* and 64*b*, the load transistors 65*a* and 65*b*, and the drive transistors 66*a* and 66*b*. Voltages applied to the respective transistors may be the power supply voltage VDD or less during various types of operations such as the data writing operation. Therefore, in the transistors constituting the SRAM 61, each gate insulating film can be formed to have thickness of 4 [nm] or less.

In the descriptions of the methods for writing data according to the embodiments, as illustrated in FIGS. 16A and 16B, the examples are described in which an output of the voltage conversion circuit is 9 [V] when the potential at the storage node is the power supply voltage VDD, and the output of the voltage conversion circuit is 0 [V] when the potential at the storage node is 0 [V]. The present invention is not limited to these examples. For example, the output of the voltage conversion circuit may be 0 [V] when the potential at the storage node is the power supply voltage VDD, and the output of the voltage conversion circuit may be 9 [V] when the potential at the storage node is 0 [V]. In this case, an effect similar to that of the present invention is achieved by connecting an output of the one voltage conversion circuit to the one writing transistor and by connecting an output of the other voltage conversion circuit to the other writing transistor.

(6) Another Embodiment

While a case where a memory cell in which a first conductivity type is a P type and a second conductivity type is an N type has been described in the above-described first to third embodiments, the present invention is not limited to this. A memory cell may be employed in which polarities of the first conductivity type and the second conductivity type are reversed so that the first conductivity type is the N type and the second conductivity type is the P type.

While the method in which the reading transistors 6*a*, 6*b*, 47*a*, and 47*b* are formed in the region of the first conductivity type has been described in the above described first to third embodiments, the present invention is not limited to this. A method in which the reading transistors are formed in the region in the second conductivity type may be used. In the case, the reading transistor is formed in the third well of the second conductivity type, so that the reading transistor is formed in the same semiconductor region as that where the writing transistor or the erasing transistor is formed. Thereby, the memory cells can be made small, like the above described embodiments.

While a case where the memory cell in which the first conductivity type is the N type and the second conductivity type is the P type is employed has been described in the above-described fourth embodiment, the present invention is not limited to this. A memory cell in which the polarities of the first conductivity type and the second conductivity type are reversed so that the first conductivity type is the P type and the second conductivity type is the N type may be employed.

In each of the above described embodiments, it is obvious that the first bit line, the second bit line, and the writing bit line function as the charge injection bit lines when a voltage for injecting the charge into the floating gate is applied, and the first bit line, the second bit line, and the writing bit line function as the charge ejection bit lines when a voltage for removing the charge from the floating gate is applied. Similarly, it is obvious that the erasing bit line functions as the charge injection bit line when a voltage for injecting the charge into the floating gate is applied, and the erasing bit line functions as the charge ejection bit line when a voltage for ejecting the charge from the floating gate is applied.

In the above described first embodiment, a case where the writing transistor is employed as the charge injection transistor and the erasing transistor is employed as the charge ejection transistor has been described. In the above described second embodiment, a case where the erasing transistor is employed as the charge injection transistor and the writing transistor is employed as the charge ejection transistor has been described. More specifically, in the present invention, in the memory cell, one of the charge injection transistor and the charge ejection transistor is made to function as the writing transistor, and the other of the charge ejection transistor and the charge injection transistor is made to function as the erasing transistor.

In each of the above described embodiments, the configuration in which the first well W1, the second well W2, the third well W3, the first deep well DW1, and the second deep well DW2 are shared among the plurality of memory cells arranged in the row direction has been described as an example of a configuration in which a first well, a second well, a third well, a first deep well, and a second deep well are shared among a plurality of memory cells arranged in one direction, but the present invention is not limited to this. The first well, the second well, the third well, the first deep well, and the second deep well may be shared among the plurality of memory cells arranged in the column direction.

In this case, the other direction different from the one direction indicates the row direction. To match this, an arrangement relationship among the various types of wirings, i.e. the first bit line BLP1, the second bit line BLN2, the first deep well wiring WEDNW, the first well wiring WEG1, the second deep well wiring ENW, the source line SL, the read gate lines RGP1 and RGN1, the second well wiring WPW, and the erasing bit line EBL1 in a matrix may also be changed as needed.

REFERENCE SIGNS LIST 1a, 1b, 1c, 1d Memory unit
2a, 2b Memory cell
3a, 3b Capacity transistor
4a, 4b Writing transistor
5a, 5b Switch transistor
6a, 6b Reading transistor
7a, 7b Erasing transistor
10 Non-volatile semiconductor memory device
FGa, FGb Floating gate

The invention claimed is:

1. A non-volatile semiconductor memory device comprising:
 a memory cell, the memory cell comprising:
  a capacity transistor configured to adjust a voltage at a floating gate;
  a charge injection transistor configured to inject charge into the floating gate in response to a voltage difference from the voltage at the floating gate adjusted by the capacity transistor;
  a charge ejection transistor configured to remove the charge from the floating gate in response to a voltage difference from the voltage at the floating gate adjusted by the capacity transistor;
  a reading transistor configured to turn on or off depending on the presence or absence of the charge in the floating gate, the floating gate being shared by the capacity transistor, the charge injection transistor, the charge ejection transistor, and the reading transistor;
  a first well of a first conductivity type in which the capacity transistor is formed;
  a second well of the first conductivity type in which one of the charge injection transistor and the charge ejection transistor is formed;
  a third well of a second conductivity type in which the other of the charge injection transistor and the charge ejection transistor is formed;
  a first deep well of the second conductivity type, the first deep well constituting a part of a triple well structure in a region in which the first well is disposed; and
  a second deep well of the second conductivity type, the second deep well contacting the third well, the second deep well constituting a part of a triple well structure in a region in which the second well is disposed, the first deep well and the second deep well being electrically isolated from each other, a voltage different from a voltage to be applied to the first deep well being applicable to the second deep well.

2. A non-volatile semiconductor memory device comprising:
 a memory cell, the memory cell comprising:
  a capacity transistor configured to adjust a voltage at a floating gate;
  a charge injection transistor configured to inject charge into the floating gate in response to a voltage difference from the voltage at the floating gate adjusted by the capacity transistor;
  a charge ejection transistor configured to remove the charge from the floating gate in response to a voltage difference from the voltage at the floating gate adjusted by the capacity transistor;
  a reading transistor configured to turn on or off depending on the presence or absence of the charge in the floating gate, the floating gate being shared by the capacity transistor, the charge injection transistor, the charge ejection transistor, and the reading transistor;
  a first well of a first conductivity type in which the capacity transistor is formed;
  a second well of the first conductivity type in which one of the charge injection transistor and the charge ejection transistor is formed;
  a third well of a second conductivity type in which the other of the charge injection transistor and the charge ejection transistor is formed;
  a first separation well of the second conductivity type disposed adjacent to the first well; and
  a second separation well of the first conductivity type, the second separation well electrically isolating the first separation well from the third well, each of a voltage difference between the first well and the first separation well and a voltage difference between the second separation well and the third well being smaller than a voltage difference required for injecting the charge into or removing the charge from the floating gate by a tunneling effect.

3. The non-volatile semiconductor memory device according to claim 1, further comprising:
 a first separation well of the second conductivity type disposed adjacent to the first well; and
 a second separation well of the first conductivity type that electrically isolates the first separation well from the third well.

4. The non-volatile semiconductor memory device according to claim 1, wherein
 the charge injection transistor is formed in the third well, and the charge ejection transistor is formed in the second well.

5. The non-volatile semiconductor memory device according to claim 1, wherein
 the reading transistor is formed in the second well.

6. The non-volatile semiconductor memory device according to claim 1, wherein
 one end of the reading transistor is connected to a source line and the other end of the reading transistor is connected to one end of a switch transistor.

7. The non-volatile semiconductor memory device according to claim 6, wherein
 one of the charge injection transistor and the charge ejection transistor functions as a writing transistor, and a writing bit line is connected to an end of the writing transistor, and
 a reading bit line which is provided separately from the writing bit line is connected to the reading transistor via the switch transistor.

8. The non-volatile semiconductor memory device according to claim 1, wherein
 the plurality of memory cells are arranged in a matrix of rows and columns, and the first well, the second well, the third well, the first deep well, and the second deep well are shared among the memory cells arranged in one direction.

9. The non-volatile semiconductor memory device according to claim 1, wherein
a pair of the memory cells constitutes a memory unit, and
one of the pair of the memory cells has a configuration in which a first bit line is connected to the reading transistor via a switch transistor and a second bit line is directly connected to a writing transistor, and
the other memory cell paired with the one memory cell has a configuration in which the second bit line is connected to the reading transistor via the switch transistor and the first bit line is directly connected to the writing transistor.

10. The non-volatile semiconductor memory device according to claim 9, further comprising
an SRAM having one storage node and the other storage node, and
wherein the one storage node is connected to the switch transistor in the one memory cell, and the other storage node is connected to the switch transistor in the other memory cell.

11. The non-volatile semiconductor memory device according to claim 1, further comprising:
an SRAM having one storage node and the other storage node, the one storage node being connected to a complementary first bit line via one access transistor, the other storage node being connected to a complementary second bit line via the other access transistor; and
a voltage conversion circuit connected to the complementary first bit line and the complementary second bit line,
wherein a pair of the memory cells constitutes a memory unit, and
one of the pair of the memory cells has a configuration in which the reading transistor is connected to the one storage node via a switch transistor, and
the other memory cell paired with the one memory cell has a configuration in which the reading transistor is connected to the other storage node via the switch transistor, and
the voltage conversion circuit applies a voltage corresponding to a voltage at the one storage node to a writing transistor in the one memory cell or to the writing transistor in the other memory cell and applies a voltage corresponding to a voltage at the other storage node to the writing transistor in the one memory cell or to the writing transistor in the other memory cell, to program SRAM data into the memory unit, the SRAM data being represented by voltage states of the one storage node and the other storage node, the voltage on the one storage node being applied via the complementary first bit line, the voltage on the other storage node being applied via the complementary second bit line.

12. The non-volatile semiconductor memory device according to claim 1, further comprising:
an SRAM having one storage node and the other storage node, the one storage node being connected to a complementary first bit line via one access transistor, the other storage node being connected to a complementary second bit line via the other access transistor;
one voltage conversion circuit connected to the one storage node; and
the other voltage conversion circuit connected to the other storage node, and wherein a pair of the memory cells constitutes a memory unit, and
one of the pair of the memory cells has a configuration in which the reading transistor is connected to the one storage node via a switch transistor, and
the other memory cell paired with the one memory cell has a configuration in which the reading transistor is connected to the other storage node via the switch transistor, and
the one voltage conversion circuit applies a voltage corresponding to a voltage at the one storage node to a writing transistor in the one memory cell or to the writing transistor in the other memory cell, and the other voltage conversion circuit applies a voltage corresponding to a voltage at the other storage node to the writing transistor in the one memory cell or to the writing transistor in the other memory cell, to program SRAM data into the memory unit, the SRAM data being represented by voltage states of the one storage node and the other storage node.

13. The non-volatile semiconductor memory device according to claim 11, wherein
a gate insulating film of a transistor included in the SRAM has a thickness of 4 [nm] or less.

14. The non-volatile semiconductor memory device according to claim 9, wherein
in the memory unit,
the one memory cell and the other memory cell constitute one bit, and
switch gate lines are separately connected to the switch transistors provided for the memory cells, respectively, and each of the switch transistors is independently turned on or off.

15. The non-volatile semiconductor memory device according to claim 1, wherein
the plurality of memory cells are arranged in a matrix of rows and columns,
the plurality of memory cells arranged in a first direction are configured to share the first well, the second well, the third well, the first deep well, and the second deep well,
in each of the memory cells, one of the charge injection transistor and the charge ejection transistor functions as a writing transistor, and the other of the charge ejection transistor and the charge injection transistor functions as an erasing transistor, and
the plurality of memory cells includes:
a writing bit line that applies a common voltage to the writing transistors in the respective memory cells arranged in a second direction different from the first direction; and
an erasing bit line provided separately from the writing bit line, the erasing bit line applying a common voltage to the erasing transistors in the respective memory cells arranged in the second direction.

16. The non-volatile semiconductor memory device according to claim 15, wherein
the erasing bit line is shared between at least the memory cells arranged in one row or one column in the second direction and the memory cells arranged in another row or another column in the second direction, and
a common voltage is applied via the erasing bit line to the memory cells which share the erasing bit line.

* * * * *